United States Patent
Itakura et al.

[19]
[11] Patent Number: 5,986,507
[45] Date of Patent: *Nov. 16, 1999

[54] CURRENT MIRROR CIRCUIT

[75] Inventors: Tetsuro Itakura, Nerima-Ku; Zdzislaw Czarnul, Yokohama, both of Japan

[73] Assignee: Kabushiki Kaisha Toshiba, Kawasaki, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/716,714

[22] Filed: Sep. 12, 1996

[30] Foreign Application Priority Data

Sep. 12, 1995 [JP] Japan ................................. 7-258336

[51] Int. Cl.⁶ ........................................................ H03F 3/04
[52] U.S. Cl. ................................................................ 330/288
[58] Field of Search .................................... 330/288, 292, 330/296; 323/315, 316

[56] References Cited

U.S. PATENT DOCUMENTS 5,087,891  2/1992  Cytera ...................................... 330/288
5,378,998  1/1995  Davies ..................................... 330/288

FOREIGN PATENT DOCUMENTS 6-16571   3/1994  Japan .
6-252664  9/1994  Japan .

OTHER PUBLICATIONS

"The Active–Input Regulated–Cascode Current Mirror", Teresa Serrano and Bernabe Linares–Barranco, IEEE Transactions on Circuits and Systems–I: Fundamental Theory and Applications, vol. 41, No. 6 Jun. 1994, pp. 464–467.

"Dynamic Range of Low–Voltage Cascode Current Mirrors", Erik Bruun and Peter Shah, 1995 IEEE, pp. 1328–1331.

*Primary Examiner*—Steven Mottola
*Attorney, Agent, or Firm*—Foley & Lardner

[57] ABSTRACT

A current mirror circuit comprises a first current-to-voltage converter for inputting an input current, a second current-to-voltage converter, a first transistor, the collector or drain of which outputs an output current, and the emitter or source of which is connected to the second current-to-voltage converter, and a control unit for controlling a control electrode of the first transistor. The control unit refers a voltage current-to-voltage converted by the first and second current-to-voltage converters to control the first transistor so that currents flow from the control unit to the first and second current-to-voltage converters at a predetermined ratio.

53 Claims, 57 Drawing Sheets

CURRENT MIRROR CIRCUIT

BACKGROUND OF THE INVENTION

The present invention relates to a current mirror circuit which is able to has a wide range of output voltage.

In a current mirror circuit, the magnitude of output impedance is one of extremely important matters that need to be taken into consideration.

In a conventional simple current mirror circuit as shown in FIG. 81, the output impedance can not be increased so as to be greater than the output impedance of a transistor. In order to improve this, a cascode constitution has been used as shown in FIG. 82. However, there is a problem in that this constitution is not suitably operated when the output voltage is not greater than approximately VT+VDS(sat).

In order to solve this problem, there is a method for selecting a bias of T4 for connection to a cascode as shown in FIG. 83. However, in this constitution, two systems of the same currents are required, and the suitable values of T4 for the channel width/channel length of T3 which forms a gate bias of T4 disperses in the manufacturing process, so that it is difficult to design this constitution. In addition, FIG. 84 illustrates another conventional circuit wherein Vbis is selected to be approximately VDS(sat) to increase an output impedance so as to be suitably operated at an output voltage greater than approximately 2VDS(sat).

However, there is a problem in that it is not possible to accurately replicate a current since the drain-to-source voltage of T1 is different from that of T2. In addition, in order to equalize the drain-to-source voltages of T1 and T2 to enhance the accuracy of the replicated current, there is proposed a method for using two sets of operational amplifier circuits as shown in FIG. 85. However, in this method, there is a new problem in that the scale of circuit is increased.

Thus, in conventional current mirror circuits, there are problems in that in the case of the simple circuit, it is not possible to increase the accuracy of the replicated current, and in the case of the circuit for enhancing the accuracy of the output impedance and the replicated current, the scale thereof is increased.

SUMMARY OF THE INVENTION

It is therefore an object of the present invention to eliminate the aforementioned problems and to provide a current mirror circuit which can enhance the accuracy of a replicated current with an enhanced output impedance without greatly increasing the scale of the circuit and which has a wide range of output voltage.

In order to accomplish the aforementioned and other objects, according to a first aspect of the present invention, a current mirror circuit comprises: first current-to-voltage converting means; second current-to-voltage converting means; a first transistor, the collector or drain of which outputs an output current, and then emitter or source of which is connected to the second current-to-voltage converting means; control means for controlling the control electrode of the first transistor. At least the first current-to-voltage converting means inputs an input current. The control means refers to voltages current-to-voltage converted by the first and second current-to-voltage converting means to control the first transistor so that currents flow from the control means to the first and second current-to-voltage converting means at a predetermined ratio.

With this construction, the control means refers to voltages current-to-voltage converted by the first and second current-to-voltage converting means to control the first transistor so that currents flow from the control means to the first and second current-to-voltage converting means at a predetermined ratio. In this case, the sum of the input current and the current from the control means flows through the first current-to-voltage converting means, and the sum of a desired output current and the current from the control means flows through the second current-to-voltage converting means.

If the output current flowing through the second current-to-voltage converting means is shifted from a desired current value, this shifted current value is converted into a voltage by the second current-to-voltage converting means, so that the ratio of currents flowing from the control means to the first and second current-to-voltage converting means is shifted from the predetermined ratio. Therefore, the control means controls a voltage applied to the control electrode of the first transistor so that the ratio of the currents is the predetermined ratio, so as to cause the output current flowing through the second current-to-voltage converting means to approach a desired value.

In addition, if the input current flowing through the first current-to-voltage converting means varies, this variation is changed to the variation of voltage by the first current-to-voltage converting means. Therefore, the control means controls the first transistor so that the ratio of currents flowing through the first and second current-to-voltage converting means is the predetermined ratio, and varies the output current so as to correspond to the input current. Thus, this circuit operates as a current mirror circuit.

In this case, if the output current intends to vary due to the variation of the output voltage, the control means has controlled so as to decrease the variation of the output current, so that it is possible to enhance the output impedance. In addition, the output voltage required to operate this current mirror circuit is the sum of the voltage applied to the second current-to-voltage converting means and VDS(sat) required to operate the first transistor, and it is possible to ensure a wide range of output voltage by setting the voltage applied to the current-to-voltage converting means to approximately VDS(sat).

Moreover, since the control means compares the voltages current-to-voltage converted by the current-to-voltage converting means on the sides of input and output when the current is replicated, no external bias voltage is required.

In addition, for the absolute characteristics of the current-to-voltage converting means vary due to the dispersion in the process for manufacturing integrated circuits, it is possible to decrease the relative characteristic dispersion in the first and second current-to-voltage converting means by the pattern layout or the like, so that it is possible to realize a current mirror circuit which is difficult to be under the influence of the dispersion in the manufacturing process.

According to a second aspect of the present invention, a current mirror circuit comprises: a first transistor for allowing a flow of input current; a second transistor, the gate of which is connected to the gate of the first transistor as a common gate; a third transistor, the source of which is connected to the drain of the first transistor, and the drain of which is connected to the common gate of the first and second transistor; a fourth transistor, the source of which is connected to the drain of the second transistor, the gate of which is connected to the gate of the third transistor as a common gate, and the drain of which outputs an output current; and a first resistor connected between the common gate of the third and fourth transistor, and the drain of the third transistor.

With this construction, for example, if a NMOS transistor is used, the drain voltage of the third transistor is determined by the gate voltage of the first and second transistor, and this is approximately the threshold voltage VT. The gate voltage of the third and fourth transistor is the sum of the gate voltage of the first and second transistors and the voltage applied to the first resistor. Therefore, the source voltage of the third transistor, i.e. the drain voltage of the first transistor, is the gate voltage of the third transistor minus the gate-to-source voltage of the third transistor. Since the gate-to-source voltage of the third transistor is also approximately the threshold voltage VT, the drain voltage of the first transistor is substantially equal to the voltage applied to the first resistor. Similarly, the source voltage of the fourth transistor, i.e. the drain voltage of the second transistor, is the gate voltage of the fourth transistor minus the gate-to-source voltage of the fourth transistor. Since the gate-to-source voltage of the fourth transistor is also approximately the threshold voltage VT, the drain voltage of the second transistor is substantially equal to the voltage applied to the first resistor. Therefore, if the voltage applied to the first resistor is designed to be the drain-to-source saturation voltage VDS(sat) of the first and second transistor, the drain voltage of the fourth transistor serving as an output terminal, which can operate both the second and fourth transistors connected to a cascode of the output section of the current mirror circuit in the saturated region, i.e. which can increase the output impedance, can be decreased to the sum of the VDS(sat) and the saturation voltages of the respective transistors, by a small scale of circuit without any amplifier circuits. In addition, the accuracy of the replicated current is not lowered.

According to a third aspect of the present invention, a current mirror circuit comprises: a first transistor for allowing a flow of input current; a second transistor, the gate or base of which is connected to the gate or base of the first transistor as a common gate or base; a third transistor, the source or emitter of which is connected to the drain or collector of the first transistor; a fourth transistor, the source or emitter of which is connected to the drain or collector of the second transistor, the gate or base of which is connected to the gate or base of the third transistor as a common gate or base, and the drain or collector of which outputs an output current; a buffer amplifier for amplifying the drain or collector voltage of the third transistor; and a first level-shift circuit for level-shifting an output of the buffer amplifier, wherein the common gate or base of the third and fourth transistor is connected to the output of the buffer amplifier, and the output of the first level-shift circuit is connected to the common gate or base of the first and second transistor, the input section of the buffer amplifier comprising a fifth transistor which has a different conductivity type from that of the first transistor, and the input of the buffer amplifier being connected to the gate or base of the fifth transistor.

With this construction, for example, if NMOS transistors are used as the first through fourth transistors, the gate voltage of the third transistor is a high voltage which is level-shifted from the gate voltage of the first transistor by a predetermined voltage by means of the first level-shift circuit. In addition, when the drain voltage of the third transistor is applied to the gate of the third transistor via the buffer amplifier, the gate voltage of the first transistor is determined so that the current flowing through the first transistor is determined by the input current.

For example, when the sizes of the third and fourth transistors are equal to each other and the sizes of the first and second transistors are equal to each other, the gate and drain voltages of the second transistor are equal to the gate and drain voltages of the first transistor, respectively, so that the second transistor operates as a current mirror so as to allow a flow of current which is substantially equal to the current flowing through the first transistor.

In this case, when the sizes of the third and fourth transistors (channel width/channel length) are greater than the sizes of the first and second transistors (channel width/channel length), the drain voltage of the first and second transistors is higher than the level-shift voltage of the level-shift circuit. In this case, if the level-shift voltage of the level-shift circuit is set to approximately the drain-to-source saturation voltage VDS(sat) of the first and second transistors, the drain voltage of the first and second transistors is substantially equal to VDS(sat), so that it can operates in the saturated region. Therefore, if the drain voltage of the fourth transistor, which allows the flow of output current, becomes about twice as large as VDS(sat), the drain-to-source voltage of the fourth transistor is substantially equal to VDS(sat), so that it operates in the saturated region. Therefore, even if the output voltage is low, it is possible to maintain the enhanced output impedance.

In this current mirror circuit, the voltage of the output terminal, which can operate both the transistors connected to a cascode of the output section of the current mirror circuit in the saturated region, i.e. which can enhance the output impedance, can be decreased to the sum of the VDS(sat) and the saturation voltages of the respective transistors, by a small scale of circuit. In addition, it is possible to decrease the input voltage of the current mirror circuit to approximately VDS(sat), and the accuracy of the replicated current is not ed.

DESCRIPTION OF THE PREFERRED EMBODIMENT

Figure 1:
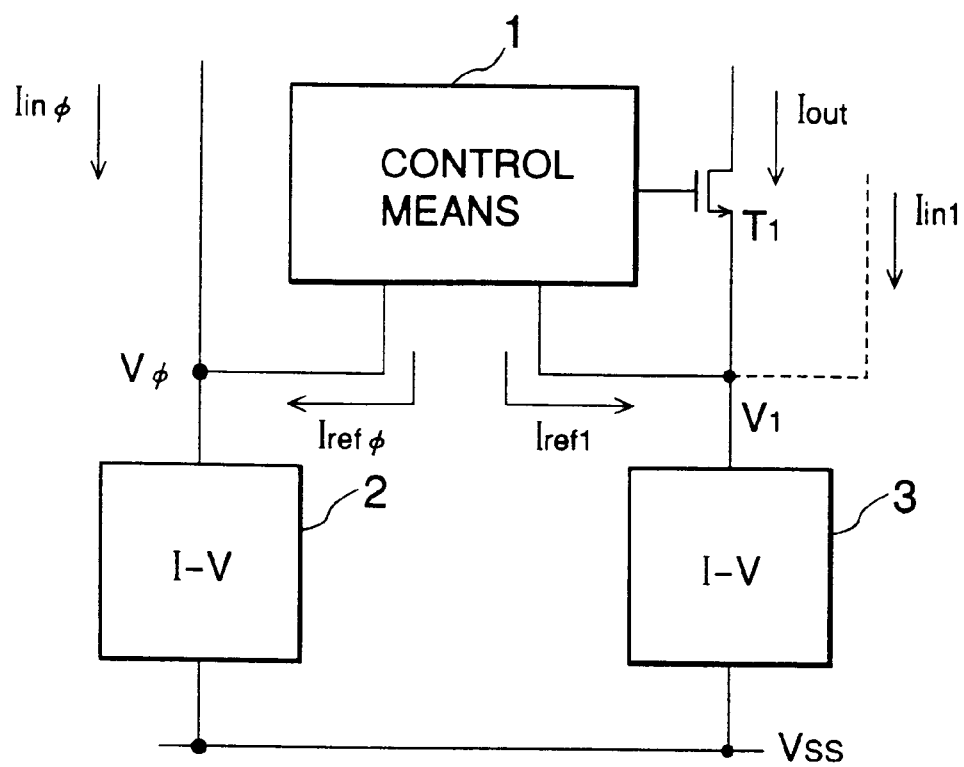
FIG. 1 is a block diagram of the first preferred embodiment of the present invention.

Referring now to the drawings, the preferred embodiments of the present invention will be described below.

FIG. 1 is a block diagram of the first preferred embodiment of a current mirror circuit according to the present invention. In the current mirror circuit shown in FIG. 1, one terminal of each of current-to-voltage converting means 2 and 3 is connected to Vss. The current-to-voltage converting means 2 inputs an input voltage Iin$\phi$. A drain of a transistor T1 outputs an output current, and a source of the transistor T1 is connected to another terminal of the current-to-voltage converting means 3. Control means 1 refers to voltages V$\phi$ and V1 current-to-voltage converted by the current-to-voltage converting means 2 and 3 to control a gate of the transistor T1 so that currents flow from the control means 1 to the current-to-voltage converting means 2 and 3 at a predetermined ratio.

The control means 1 refers to the voltages V$\phi$ and V1 current-to-voltage converted by the current-to-voltage converting means 2 and 3 to control a gate voltage of the transistor T1 so that currents Iref$\phi$ and Iref1 flow from the control means to the current-to-voltage converting means 2 and 3 at a predetermined ratio, respectively. At this time, the sum of the input current Iin$\phi$ and the current Iref$\phi$ from the control means 1 flows through the current-to-voltage converting means 2, and the sum of a desired output current Iout and the current Iref1 from the control means 1 flows through the current-to-voltage converting means 3. If the output current Iout flowing through the current-to-voltage converting means 3 is shifted from a desired current value, this shifted current value is converted into a voltage by the current-to-voltage converting means 3, so that the ratio of the currents flowing through the current-to-voltage converting means from the control means 1 is shifted from a desired ratio. Therefore, the control means controls the gate voltage of the transistor T1 so that the ratio of the current is the desired ratio, to cause the output current Iout flowing through the current-to-voltage converting means 3 to approach the desired value.

That is, if the output current Iout is greater than a desired value, the control means 1 is designed to decrease the gate voltage of the transistor T1 to decrease the output current flowing through the transistor T1, and if the output current Iout is less than the desired value, the control means 1 is designed to increase the gate voltage of the transistor T1 to increase the output current flowing through the transistor T1.

In addition, if the output current Iin$\phi$ flowing through the current-to-voltage converting means 2 varies, this current variation is converted into the variation of the voltage V$\phi$ by the current-to-voltage converting means 2. Therefore, the control means 1 controls the gate voltage of the transistor T1 so that the ratio of currents flowing through the current-to-voltage converting means 2 and 3 is a predetermined value, to vary the output current Iout in accordance with the input current Iin$\phi$. That is, when the input current Iin$\phi$ increases, the control means 1 is designed to increase the gate voltage of the transistor T1 to increase the output current flowing through the transistor T1, and when the input current Iin$\phi$ decreases, the control means 1 is designed to decrease the gate voltage of the transistor T1 to decrease the output current flowing through the transistor T1. Thus, this circuit operates as a current mirror circuit.

Furthermore, if the output current Iout intends to vary due to the variation of the output voltage, the control means 1 controls so as to decrease the variation of the output current Iout. That is, the output impedance is enhanced.

In addition, the output voltage required to operate this current mirror circuit is the sum of the voltage V1 applied to the current-to-voltage converting means 3 and a drain-to-source saturation voltage VDS(sat) required to operate the transistor T1, and it is possible to ensure a wide range of output voltage by setting the voltage applied to the current-to-voltage converting means 3 to approximately VDS(sat).

Moreover, since the control means 1 refers to the voltages Vφ and V1 current-to-voltage converted by the current-to-voltage converting means 2 and 3 on the input and output sides, no external bias voltage is required. In addition, if the absolute characteristics of the current-to-voltage converting means vary due to the dispersion in the process for manufacturing integrated circuits, it is possible to decrease the relative characteristic dispersion in the current-to-voltage converting means by the pattern layout or the like, so that it is possible to realize a current mirror circuit which is difficult to be under the influence of the dispersion in the manufacturing process. Alternatively, as expressed by a dotted line in FIG. 1, another input current Iin1 may be applied to the current-to-voltage converting means 3 to output a differential current.

Figure 2:
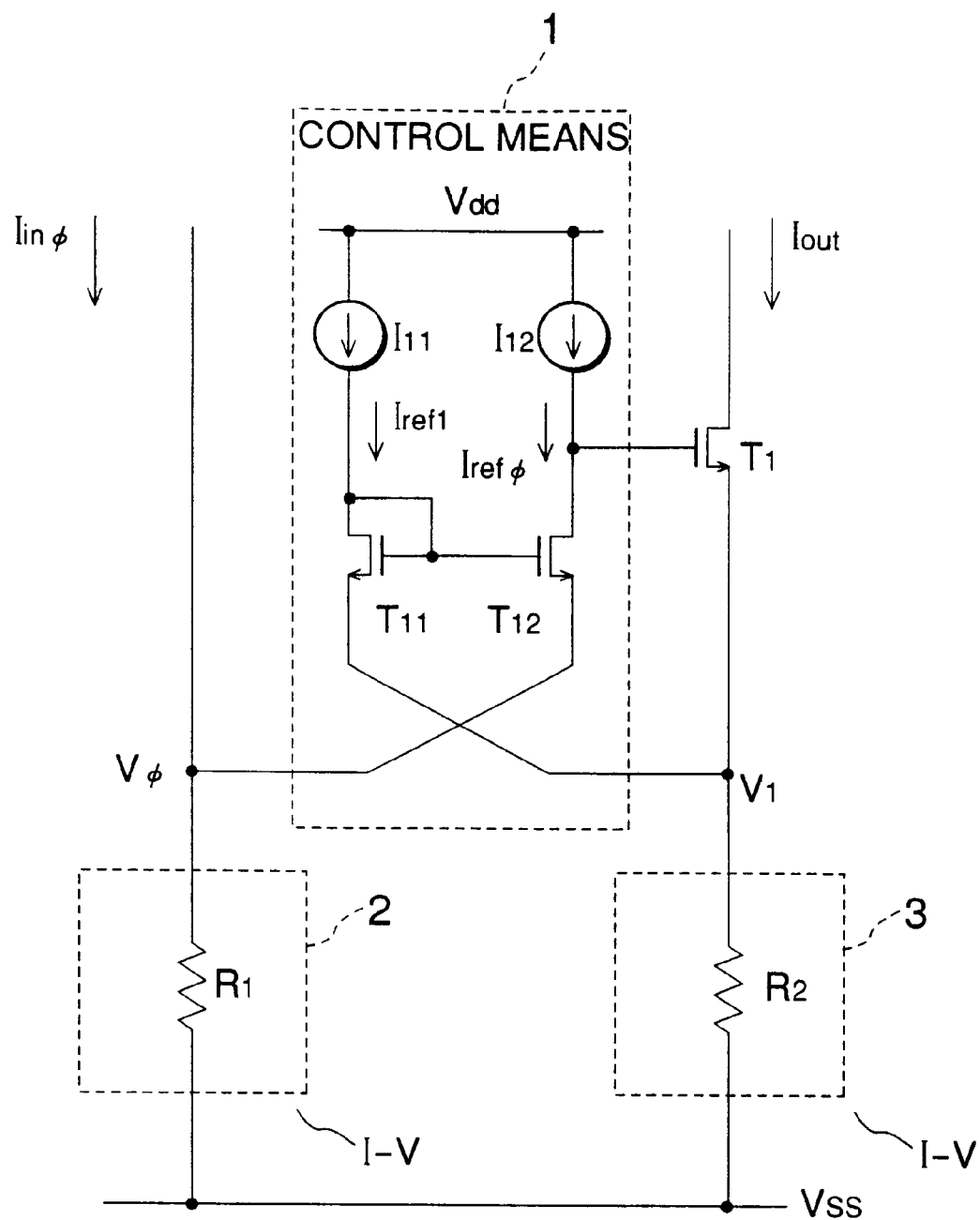
FIG. 2 is a block diagram illustrating an embodied circuit of the first preferred embodiment.

FIG. 2 illustrates an embodied circuit of the preferred embodiment of FIG. 1, wherein the current-to-voltage converting means 2 and 3 comprise resistors R1 and R2 and the control means 1 comprises transistors T11, T12 and current sources I11, I12.

The input current Iinφ and the current Irefφ from the current source I12 in the control means 1 flow through the resistor R1 via the transistor T12 to be converted into the voltage Vφ. In addition, the output current Iout and the current Iref1 from the current source I11 in the control means 1 flow through the resistor R2 via the transistor T11 to be converted into the voltage V1. In order to facilitate the explanation, it is assumed that Irefφ=Iref1, R1=R2, and the sizes (W/L) of the transistors T11 and T12 are equal to each other. If Iout>Iinφ, Vφ<V1.

Although the gate potential of the transistor R12 is provided by the gate potential of the transistor T11, the source potentials thereof are Vφ and V1, respectively, so that the gate-to-source voltage of the transistor T12 is greater than the gate-to-source voltage of the transistor T11. Therefore, although the transistor T12 intends to allow a greater flow of current than that of the transistor T11, since it is restricted by the current Irefφ supplied from the current source I12, the drain voltage of the transistor T12, i.e. the output voltage of the control means 1, is decreased to decrease the gate voltage of the transistor T1 to decrease the output current.

On the other hand, when Iout<.Iinφ, Vφ>V1. Although the gate potential of the transistor R12 is provided by the gate potential of the transistor T11, the source potentials thereof are Vφ and V1, respectively, so that the gate-to-source voltage of the transistor T12 is less than the gate-to-source voltage of the transistor T11. Therefore, although the transistor T12 intends to allow a smaller flow of current than that of the transistor T11, since the current Irefφ is supplied from the current source I12, the drain voltage of the transistor T12, i.e. the output voltage of the control means 1, is increased to increase the gate voltage of the transistor T1 to increase the output current.

Thus, if the output current Iout is different from the input current Iinφ, the control means 1 controls the gate voltage so that they are equal to each other. As mentioned above, if the output current Iout intends to vary due to the variation of the output voltage, the control means controls so as to decrease the variation of the output current Iout. That is, the output impedance is enhanced.

Figure 3:
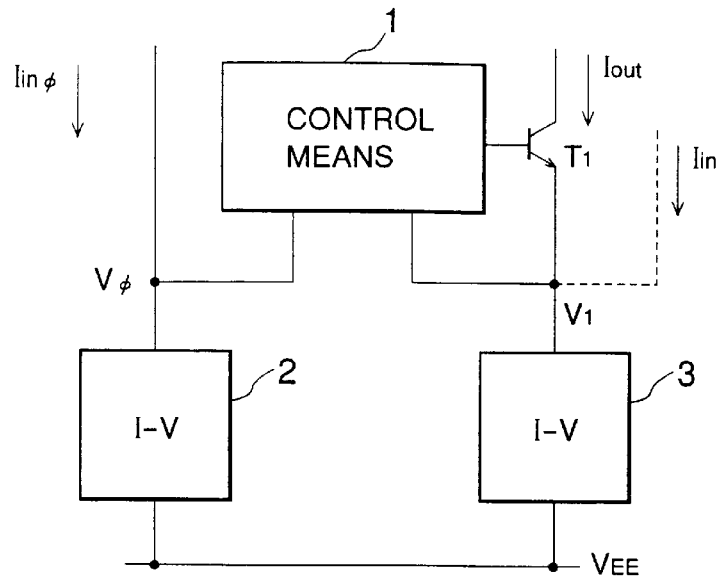
FIG. 3 is a block diagram illustrating an embodiment which uses a bipolar transistor in the first preferred embodiment.

FIG. 3 illustrates another preferred embodiment which substitutes a bipolar transistor for the field-effect transistor in FIG. 1. Similar to the preferred embodiment in FIG. 1, there are advantageous effects in that it is possible to ensure a wide range of output voltage and to enhance the output impedance.

Figure 4:
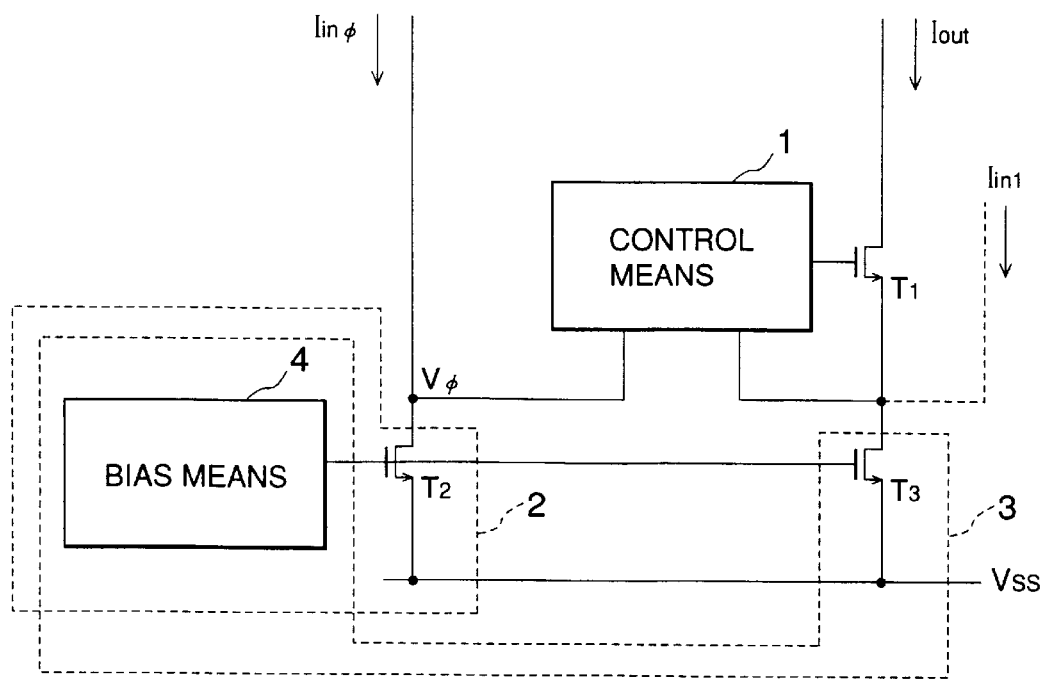
FIG. 4 is a block diagram illustrate an embodiment which uses a transistor as current-to-voltage converting means in the first preferred embodiment.

FIG. 4 illustrates another preferred embodiment wherein the current-to-voltage converting means 2 and 3 in FIG. 1 comprise transistors T2 and T3 and bias means 4. The gates of the transistors T2 and T3 are biased by the bias means 4, and the current-to-voltage conversion is performed using the output impedance of the transistors T2 and T3. Thus, in comparison with the current-to-voltage converting means comprising the resistors, it is possible to easily realize a large resistance and to decrease the voltage converted by the current-to-voltage means, so that there is an advantageous effect in that it is possible to ensure a wider range of output voltage.

Figure 5:
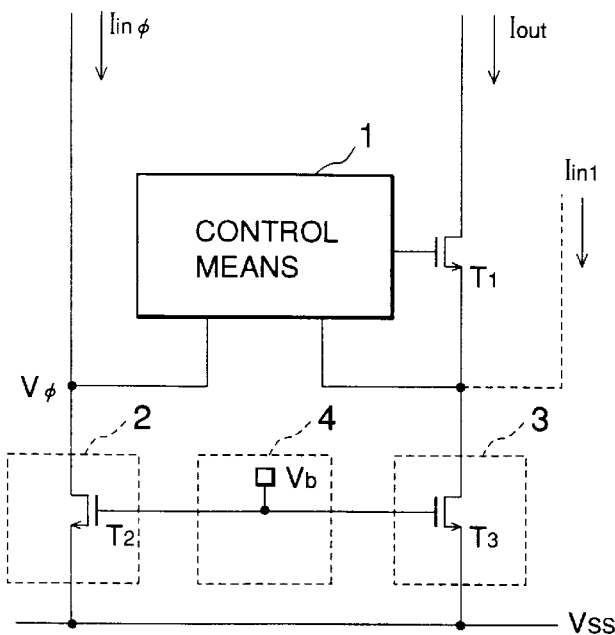
FIG. 5 is a block diagram illustrating embodied bias means in the circuit of FIG. 4.

FIG. 5 illustrates an example of the bias means 4 in the preferred embodiment as shown in FIG. 4, wherein fixed bias voltages are applied to the gates of the transistors T2 and T3. The dispersion in the drain-to-source saturation voltage due to the dispersions in the fixed bias voltage and the process causes the dispersion in the output impedance of the transistor, i.e. the dispersion in the current-to-voltage converting rate. However, since the drain voltages of the transistors T2 and T3 are controlled by the control means 1 so as to be equal to each other, the accuracy of the replicated current is never lowered.

Figure 6:
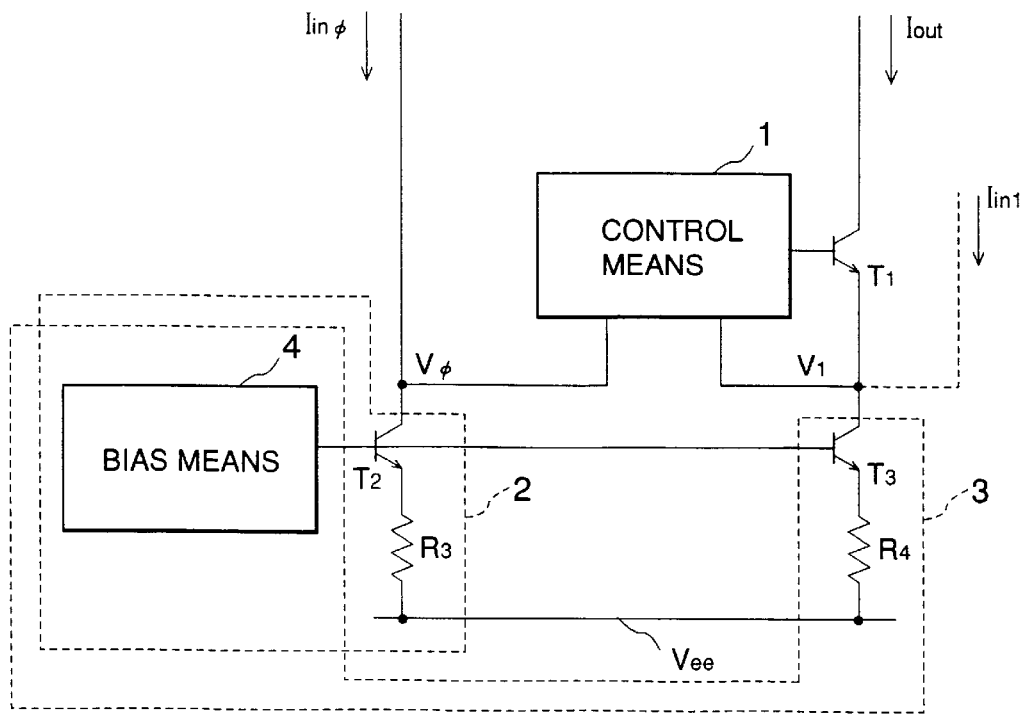
FIG. 6 is a block diagram illustrating bias means in the first preferred embodiment.

FIG. 6 illustrates another preferred embodiment wherein the current-to-voltage converting means 2 and 3 in FIG. 3 comprise transistors T2 and T3, resistors R3 and R4 connected to the transistors T2 and T3 in series, respectively, and bias means 4 for producing a bias voltage using, as a reference, the voltage Vφ current-to-voltage converted by the current-to-voltage converting means 2.

The current-to-voltage conversion is performed using the transistors T2 and T3, and the resistors connected to the emitters of the transistors T2 and T3 in series, respectively. As described in "Analysis and Design of Analog Integrated Circuits (1st ed.) by Gray and Meyer, pp204–206, this is an example wherein a large resistance is easily realized by inserting resistors. In addition, since the bias means 4 produces a bias voltage using, as a reference, the voltage Vφ current-to-voltage converted by the current-to-voltage converting means 2, to apply the bias voltage to the bases of the transistors T2 and T3, there is an advantageous effect in that it is possible to decrease the dependency of the voltage required between the collector and the emitter of the transistors T2 and T3 upon the input current in comparison with the preferred embodiment in FIG. 5 wherein a fixed bias voltage is applied.

Figure 7:
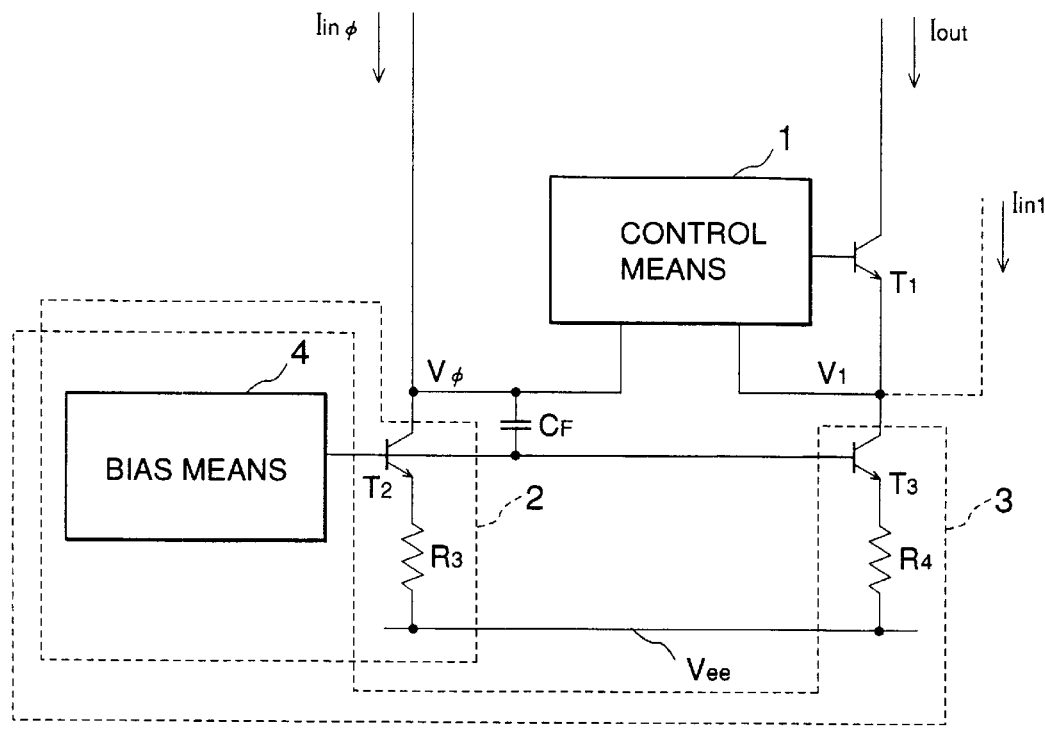
FIG. 7 is a block diagram illustrating an embodiment wherein a capacitor is connected to the bias means in FIG. 6 in parallel.

Furthermore, it is possible to improve the deterioration of the frequency characteristic of the current mirror circuit due to the limited range of operating frequency bands of the bias means 4, by providing a capacitor CF between the input and output of the bias means 4 as shown in FIG. 7 so as to transmit high-frequency components to the bases of the transistors T2 and T3 via the capacitor CF without passing through the bias means 4.

Figure 8:
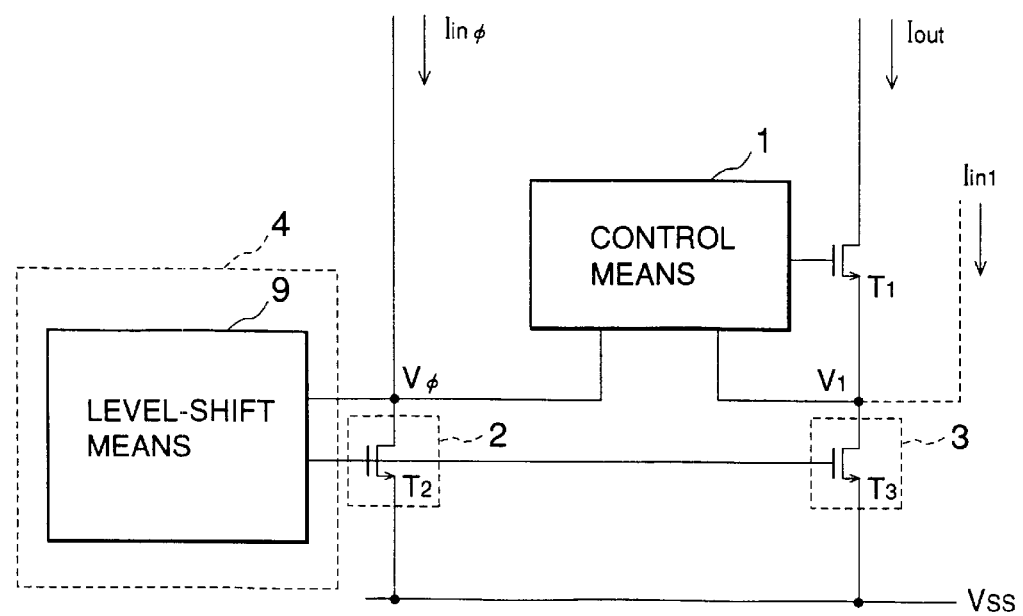
FIG. 8 is a block diagram illustrating an embodied construction of the bias means in FIG. 6.
Figure 9:
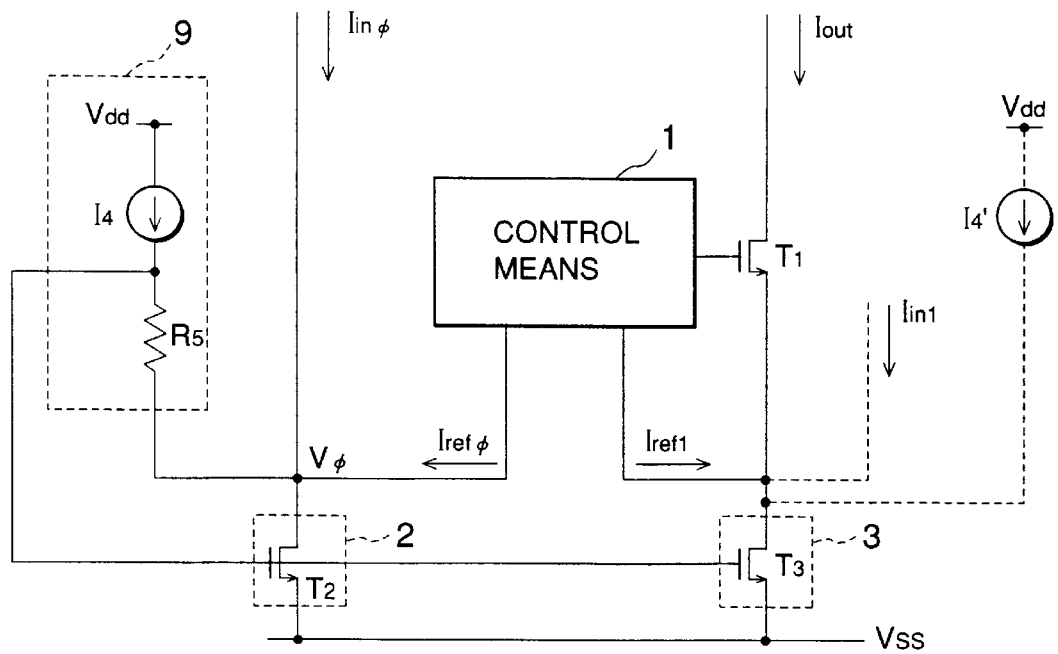
FIG. 9 is a block diagram illustrating an embodied construction of level-shift means in FIG. 8.
Figure 10:
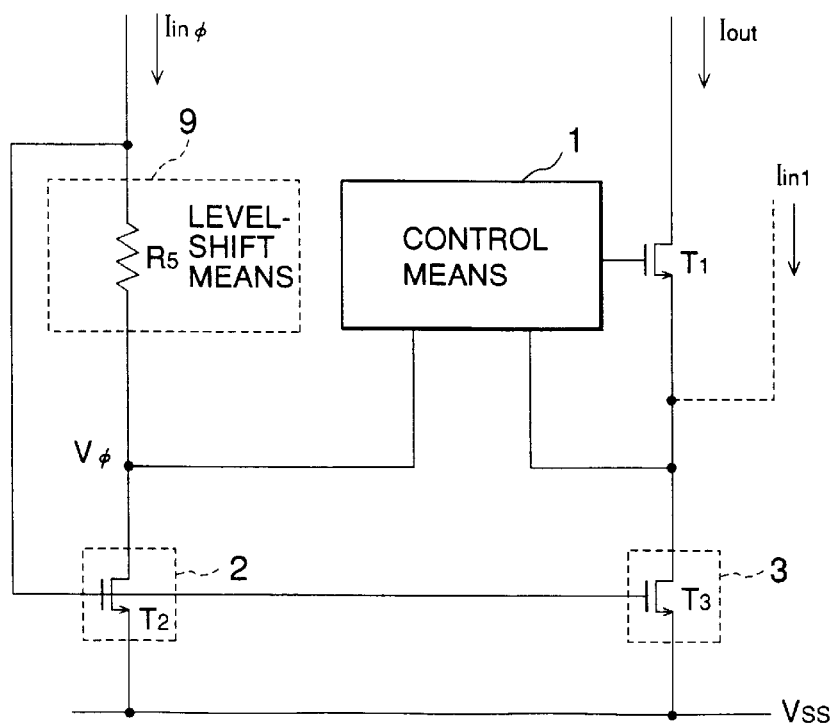
FIG. 10 is a block diagram illustrating a modification of FIG. 9.

This bias means 4 is able to be easily realized using level-shift means 9 as shown in FIG. 8. An embodied level-shift circuit may comprise a resistor R5 and a current source I4 as shown in FIG. 9. Since the current flowing from the current source I4, together with the input current Iinφ, is inputted to the current mirror circuit (the current-to-voltage converting means 2), it is amended by adding the current from the current source I4' to the drain of the transistor T3 forming the current-to-voltage converting means 3. Alternatively, it may be amended as Iref1=Irefφ+I4. In addition, the input current Iinφ may be substituted for the current source I4 as shown in FIG. 10.

Figure 11:
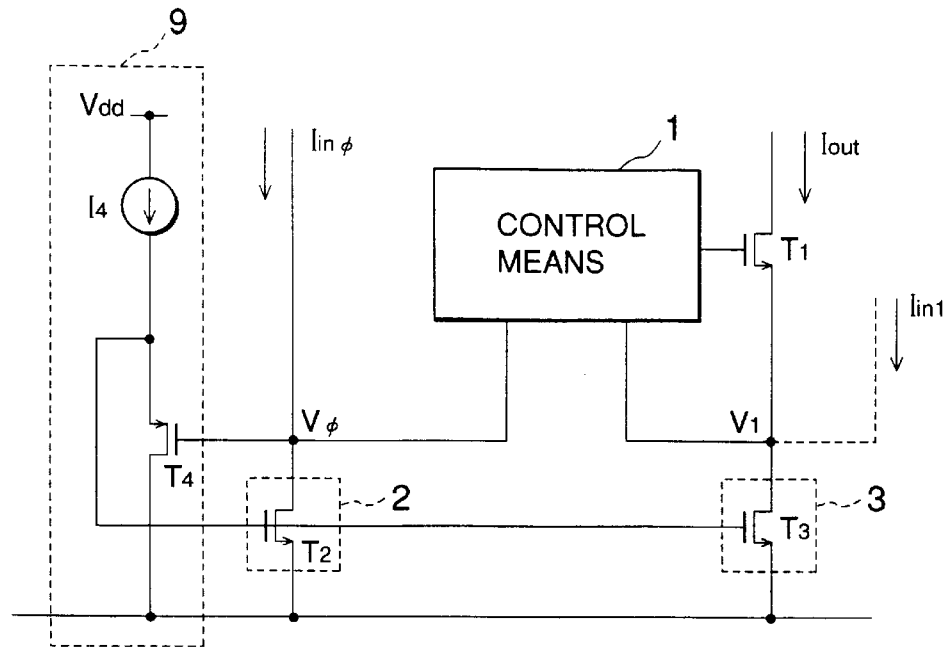
FIG. 11 is a block diagram illustrating an embodied construction level-shift means in FIG. 8.

As shown in FIG. 11, the level-shift means 9 may also be realized using a source follower based on a transistor T4 which has a different conductivity type from those of the transistors T2 and T3. With this construction, since the gate voltage of the transistor T2 is the sum of the drain voltage of the transistor T2 and the source-to-gate voltage of the transistor T4, it is possible to decrease the node voltage V$\phi$, to which the input current is inputted.

In addition, it is possible to decrease the absolute value of the threshold voltage VT of the transistor T4 to be less than the threshold voltage VT of the transistor T2 to operate the transistors T2 and T3 in a saturated region to increase the output impedance.

Figure 12:
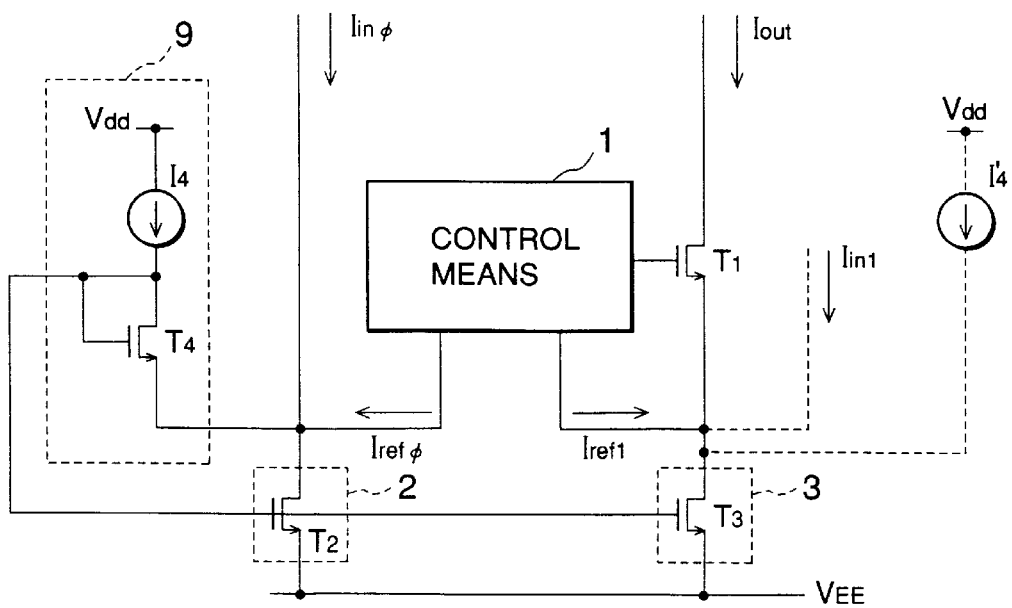
FIG. 12 is a block diagram illustrating an embodied construction of level-shift means in FIG. 8.
Figure 13:
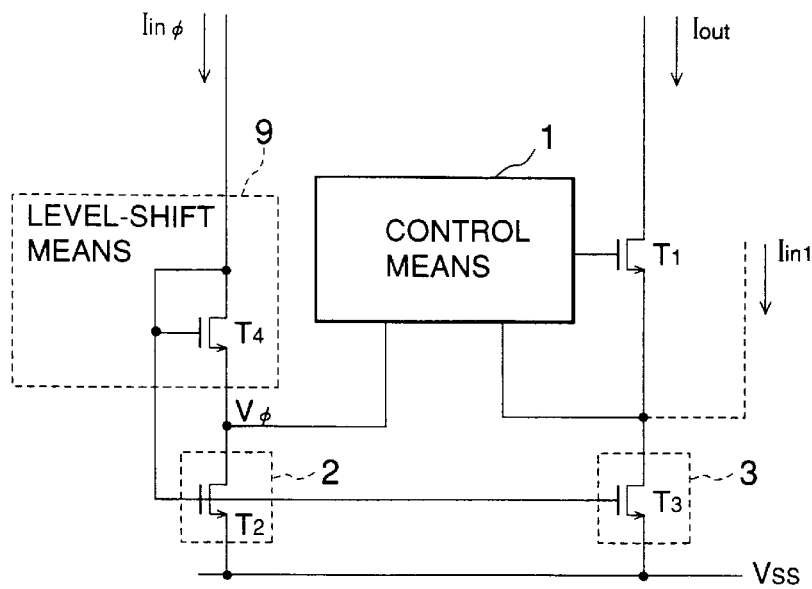
FIG. 13 is a block diagram illustrating a modification of FIG. 12.
Figure 14:
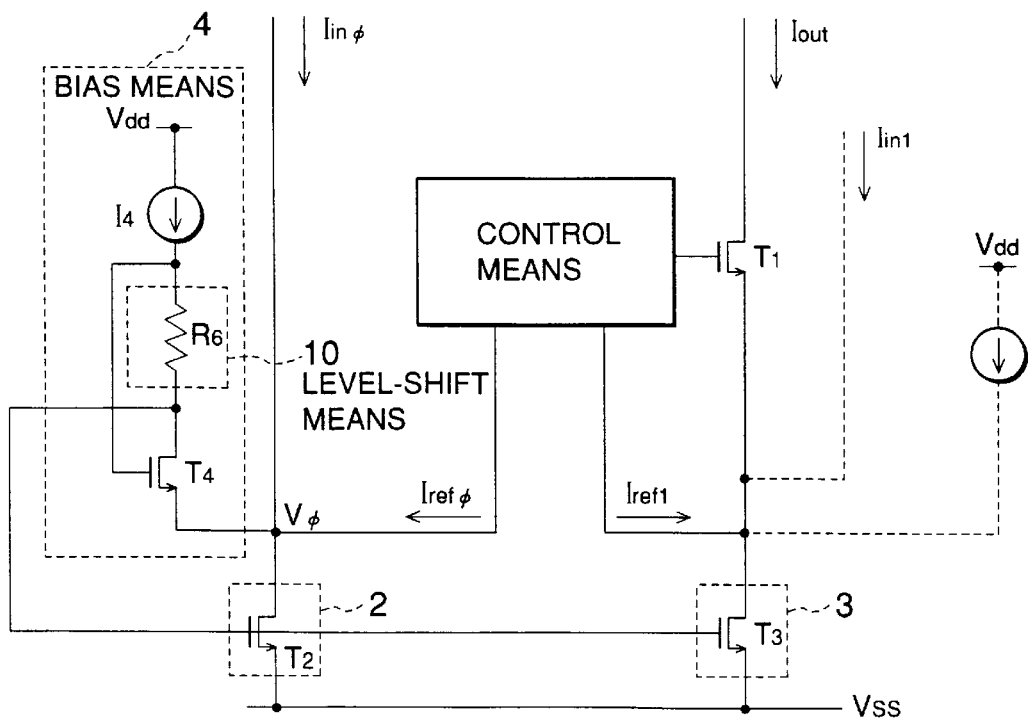
FIG. 14 is a block diagram illustrating a modification of FIG. 12.
Figure 15:
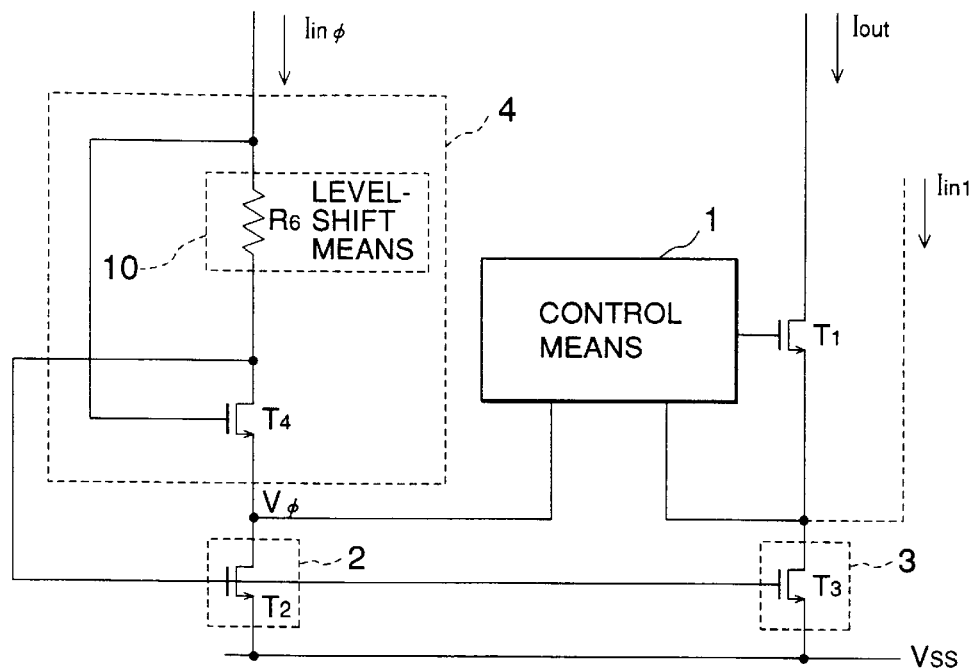
FIG. 15 is a block diagram illustrating a modification of FIG. 13.

The level-shift means 9 in FIG. 8 may comprise a diode-connected transistor T4 and a current source I4 as shown in FIG. 12. As mentioned in the description of FIG. 9, the current from the current source I4 may be amended by adding the current from the current source I4' to the drain of the transistor T3 forming the current-to-voltage converting means 3. Alternatively, it may be amended as Iref1=Iref$\phi$+I4. In addition, the input current Iin$\phi$ may be substituted for the current source I4 as shown in FIG. 13. Moreover, although the output impedances of the transistors T2 and T3 decrease in the examples of FIGS. 12 and 13 since the transistors T2 and T3 operate in a non-saturated region, it is possible to operate the transistors T2 and T3 to enhance the output impedance by connecting level-shift means 10 comprising a resistor or the like between the drain and the gate as shown in FIGS. 14 and 15 so as to increase the drain-to-source voltages of the transistors T2 and T3 by a level-shifted voltage by the level-shift means 10.

Figure 16:
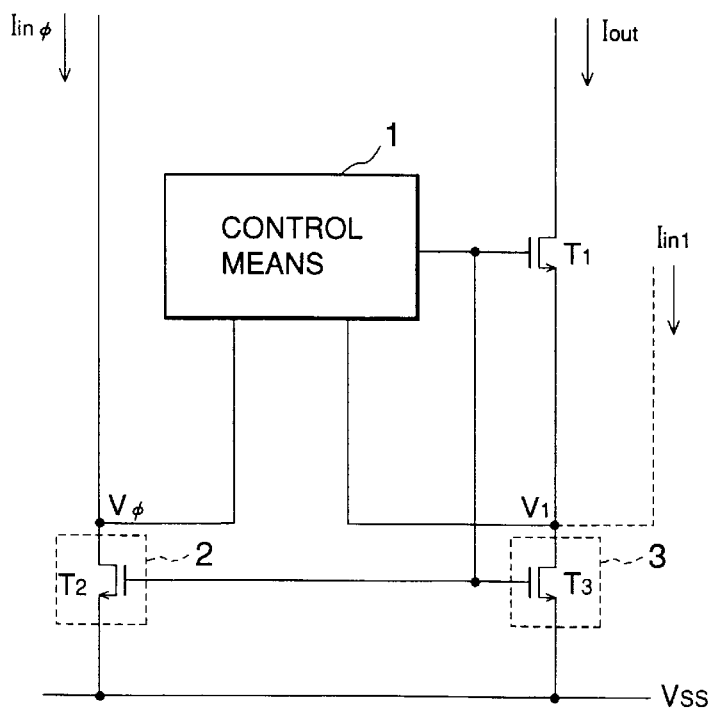
FIG. 16 is a block diagram illustrating an embodiment wherein a gate of a transistor is biased to current-to-voltage converting means by the output of control means.
Figure 17:
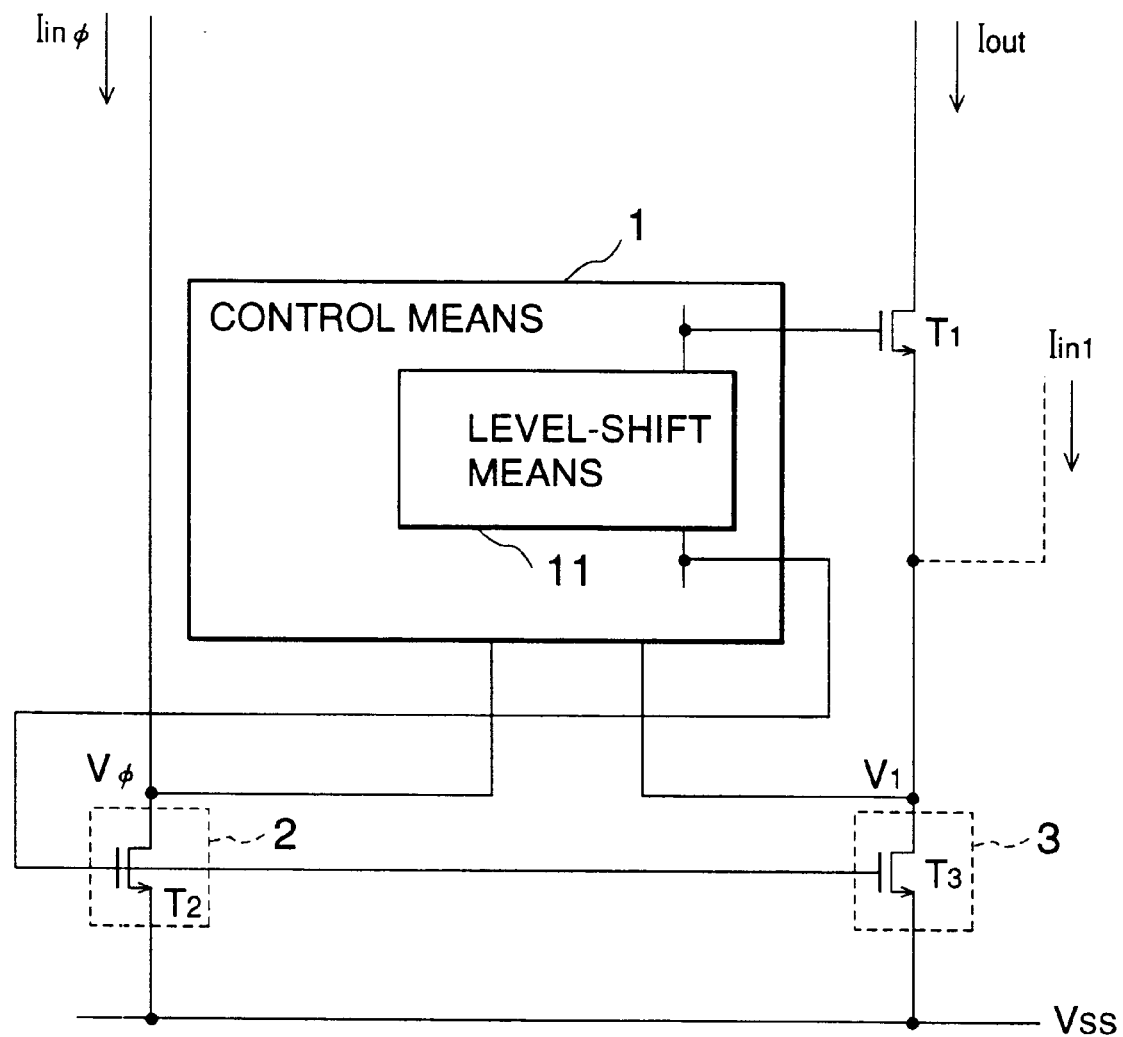
FIG. 17 is a block diagram illustrating another embodiment wherein a gate of a transistor is biased to current-to-voltage converting means by the output of control means.
Figure 18:
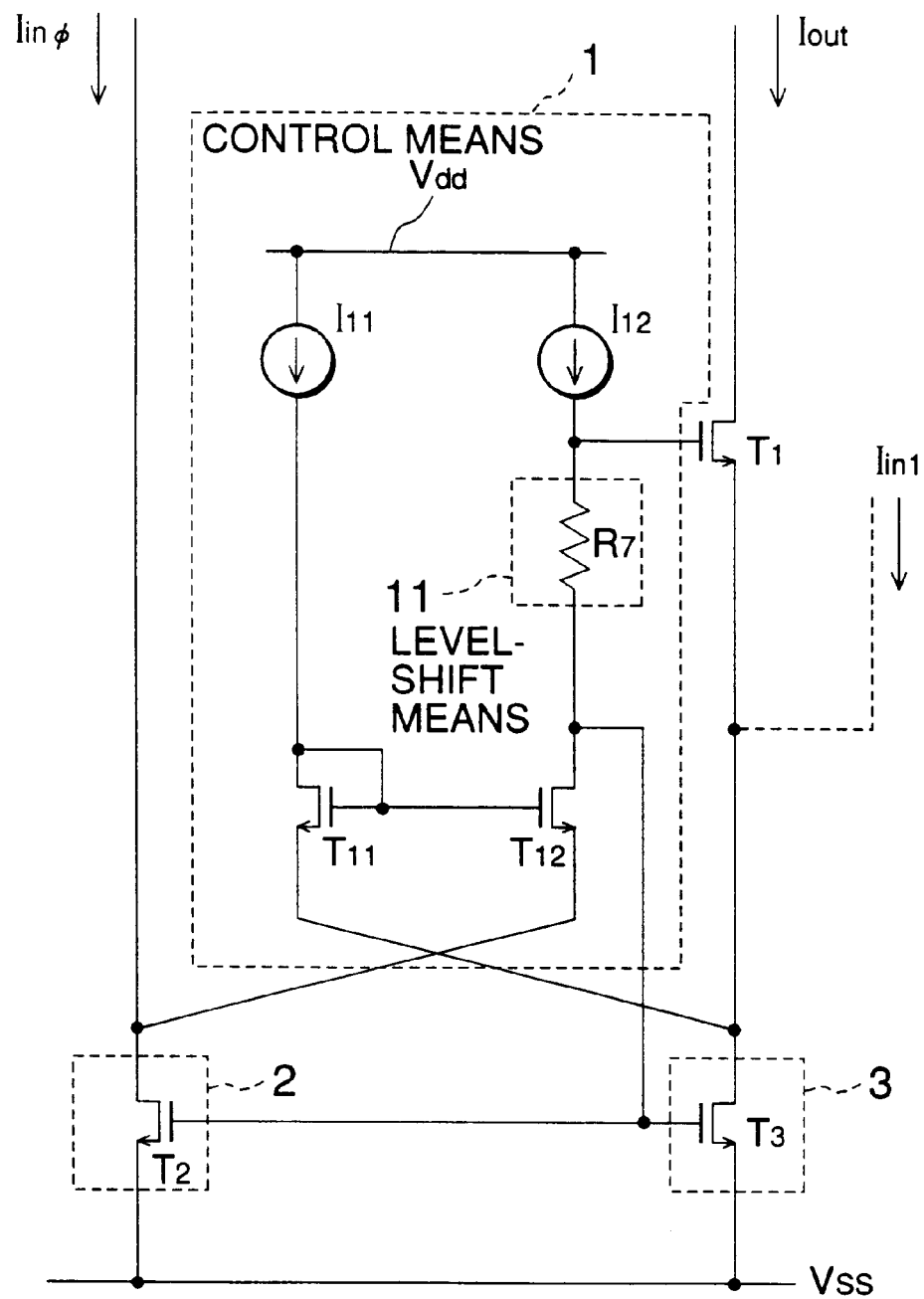
FIG. 18 is a block diagram illustrating an embodied construction of the circuit of FIG. 17.

It is also possible to omit the bias means for the transistors T2 and T3 forming the current-to-voltage converting means 2 and 3 by controlling the gates of the transistors T2 and T3 by the output of the control means 1 as shown in FIG. 16. In addition, as mentioned in the preferred embodiments of FIGS. 14 and 15, in order to enhance the output impedances of the transistors T2 and T3, the output of the control means 1 may be biased by the voltage level-shifted by the level-shift means 11 as shown in FIG. 17. This level-shift means 11 for level-shifting the output of the control means 1 is able to be easily formed by a transistor R7 as shown in FIG. 18.

Figure 19:
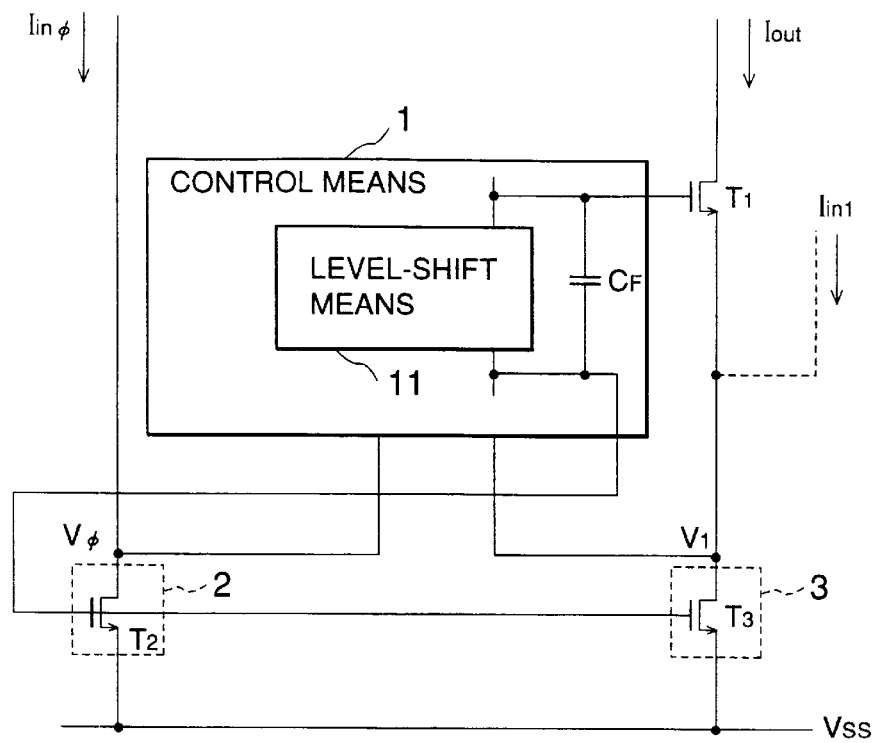
FIG. 19 is a block diagram illustrating an embodiment wherein a capacitor is connected to the level-shift means of FIG. 17 in parallel.

As shown in FIG. 19, a capacitor CF may be connected to the level-shift means 11 in parallel so as not to be under the influence of the frequency characteristic of the level-shift means 11.

Figure 20:
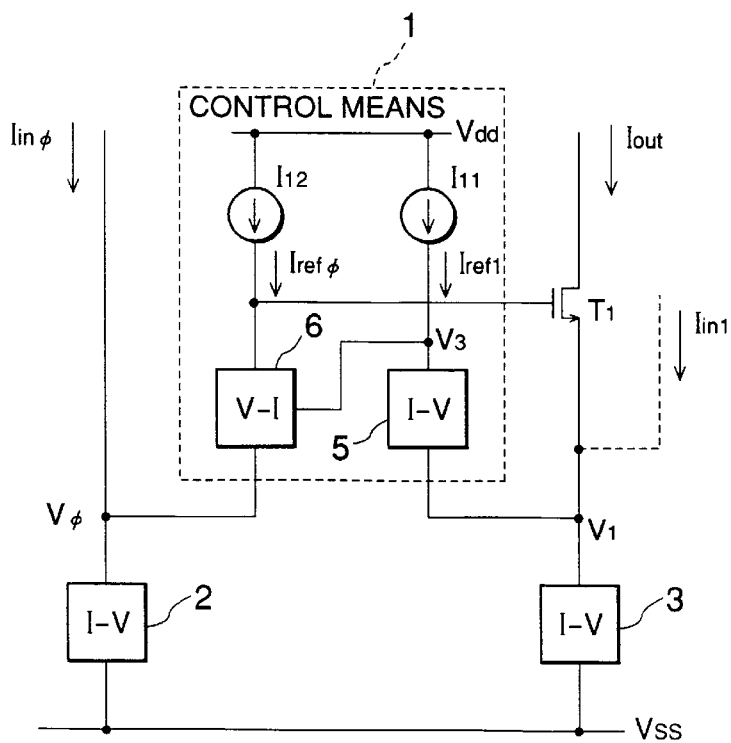
FIG. 20 is a block diagram illustrating an embodied construction of the control means.

FIG. 20 illustrates another preferred embodiment wherein the control means 1 comprises current sources I11, I12, current-to-voltage converting means 5 and voltage-to-current converting means 6. The current-to-voltage converting means 5 is designed to input the current Iref1 supplied from the current source I11 to convert the current Iref1 into a voltage V3, and the voltage-to-current converting means 6 is designed to input the V$\phi$ and the output voltage of the current-to-voltage converting means 5 to convert the output voltage into a current corresponding to the difference between these voltages. The input current Iin$\phi$ and the current Iref$\phi$ from the current source I12 in the control means 1 flow through the voltage-to-current converting means 6 to the current-to-voltage converting means 2 to be converted into the voltage V$\phi$. In addition, the output current Iout and the current Iref1 from the current source I11 in the control means 1 flow through the current-to-voltage converting means 5 to the current-to-voltage converting means 3 to be converted into the voltage V1. In order to facilitate the explanation, it is assumed that Iref$\phi$=Iref1, the characteristics of the current-to-voltage converting means 2 and 3 are the same, and the characteristic of the current-to-voltage converting means 5 is opposite to the characteristic of the voltage-to-current converting means 6.

Since V$\phi$<V1 if Iout>Iin$\phi$, the voltage applied to the voltage-to-current converting means 6 is V3−V$\phi$ which is greater than the voltage V3−V1 produced by the current-to-voltage converting means 5. Therefore, although the voltage-to-current converting means 6 intends to allow a greater flow of current than the Iref1, the output voltage of the control means 1 decreases since it is restricted by the current supplied from the current source I12. Therefore, since the gate voltage of the transistor T1 decreases, the output current Iout decreases. On the other hand, since V$\phi$>V1 if Iout<Iin$\phi$, the voltage applied to the voltage-to-current converting means 6 is V3−V1 which is less than the voltage V3−V1 produced by the current-to-voltage converting means 5. Therefore, since the voltage-to-current converting means 6 intends to allow a smaller flow of current than the Iref1, the output voltage of the control means 1 increases since the current supplied from the current source I12 is great. Therefore, since the gate voltage of the transistor T1 increases, the output current Iout increases. Thus, when the output current Iout is different from the input current Iin$\phi$, the control means 1 controls the gate voltage of the transistor T1 so that they are equal to each other.

Furthermore, if the output current Iout intends to vary due to the variation of the output voltage, the control means 1 controls so as to decrease the variation of the output current Iout as mentioned above. That is, the output impedance is enhanced.

Figure 21:
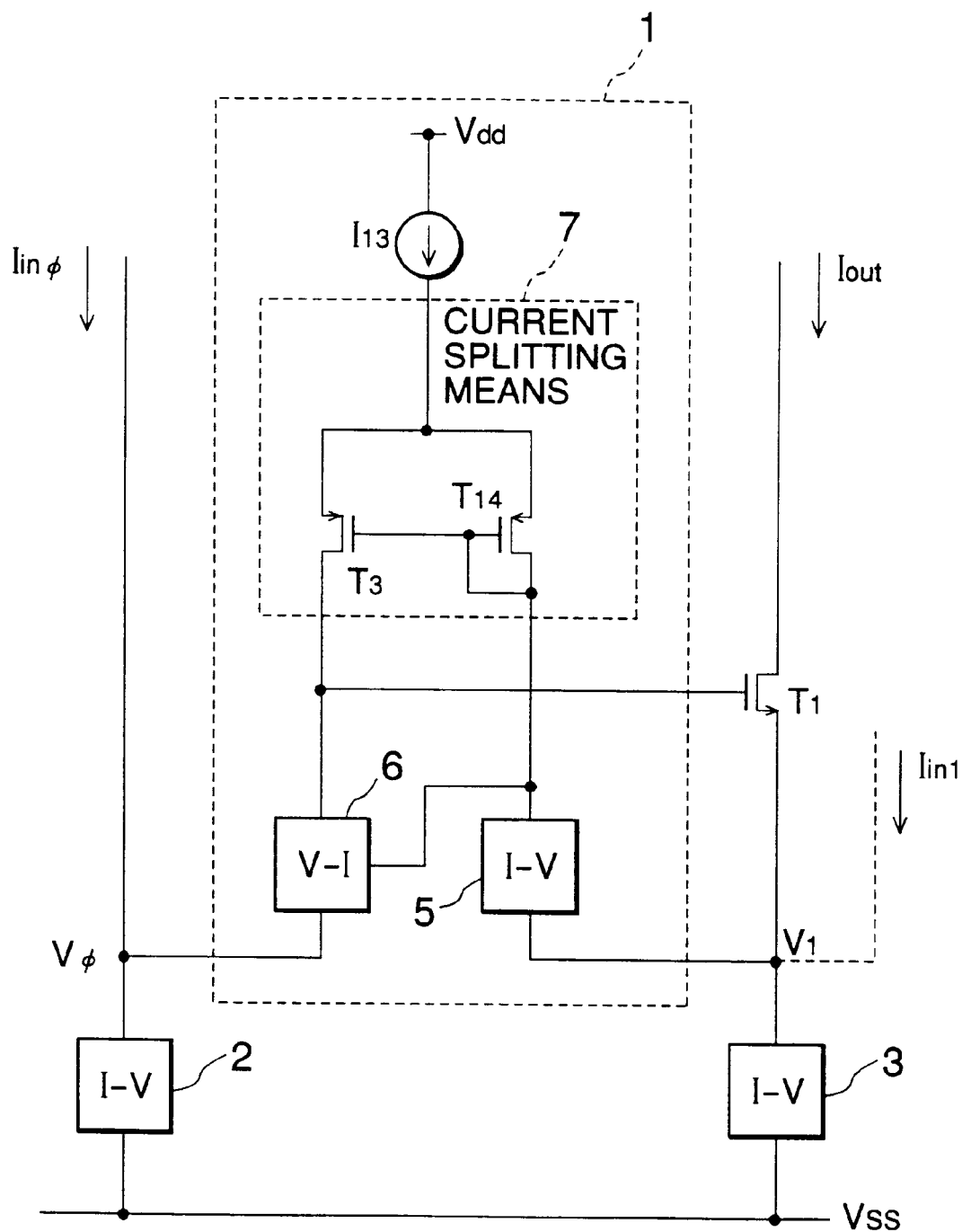
FIG. 21 is a block diagram illustrating a modification of FIG. 20.

With respect to an output error of the control means 1 which occurs when the output impedance of the transistors forming the current sources I11 and I12 in FIG. 20, it is possible to restrict the voltage range of the allowable output of the control means 1 to reduce the output error of the control means 1 by substituting current splitting means 7 comprising a current source I13 and transistors T13 and T14 as shown in FIG. 21 for the current sources I11 and I12.

Figure 22:
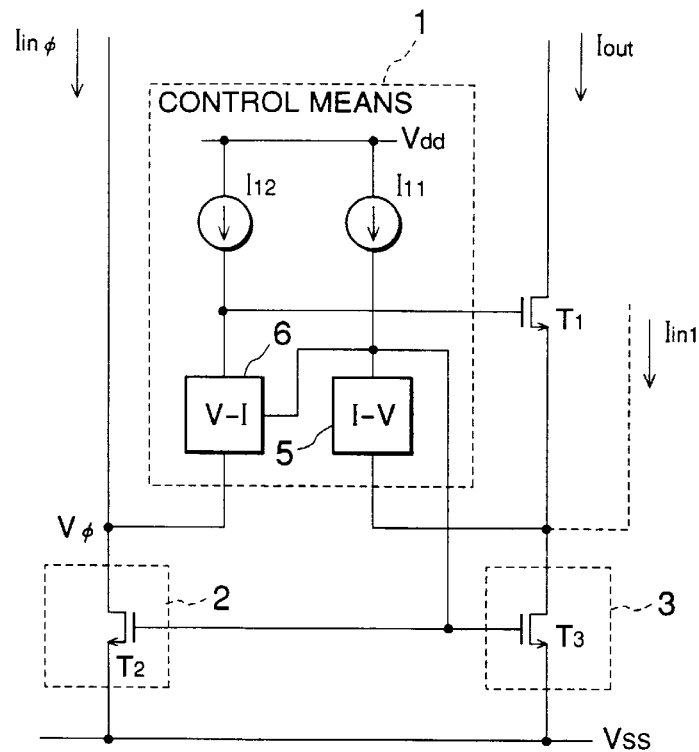
FIG. 22 is a block diagram illustrating an embodiment wherein a gate of a transistor is biased to current-to-voltage converting means using an internal voltage of control means.

When the current-to-voltage converting means 2 and 3 in FIG. 20 comprise the transistors T2 and T3, the gates of the transistors T2 and T3 may be biased by the output potential of the current-to-voltage converting means 5 of the control means 1 to omit the bias means for the transistors T2 and T3 as shown in FIG. 22.

Figure 23:
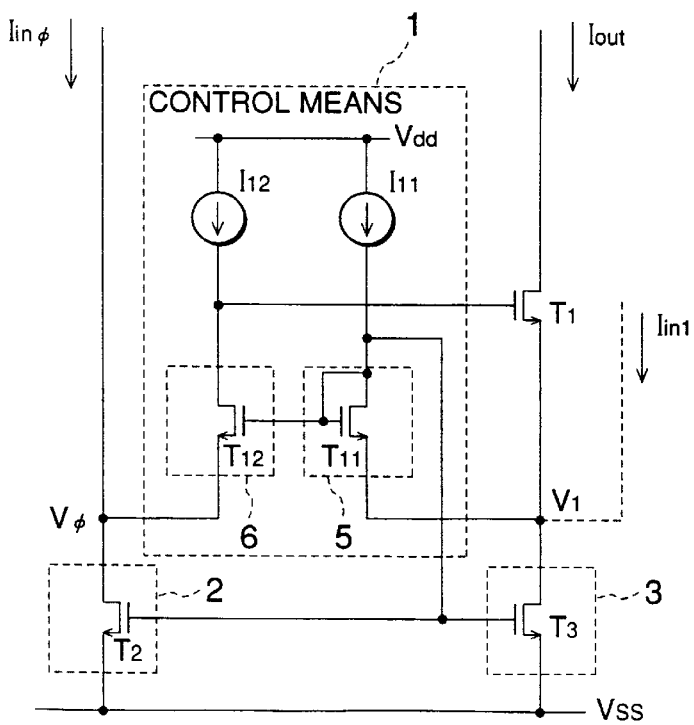
FIG. 23 is a block diagram illustrating an embodied construction of the circuit in FIG. 22.
Figure 24:
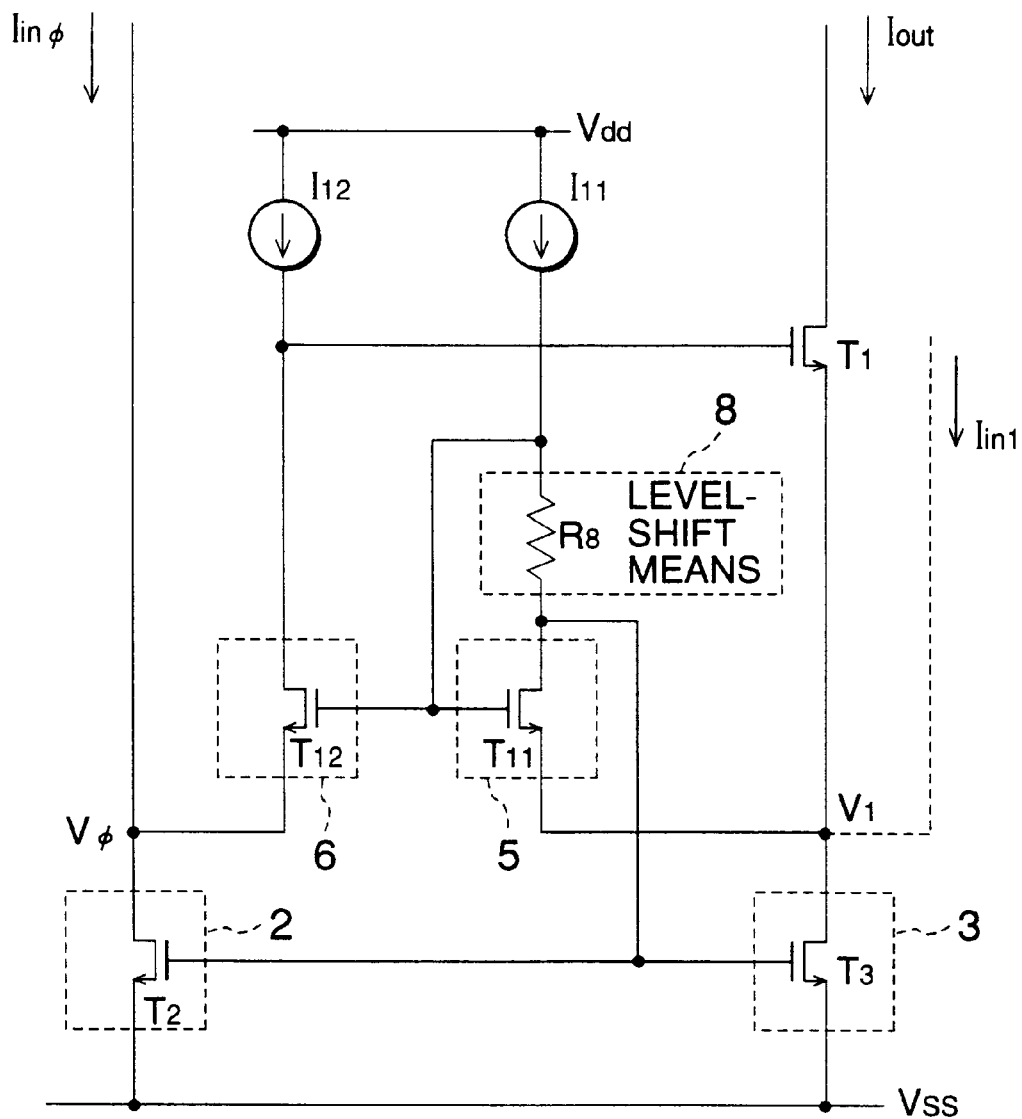
FIG. 24 is a block diagram illustrating a modification of FIG. 23.
Figure 25:
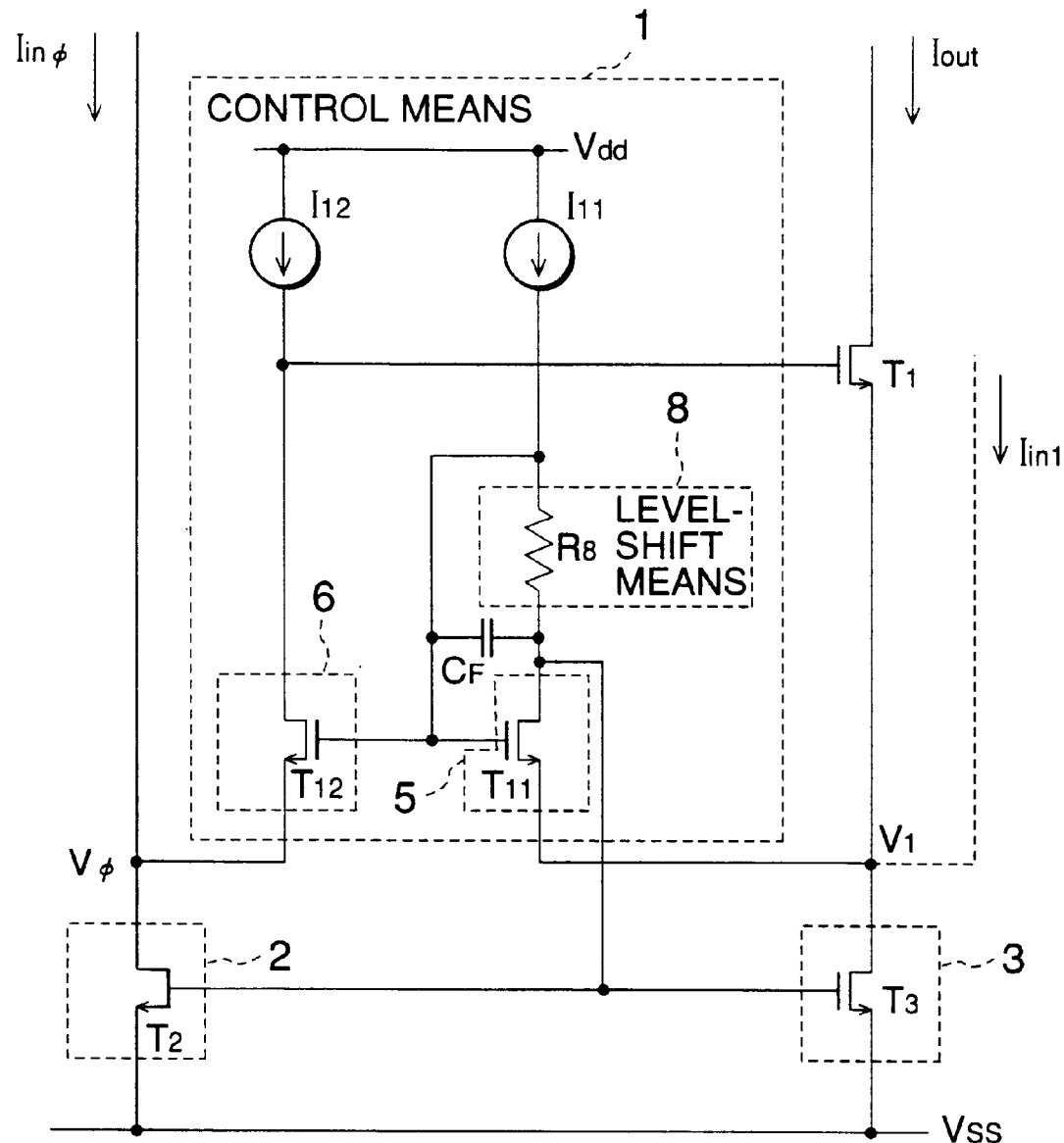
FIG. 25 is a block diagram illustrating an embodiment wherein a capacitor is connected to the level-shift means of FIG. 24 in parallel.

FIG. 23 illustrates a detailed circuit of FIG. 22. In this figure, the current-to-voltage converting means 5 comprises a diode-connected transistor T11, and the voltage-to-current converting means 6 is a transistor T12. In order to slightly increase the drain-to-source voltages of the transistors T2 and T3 to enhance the output impedance, level-shift means 8 comprising a resistor R8 and so forth may be inserted between the drain and the gate of the transistor T11 forming the current-to-voltage converting means 5 as shown in FIG. 24. Moreover, as shown in FIG. 25, a capacitor CF may be connected to the level-shift means in parallel so as not to be under the frequency characteristic of the level-shift means.

Figure 26:
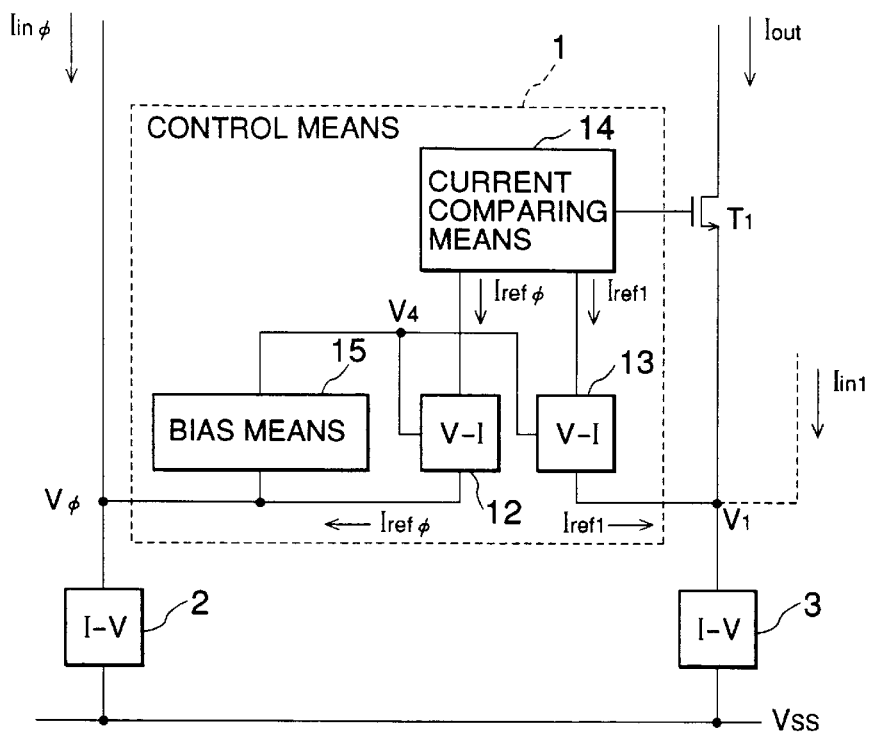
FIG. 26 is a block diagram illustrating an embodied construction of the control means.

FIG. 26 illustrates another preferred embodiment wherein the control means 1 comprises bias means 15 for producing a bias voltage V4 using the voltage V$\phi$ current-to-voltage converted by the current-to-voltage converting means 2 of the control means 1 as a reference, voltage-to-current converting means 12 and 13, and current comparing means 14. The voltage-to-current converting means 12 and 13 input the V$\phi$, the V1 and the bias voltage produced by the bias means 15 to convert the bias voltage into currents corresponding to the differences between the bias voltage V4, and the Vφ and the V1, respectively. In addition, the current comparing means 14 is designed to compare Irefφ and Iref1 which have been converted by the voltage-to-current converting means 12 and 13, so as to decrease the output voltage if Irefφ>Iref1, or to increase the output voltage if Irefφ<Iref1.

The input current Iinφ and the current Irefφ converted by the voltage-to-current converting means 12 in the control means 1 flow through the current-to-voltage converting means 2 to be converted into the voltage Vφ. In addition, the output current Iout and the current Iref1 converted by the voltage-to-current converting means 13 in the control means 1 flow through the current-to-voltage converting means 3 to be converted into the voltage V1. In order to facilitate the explanation, it is assumed that the characteristics of the voltage-to-current converting means are the same.

Now, assuming that the input current changes from the state wherein Iout=Iinφ, Vφ=V1 and Irefφ=Iref1, to the state wherein Iout>Iinφ, Vφ<V1 since the current flowing into the current-to-voltage converting means 2 is less than that in the previous state. Therefore, the voltage applied to the voltage-to-current converting means 12 is greater than the voltage applied to the voltage-to-current converting means 13, so that Irefφ>Iref1. Since the current comparing means 14 decrease the output voltage, i.e. the gate voltage of the transistor T1, the output current Iout decreases. On the other hand, assuming that the input current changes to Irefφ<Iinφ, Vφ>V1 since the current flowing into the current-to-voltage converting means 2 is greater than that in the previous state.

Therefore, the voltage applied to the voltage-to-current converting means 12 is smaller than the voltage applied to the voltage-to-current converting means 13, so that Irefφ<Iref1. Since the current comparing means 14 increases the output voltage, i.e. the gate voltage of the transistor T1, the output current Iout increases. Thus, if the output current Iout is different from the input current Iinφ, the control means 1 controls the gate voltage of the transistor T1 so as to equalize them.

Furthermore, if the output current Iout intends to vary due to the variation of the output voltage, the control means 1 controls so as to decrease the variation of the output current Iout as mentioned above. That is, the output impedance is enhanced.

Figure 27:
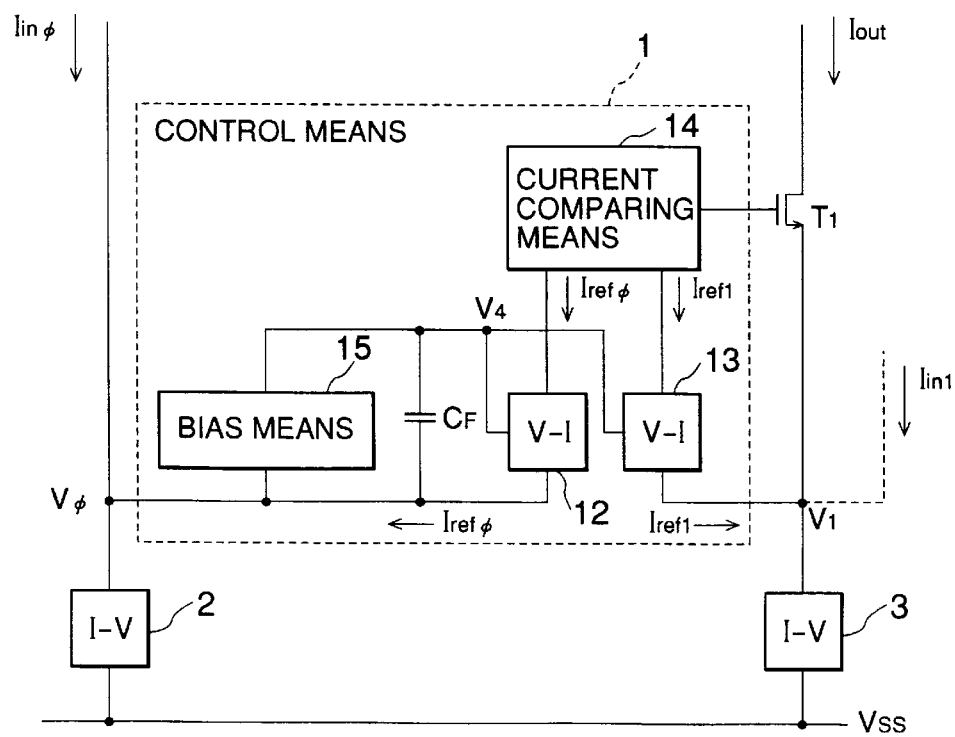
FIG. 27 is a block diagram illustrating an embodiment wherein a capacitor is connected to the bias means of FIG. 26 in parallel.

In FIG. 26, a capacitor CF may be connected to the bias means 15 in parallel so as not to be under the influence of the frequency characteristic of the bias means 15 as shown in FIG. 27.

Figure 28:
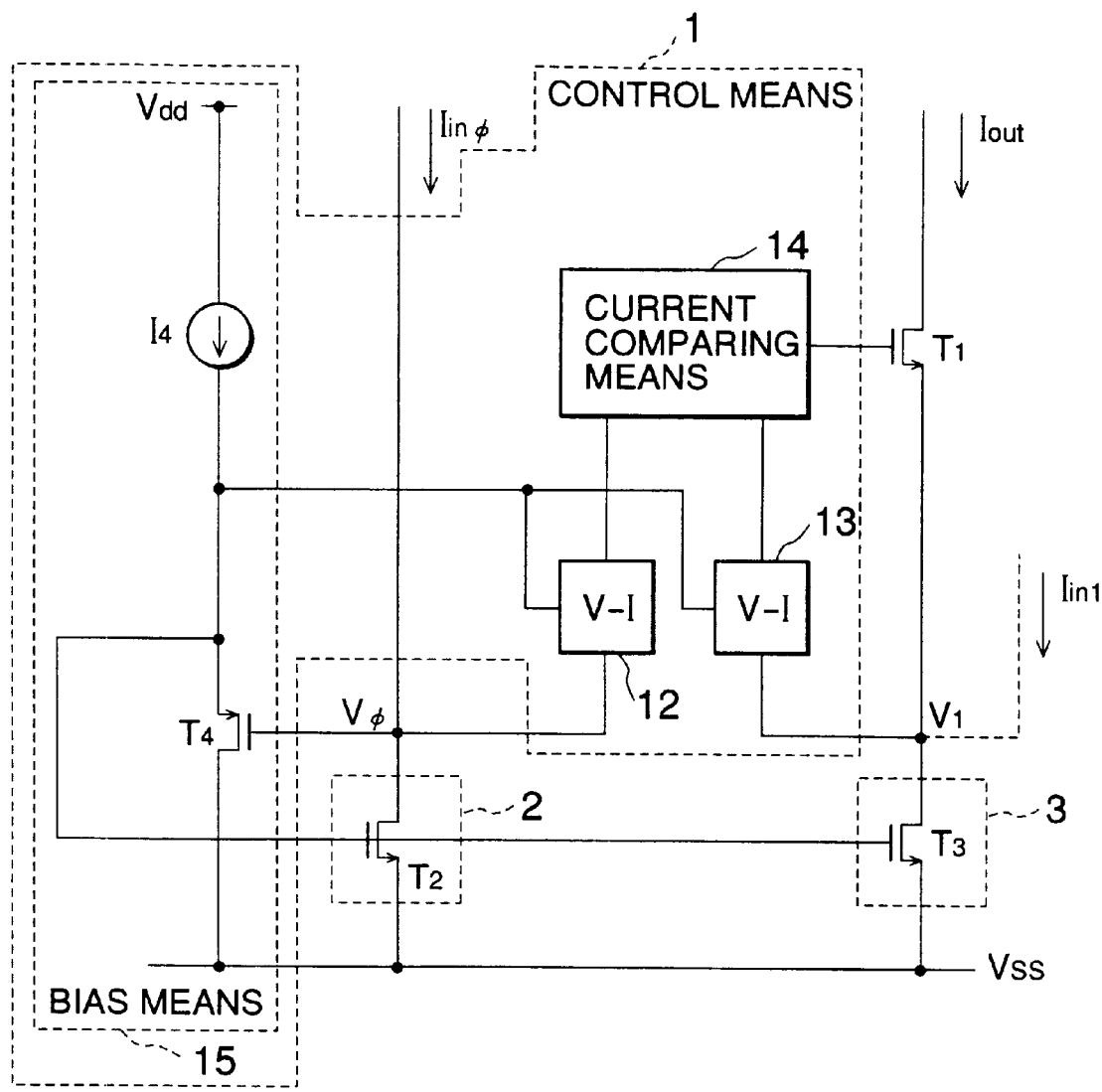
FIG. 28 is a block diagram illustrating an embodied construction of the bias means of FIG. 26.

FIG. 28 illustrates another preferred embodiment wherein in FIG. 26, the current-to-voltage converting means 2 and 3 comprise transistors T2 and T3, and the bias means 15 comprises a source follower based on a transistor T4 which has a different conductivity type from that of the transistor T2. The output of the bias means 15 may be used as the biases of the transistors T2 and T3 to omit the bias means of the transistors T2 and T3.

Figure 29:
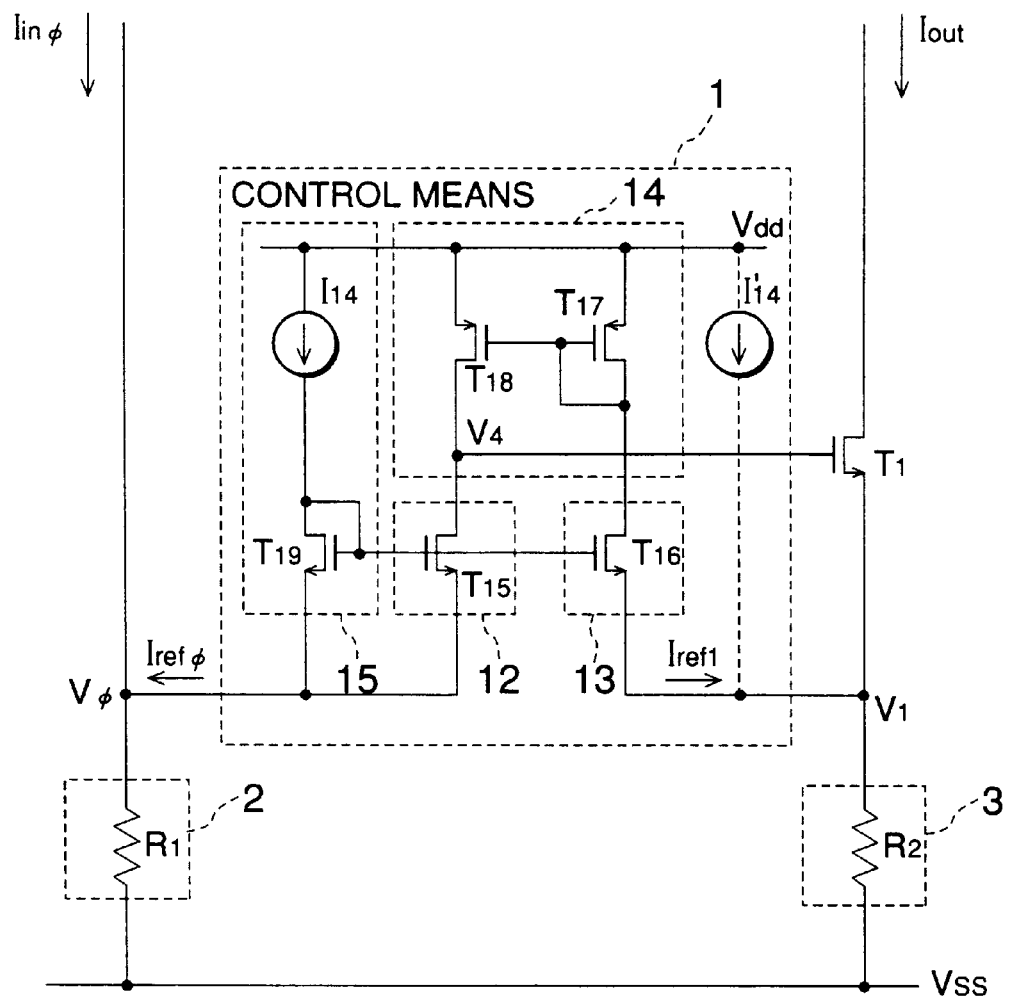
FIG. 29 is a block diagram illustrating an embodied construction of the circuit of FIG. 26.

FIG. 29 illustrates another preferred embodiment wherein in FIG. 26, the bias means 15 of the control means 1 comprises a current source 14 and a diode-connected transistor T19, the voltage-to-current converting means 12 and 13 comprise transistors T15 and t16, respectively, and the current comparing means comprises transistors T17 and T18. Since the current flowing from the current source I14, together with the input current Iinφ, is inputted to the current-to-voltage converting means 2, the current from the current source I14 is amended by adding the current from the current source I14' to the drain of the transistor T3 forming the current-to-voltage converting means 3. Alternatively, it may be amended by changing the ratios of channel width/channel length (W/L) of the transistors T15 and T16 assuming that Iref1=Irefφ+I14. In addition, as shown in FIG. 30, the input current Iinφ may be substituted for the current source 14.

Figure 30:
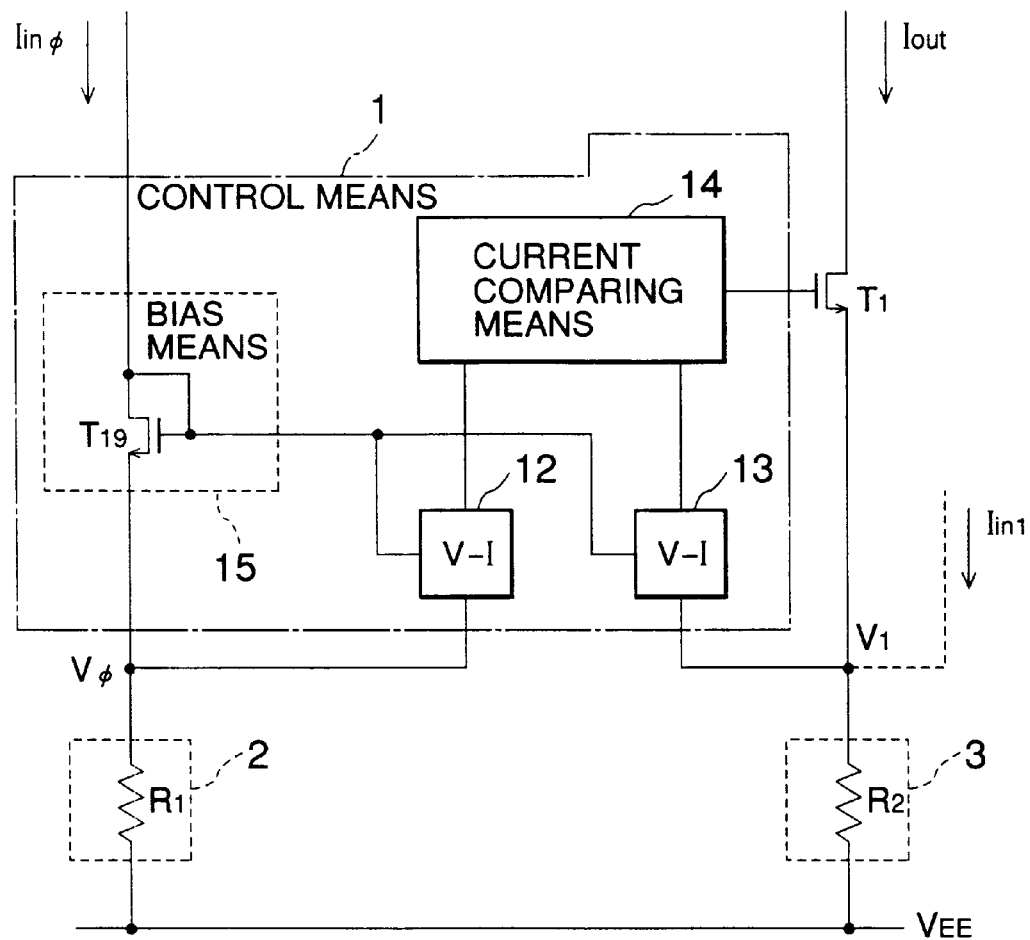
FIG. 30 is a block diagram illustrating a modification of FIG. 29.
Figure 31:
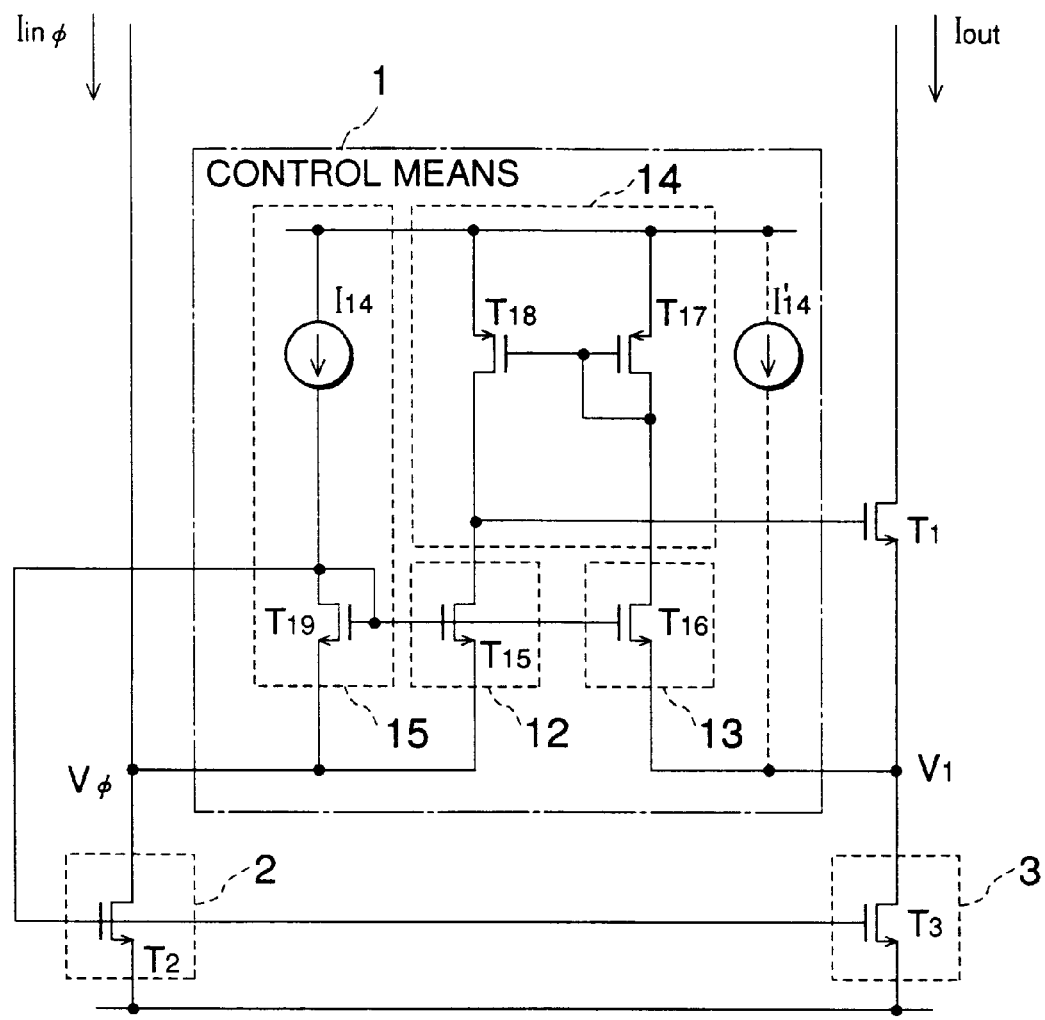
FIG. 31 is a block diagram illustrating an embodiment wherein a gate of a transistor is biased to current-to-voltage converting means using an internal voltage of control means.
Figure 32:
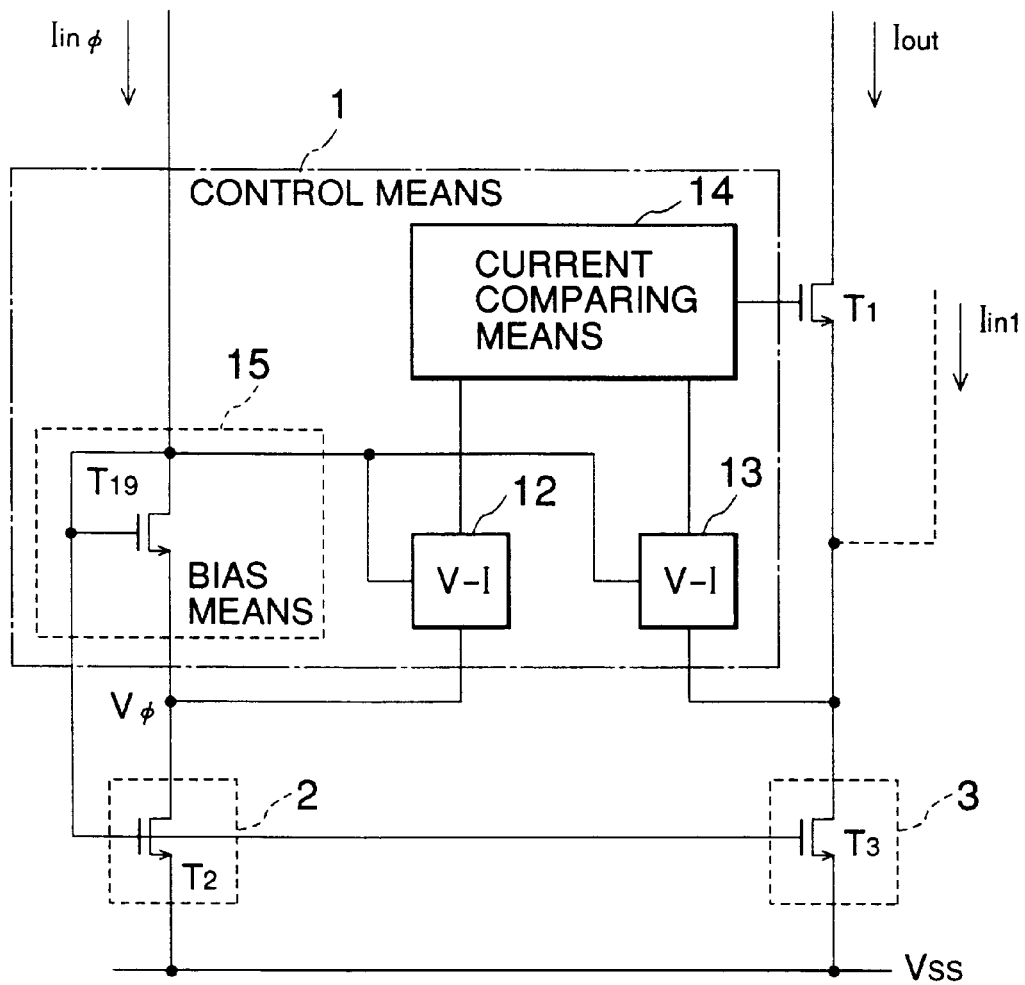
FIG. 32 is a block diagram illustrating a modification of FIG. 31.
Figure 33:
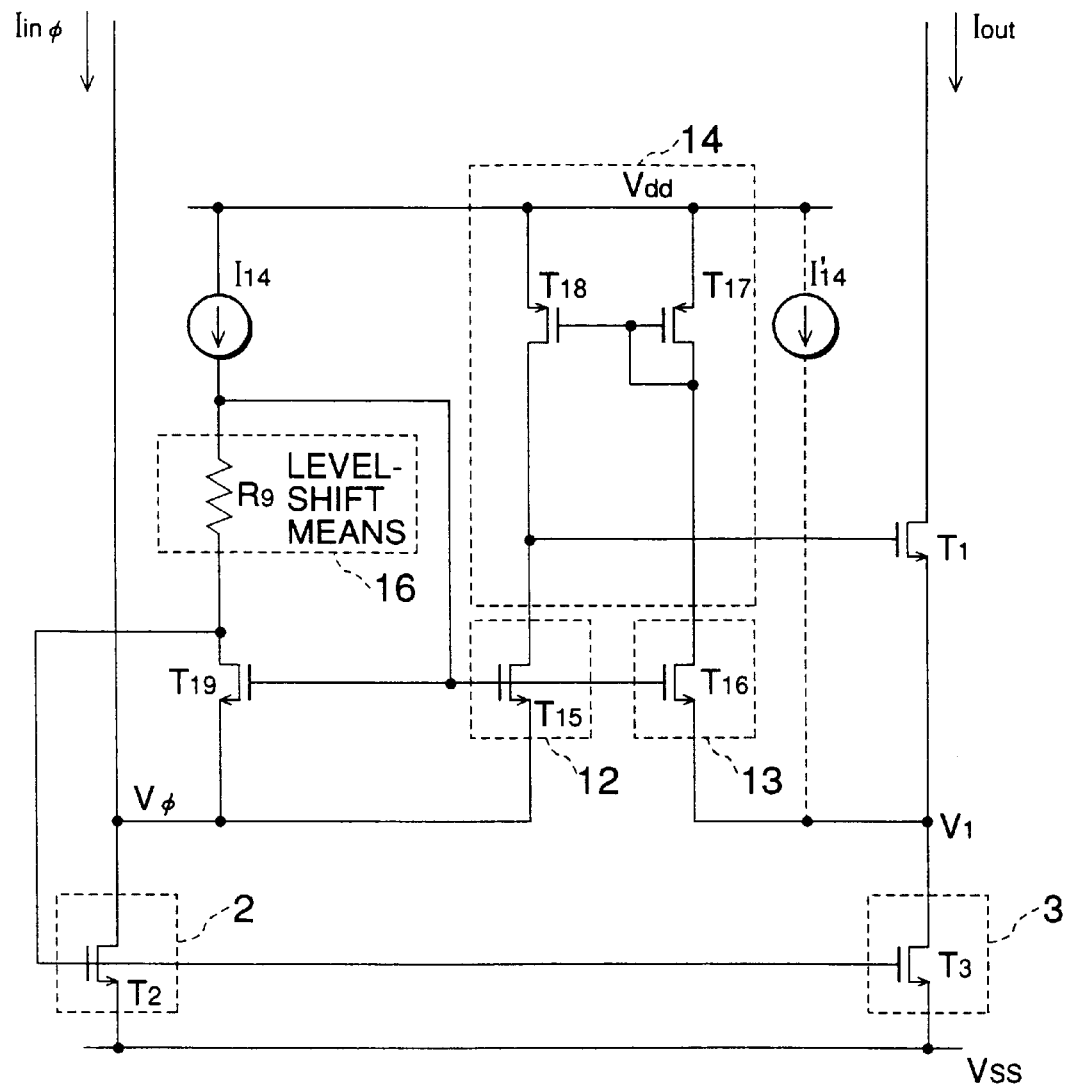
FIG. 33 is a block diagram illustrating a modification of FIG. 31.
Figure 34:
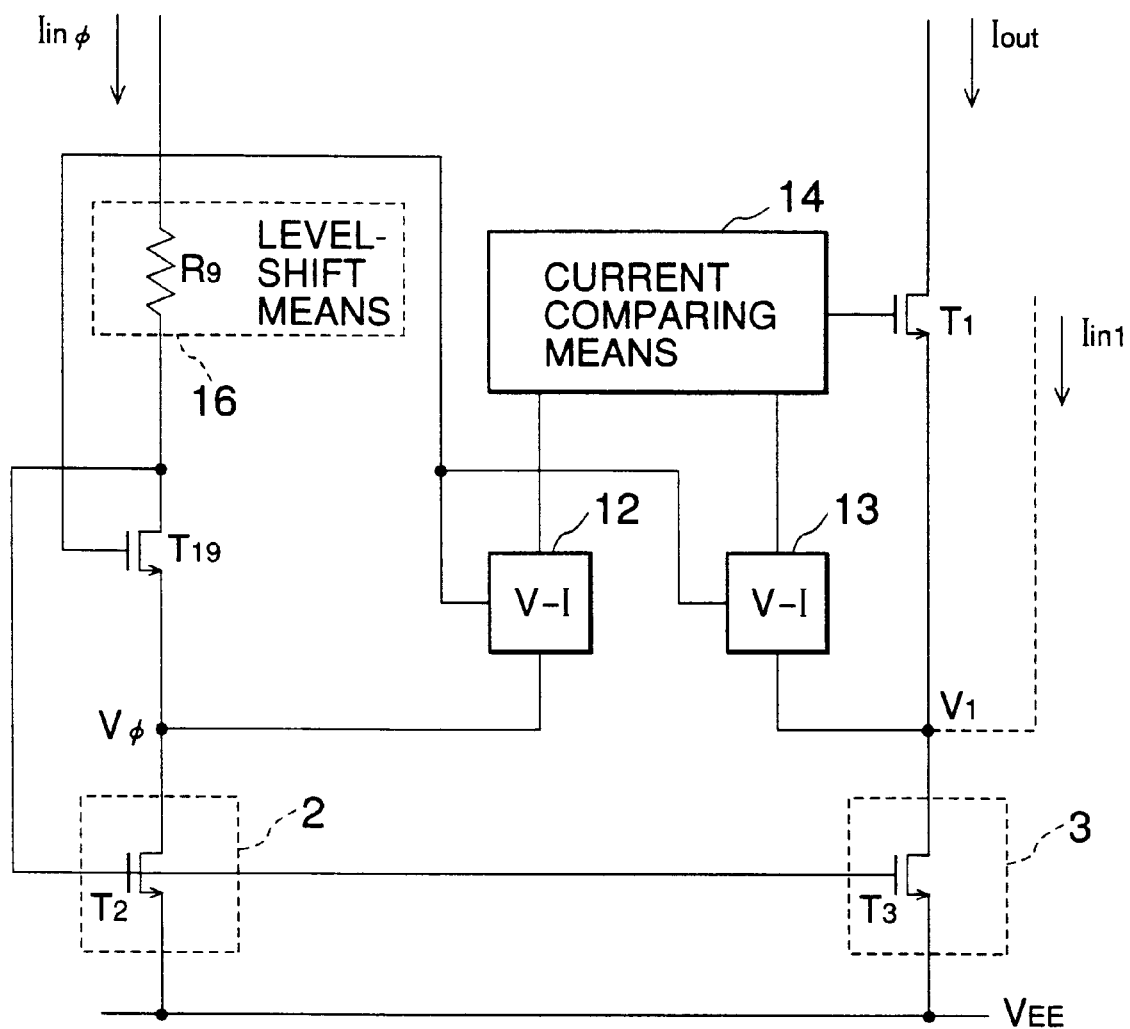
FIG. 34 is a block diagram illustrating a modification of FIG. 32.

While the current-to-voltage converting means 2 and 3 have comprised the resistors RI and R2 in FIGS. 29 and 30, when the current-to-voltage converting means 2 and 3 comprise the transistors T2 and T3, the bias means 15 may also serve as means for biasing the gates of the transistors T2 and T3 to simplify the circuit as shown in FIGS. 31 and 32. In addition, as shown in FIGS. 33 and 34, it is possible to operate the transistors T2 and T3 in a saturated region to enhance the output impedance by inserting the level-shift means 16 comprising the resistor and so forth as mentioned in the description of FIGS. 14 and 15 between the drain and the gate of the transistor R19 in FIGS. 31 and 32 so as to bias the gates of the transistors T2 and T3 at a level-shifted voltage.

Figure 35:
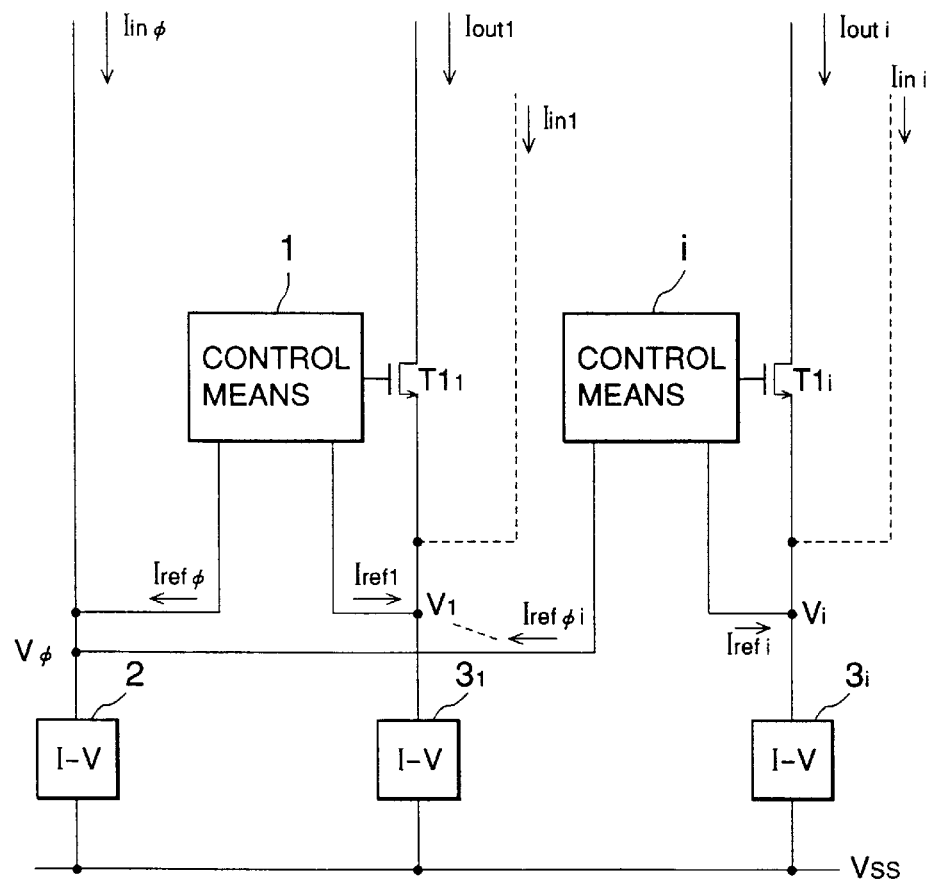
FIG. 35 is a block diagram illustrating a circuit having a plurality of outputs.

FIG. 35 illustrates another preferred embodiment designed to be adapted to a plurality of outputs. In FIG. 35, the current-to-voltage converting means 2 of the current mirror circuit described in FIG. 1 are commonly used to comprise m control means 101 . . . (100+m) corresponding to the number m of outputs, m transistors T101 . . . (100+m), each outputting an output current, and m current-to-voltage converting means 301 (300+m) for current-to-voltage converting the output currents. The operation of this preferred embodiment will be briefly described below.

The control means i (1≦i≦m) refers to voltages Vφ and Vi current-to-voltage converted by the current-to-voltage converting means 2 and the current-to-voltage converting means (300+i) to control the transistor T(100+i) so that Irefφi and Irefi flow from the control means i to the current-to-voltage converting means 2 and the current-to-voltage converting means (300+i) at a predetermined ratio.

In order to facilitate the explanation, it is assumed, for example, that all the output current Iout1 . . . Ioutm are equally outputted to the input current Iinφ. It is also assumed that the characteristics of the control means 101 . . . (100+m), the characteristics of the current-to-voltage converting means 2, 301 . . . (301+m) and the values W/L of the transistors T101 . . . (100+m) are the same. In this case, it is set so that Irefφi=mIrefi (1≦i≦m).

The input current Iinφ and the currents Irefφ1 . . . Irefφm from the control means 101 . . . (100+m) flow into the current-to-voltage converting means 2 to produce a voltage Vφ. Since the sum of from Irefφi to Irefφm is equal to Irefi if the output current Iouti=Iinφ, Vφ=Vi. If the output current Iouti is shifted from the input current Iinφ due to the variation of the drain voltage of the transistor T(100+i) serving as the output voltage and the variation of the input current Iinφ, it is converted into voltage by the current-to-voltage converting means (300+i), so that Vi≠Vφ.

Since the control means i refers to the voltage Vφ and Vi to produce currents in the current-to-voltage converting means 2 and the current-to-voltage converting means (300+i), if Vi≠Vφ, the ratio of the currents Irefφi and Irefi flowing from the control means i to the current-to-voltage converting means 2 and the current-to-voltage converting means (300+i) is shifted. As a result, the control means i controls the gate voltage of the transistor T(100+i) so that the ratio of the currents is a predetermined ratio, so as to cause the output current Iouti flowing through the current-to-voltage converting means (300+i) to approach the input current Iinφ. In this way, the transistor T(100+i) is controlled by the control means i to operate the respective outputs as current mirror circuits following the input current Iinφ, so that it is possible to enhance the output impedance. In addition, another input current Iini may be applied to the current-to-voltage converting means (300+i) to output a differential current Iinφ−Iini.

Figure 36:
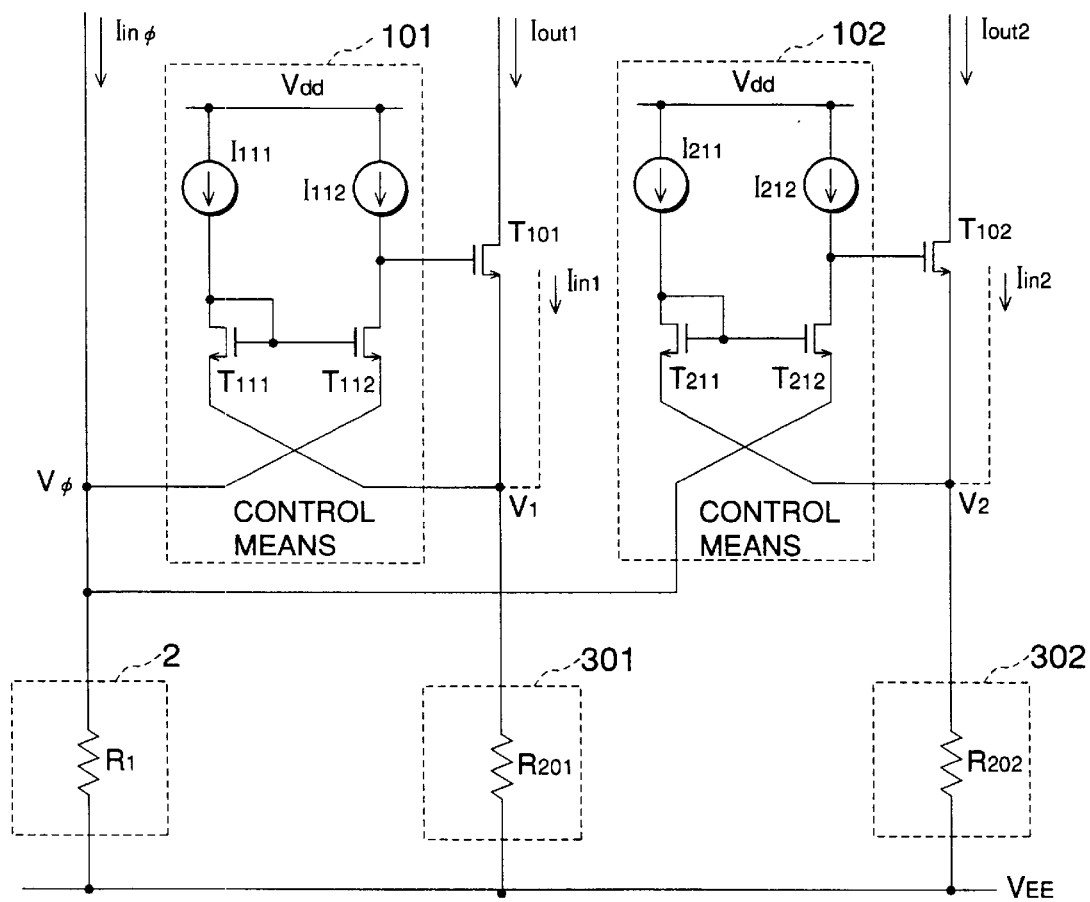
FIG. 36 is a block diagram illustrating an embodied construction of FIG. 35.

FIG. 36 illustrates a specified embodiment wherein the number of outputs is 2, the current-to-voltage converting means comprises resistors R1, R201 and R202 as shown in FIG. 2, and the control means 101 and 102 comprise transistors T111, T112, T211, T212 and current sources I111, I112, I211 and I212. The operations of the respective control means are the same as that of FIG. 2.

Figure 37:
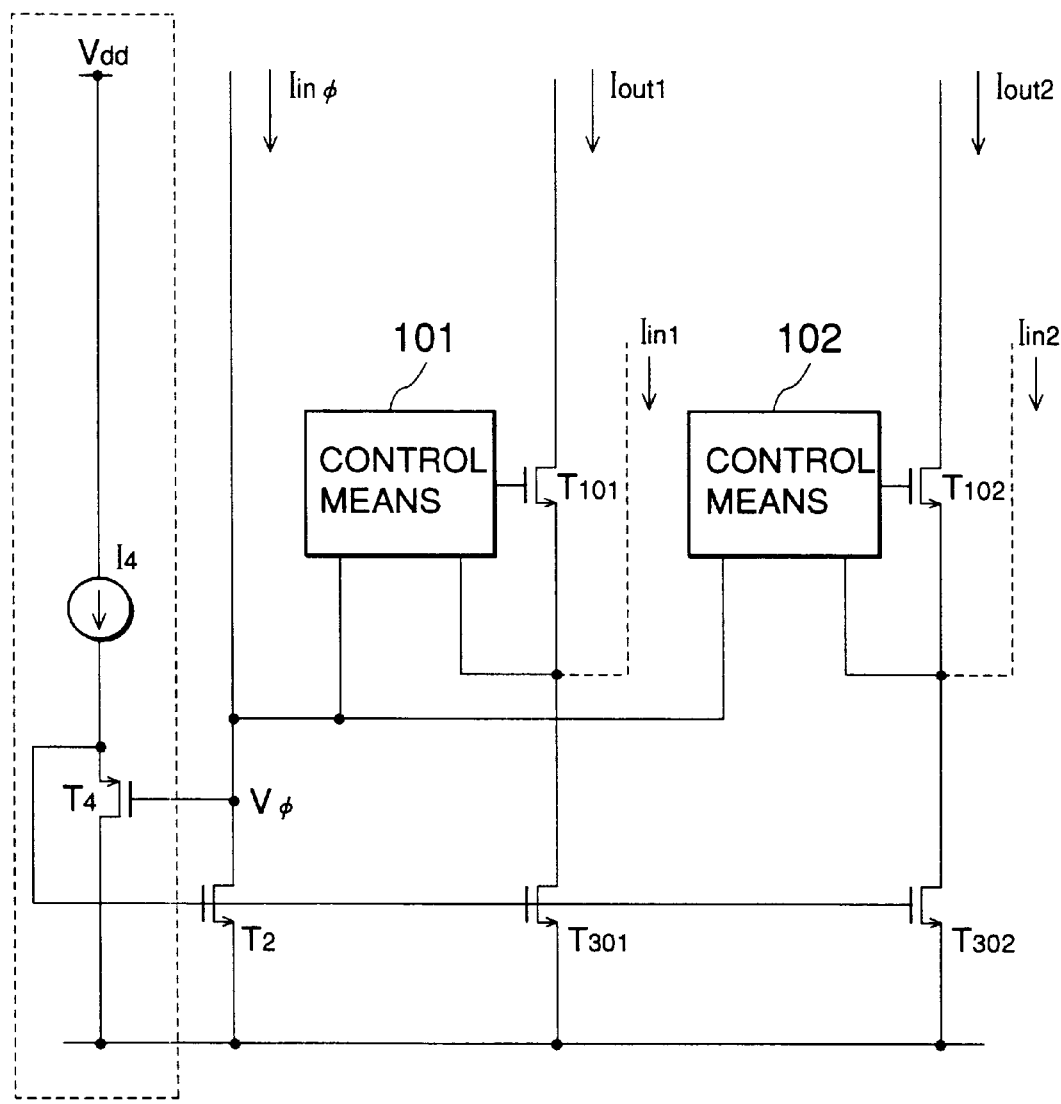
FIG. 37 is a block diagram illustrating an embodied construction of FIG. 35.

FIG. 37 illustrates another preferred embodiment wherein the number of outputs is 2, the current-to-voltage converting means comprises transistors T2, T301 and T302 as shown in FIG. 11, and the bias means comprises a source follower based on a transistor T4 having a different conductivity type from the transistor T2. As described in FIG. 1, it is possible to decrease the node voltage Vφ, to which the input current is inputted.

Figure 38:
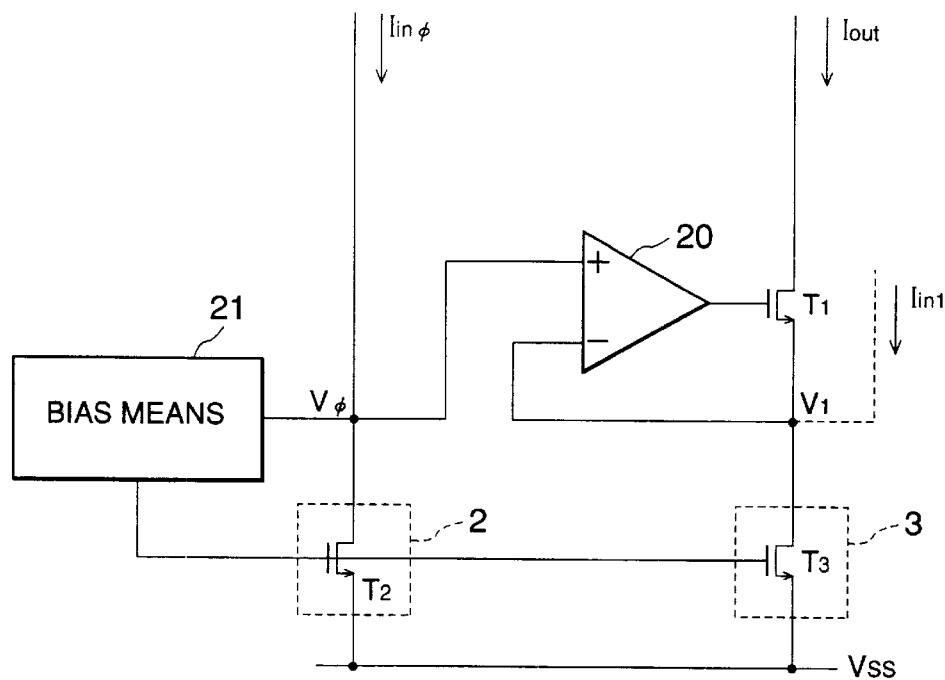
FIG. 38 is a block diagram illustrating the second preferred embodiment of the present invention.

FIG. 38 illustrates the second preferred embodiment of the present invention. In the current mirror shown in FIG. 38, the sources of transistors T2 and T3 which form current-to-voltage converting means 2 and current-to-voltage converting means 3, respectively, are connected to Vss, respectively. In addition, the current-to-voltage converting means 2 inputs an input current Iinφ, and the drain of a transistor T1 outputs an output current. The source of the transistor T1 is connected to the drain of the transistor T3 forming the current-to-voltage converting means 3. Voltage comparing means 20 compares voltages Vφ and V1 current-to-voltage converted by the current-to-voltage converting means 2 and 3 to supply the gate voltage of the transistor T1 by the output thereof to control so that Vφ=V1. Both the transistors T2 and T3 are biased by the voltage produced by the bias means 21 using the voltage Vφ current-to-voltage converted by the current-to-voltage converting means 2 as a reference.

The preferred embodiment shown in FIG. 38 will be described below. In order to facilitate the explanation, it is assumed that the values W/L of the transistors T2 and T3 are equal to each other. As described in the preferred embodiment of FIG. 6, the gates of the transistors T2 and T3 are biased by the voltage produced by the bias means 21 using the voltage Vφ current-to-voltage converted by the current-to-voltage converting means 2 as a reference, so as to decrease the dependency of the voltages required between the drains and the sources of the transistors T2 and T3 upon the input current.

If the output current Iout following through the current-to-voltage converting means 3 is shifted from the current value of the input current due to the variation of the output voltage (the drain voltage of the transistor T1) and the variation of the input current Iinφ, the shifted current value is converted to voltage by the current-to-voltage converting means 3, so that Vφ≠V1. Since V1>Vφ when Iout>Iinφ, the output of the voltage comparing means 20 decreases to decrease the gate voltage of the transistor T1 so as to decrease the output current Iout. In addition, since V1<Vφ when Iout<Iinφ, the output of the voltage comparing means 20 increases to increase the gate voltage of the transistor T1 so as to increase the output current Iout. Thus, it does not only cause the output current to follow the input current as a current mirror circuit, but also operates so that the output current does not vary due to the fluctuation of the output voltage. That is, the output impedance is increased.

Figure 39:
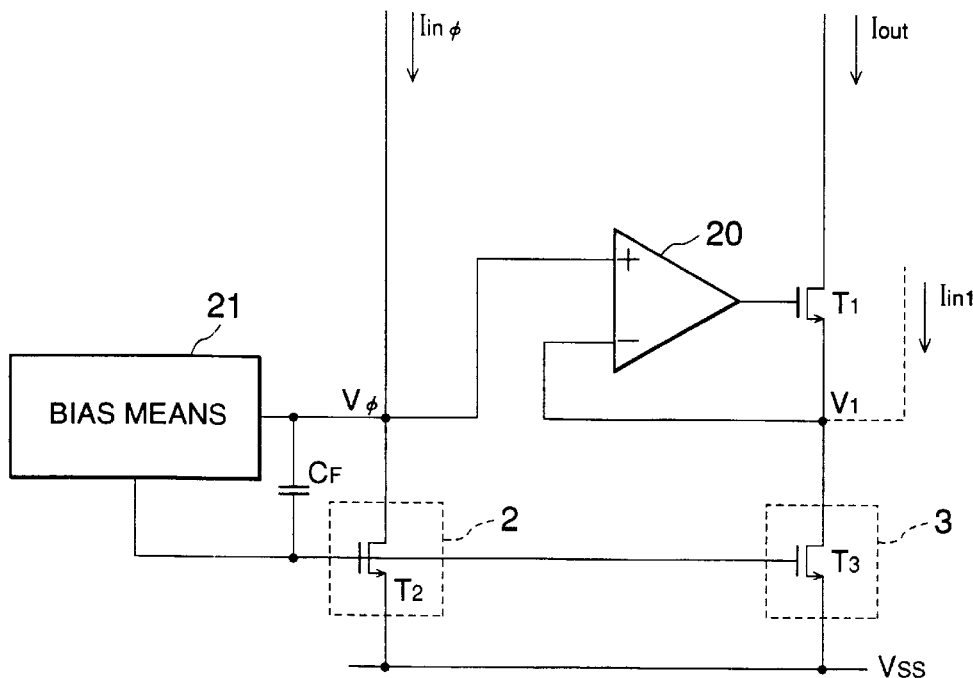
FIG. 39 is a block diagram illustrating an embodiment wherein a capacitor is connected to the bias means of FIG. 38 in parallel.

In addition, the output voltage required to operate this current mirror circuit is the sum of the voltage V1 and the drain-to-source saturation voltage VDS(sat) required to operate the transistor T1, so that it is possible to ensure a wide range of output voltage by setting the voltage applied to the current-to-voltage converting means 3 to approximately VDS(sat). In addition, if the absolute characteristics of the current-to-voltage converting means vary due to the dispersion in the process for manufacturing integrated circuits, it is possible to decrease the relative characteristic dispersion in the current-to-voltage converting means by the pattern layout or the like, so that it is possible to realize a current mirror circuit which is difficult to be under the influence of the dispersion in the manufacturing process. Alternatively, as expressed by a dotted line in FIG. 38, another input current Iin1 may be also applied to the current-to-voltage converting means 3 to output a differential current. In addition, as shown in FIG. 39, a capacitor CF is connected to the bias means 21 in parallel so as not to be under the influence of the frequency characteristic of the bias means 21.

Figure 40:
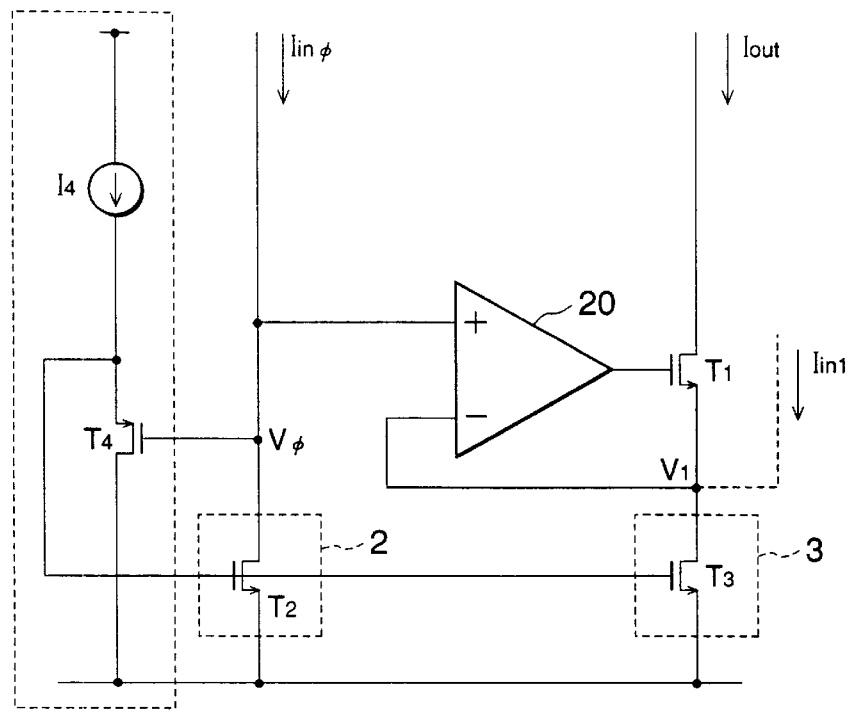
FIG. 40 is a block diagram illustrating an embodiment of bias means FIG. 38.

FIG. 40 illustrates another preferred embodiment wherein the bias means 21 in FIG. 38 comprises a source follower using a transistor T4 having a different conductivity type from the transistor T2. As described in FIG. 11, it is possible to decrease the node voltage Vφ, to which the input current is inputted.

Figure 41:
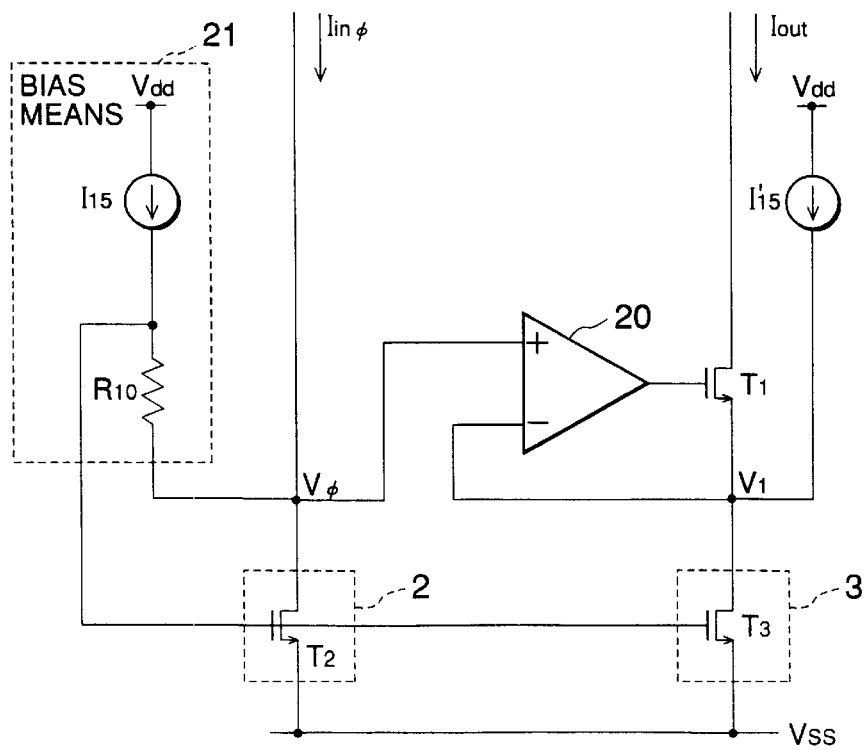
FIG. 41 is a block diagram illustrating an embodiment of the bias means of FIG. 38.
Figure 42:
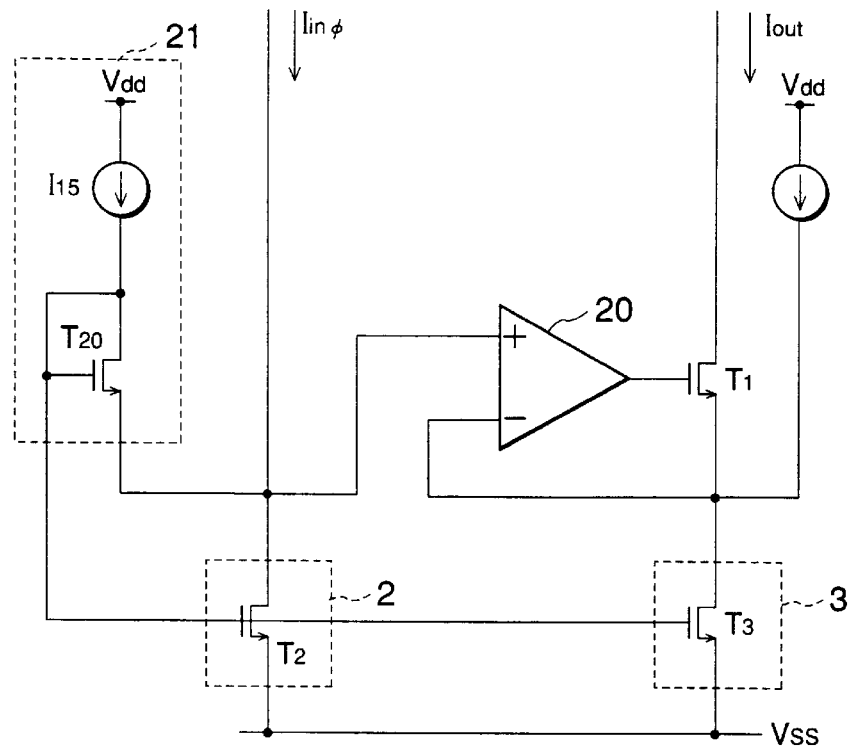
FIG. 42 is a block diagram illustrating another embodiment of the bias means of FIG. 38.
Figure 43:
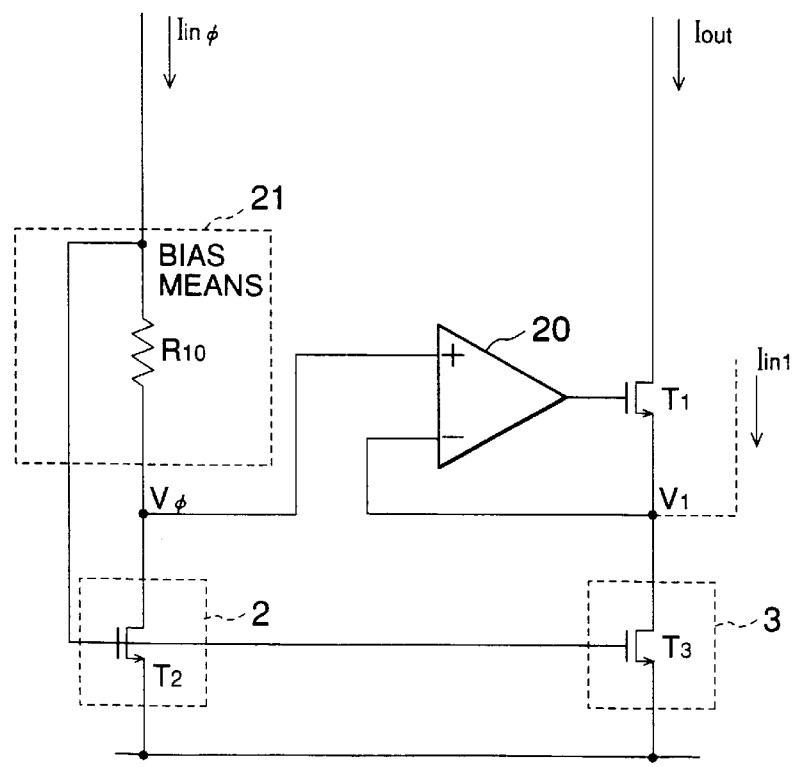
FIG. 43 is a block diagram illustrating a modification of FIG. 41.
Figure 44:
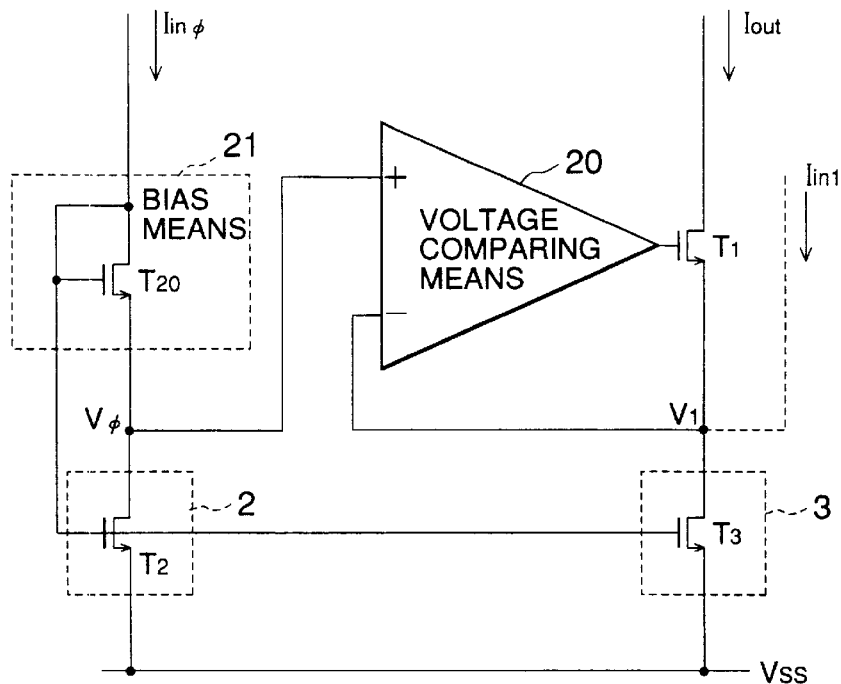
FIG. 44 is a block diagram illustrating a modification of FIG. 42.
Figure 45:
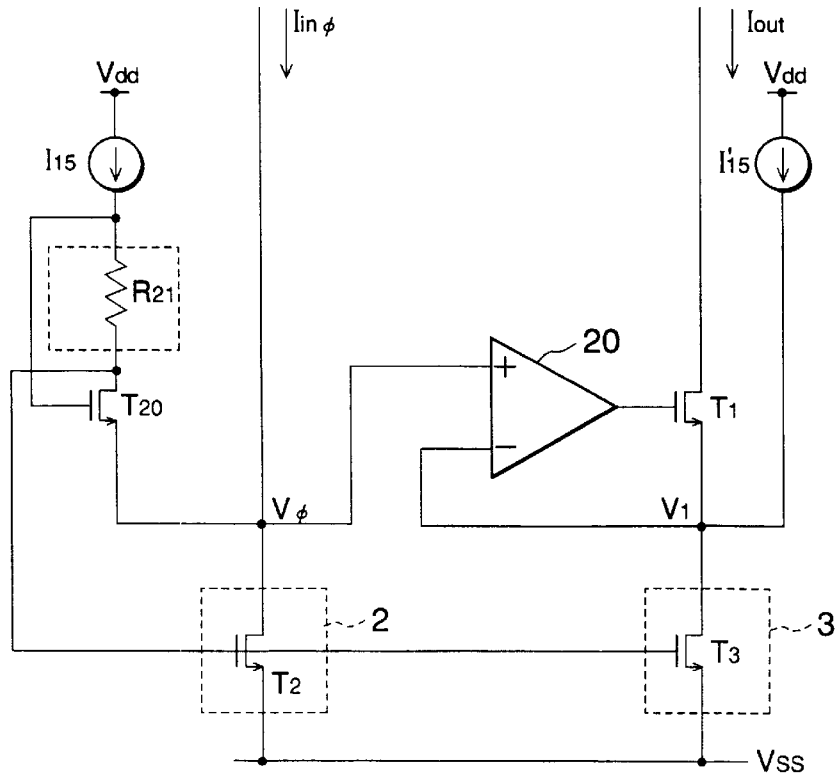
FIG. 45 is a block diagram illustrating a modification of FIG. 42.
Figure 46:
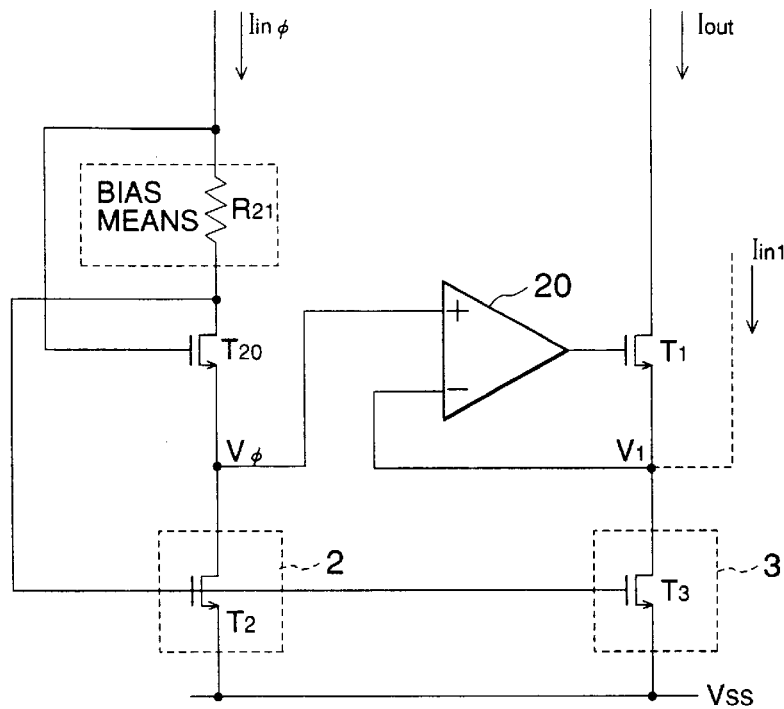
FIG. 46 is a block diagram illustrating a modification of FIG. 44.

The bias means 21 in FIG. 38 may comprise a current source I15 and a resistor R10 as shown in FIG. 41. Since the current flowing from the current source I15, together with the input current Iinφ, is inputted to the current mirror circuit (the current-to-voltage converting means 2), it is amended by adding the current from the current source I15' to the current-to-voltage converting means 3. In addition, as shown in FIG. 42, a diode-connected transistor T20 may be substituted for the transistor R10. Moreover, it is possible to decrease the scale of the circuit by substituting the input current for the current source I15 as shown in FIGS. 43 and 44. As described in FIGS. 14 and 15, it is possible to enhance the output impedance by inserting level-shift means comprising a resistor R21 and so forth between the drain and the gate of the transistor forming the bias means in FIGS. 42 and 44 so as to operate the transistors T2 and T3 in the saturated region as shown in FIGS. 45 and 46.

Figure 47:
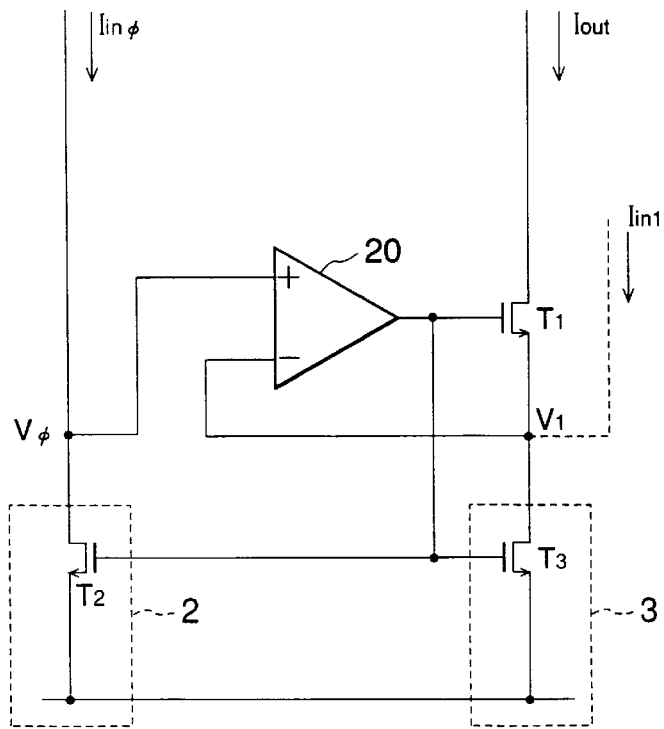
FIG. 47 is a block diagram illustrating an embodiment wherein a gate of a transistor is biased to current-to-voltage converting means using the output of voltage comparing means.
Figure 48:
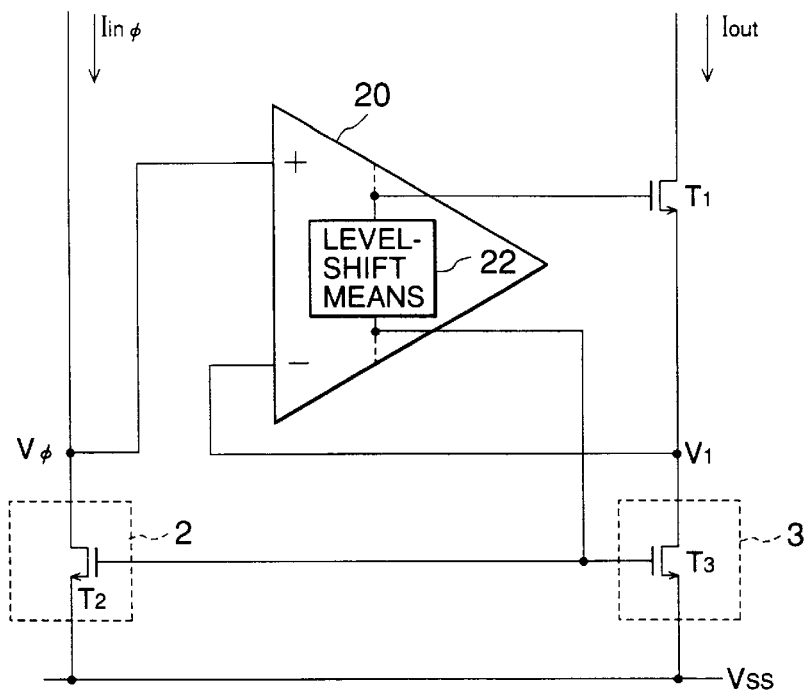
FIG. 48 is a block diagram illustrating an embodiment wherein a gate of a transistor is biased to current-to-voltage converting means using the output of voltage comparing means.
Figure 49:
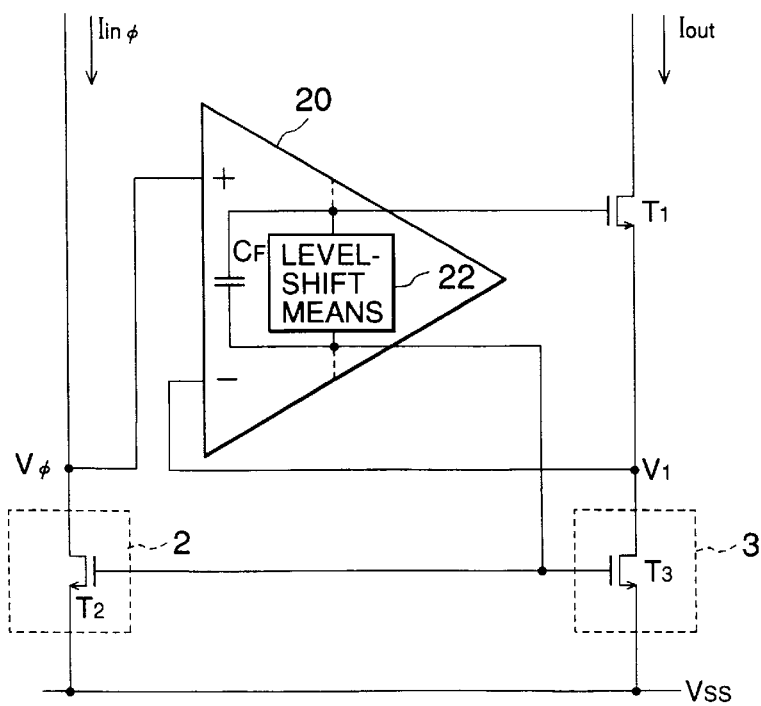
FIG. 49 is a block diagram illustrating an embodiment wherein a capacitor is connected to the level-shift means of FIG. 48 in parallel.

As shown in FIG. 47, the bias means 21 may be omitted by biasing the gates of the transistors T2 and T3 by the output voltage of the voltage comparing means 20. In addition, as shown in FIG. 48, it is possible to operate the transistors T2 and T3 at the saturated region to enhance the output impedance by biasing the gates of the transistors T2 and T3 by the voltage which is obtained by level-shifting the output of the voltage comparing means 20 by the level-shift means 22. It is possible to improve the influence of the frequency characteristic upon the level-shift means 22 by connecting a capacitor CF to the level-shift means 22 in parallel as shown in FIG. 49.

Figure 50:
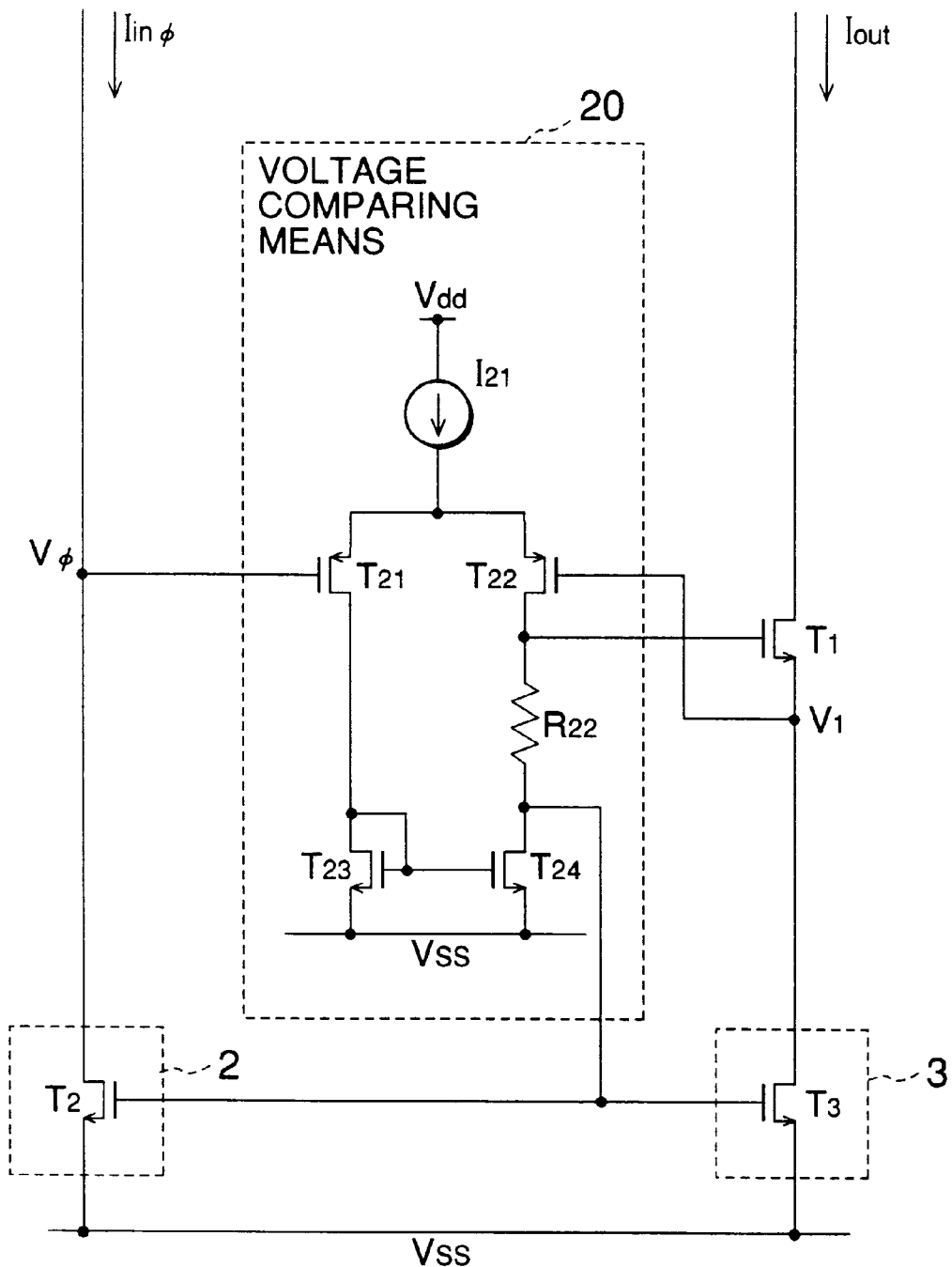
FIG. 50 is a block diagram illustrating an embodied construction of FIG. 48.
Figure 51:
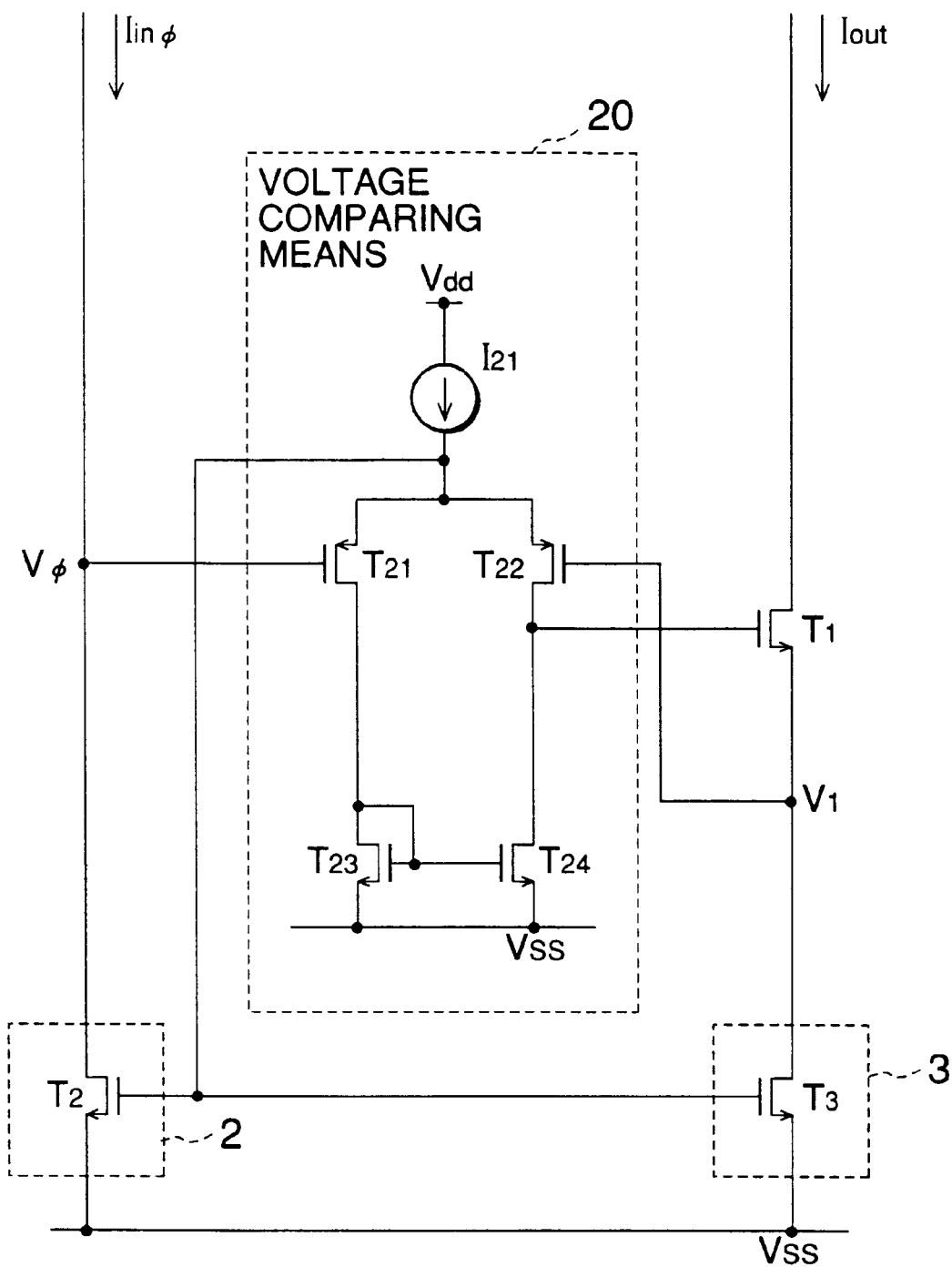
FIG. 51 is a block diagram illustrating an embodiment wherein a gate of a transistor is biased to current-to-volt e converting means using an internal voltage of age comparing means.

As shown in FIG. 50, the level-shift means 22 is able to be easily realized using a resistor R22. In addition, as shown in FIG. 51, the bias means 21 may be omitted by biasing the gates of the transistors T2 and T3 with a common source voltage of differential pair based on the transistors T21 and T22 which forms an input section of the voltage comparing means 20.

Figure 52:
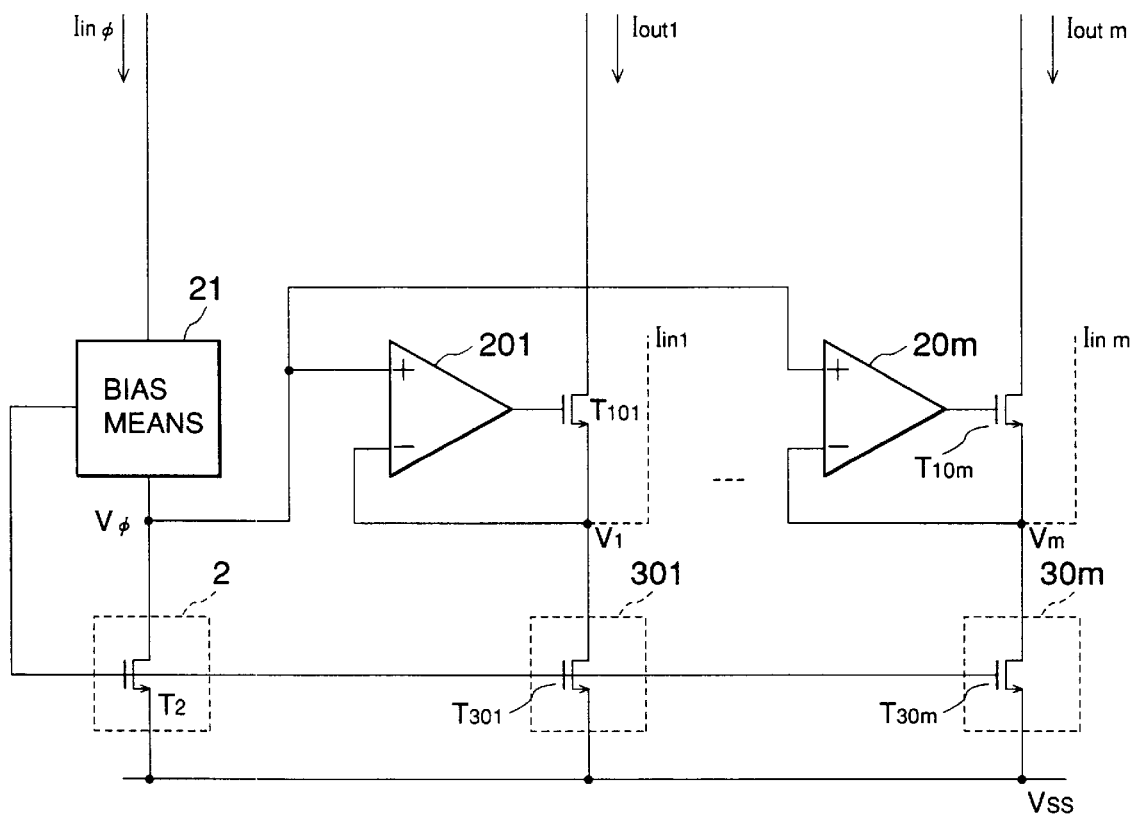
FIG. 52 is a block diagram illustrating a circuit having a plurality of outputs.

FIG. 52 illustrates an example designed to be adapted to a plurality of outputs. In FIG. 52, the current-to-voltage converting means 2 of the current mirror circuit described in FIG. 38 are commonly used to comprise m voltage comparing means 201 . . . (200+m) corresponding to the number m of outputs, m transistors T101 . . . (100+m), each outputting an output current, and m current-to-voltage converting means 301 . . . (300+m) for current-to-voltage converting the output currents. Each of the current-to-voltage converting means comprises a transistor, the gate voltage of which is supplied by the voltage produced in the bias means 21 using, as a reference, the voltage V$\phi$ current-to-voltage converted by the current-to-voltage converting means 2.

The operation of this embodiment will be briefly described below. The voltage comparing means i (201≦i ≦m) compares voltages V$\phi$ and Vi current-to-voltage converted by the current-to-voltage converting means 2 and the current-to-voltage converting means (300+i) to control the gate voltage of the transistor T(100+i) so that V$\phi$=V1. In order to facilitate the explanation, it is assumed, for example, that all the output current Iout1 . . . Ioutm are equally outputted to the input current Iin$\phi$. It is also assumed that the characteristics of the current-to-voltage converting means 2, 301 . . . (301+m) and the values W/L of the transistors T101 . . . (100+m) are the same.

The input current Iin$\phi$ flows into the current-to-voltage converting means 2 to produce a voltage V$\phi$. If the output current Iouti=Iin$\phi$, V$\phi$=Vi. If the output current Iouti is shifted from the input current Iin$\phi$ due to the variation of the drain voltage of the transistor T(100+i) serving as the output voltage and the variation of the input current Iin$\phi$, it is converted into voltage by the current-to-voltage converting means (300+i), so that Vi≠V$\phi$. As a result, the voltage comparing means i controls the gate voltage of the transistor T(100+i) so that V$\phi$=Vi, so as to cause the output current Iouti flowing through the current-to-voltage converting means (300+i) to approach the input current Iin$\phi$. In this way, the transistor T(100+i) is controlled by the voltage comparing means i to operate the respective outputs as current mirror circuits following the input current Iin$\phi$, so that it is possible to enhance the output impedance. In addition, another input current Iini may be applied to the current-to-voltage converting means (300+i) to output a differential current Iin$\phi$−Iini.

Figure 53:
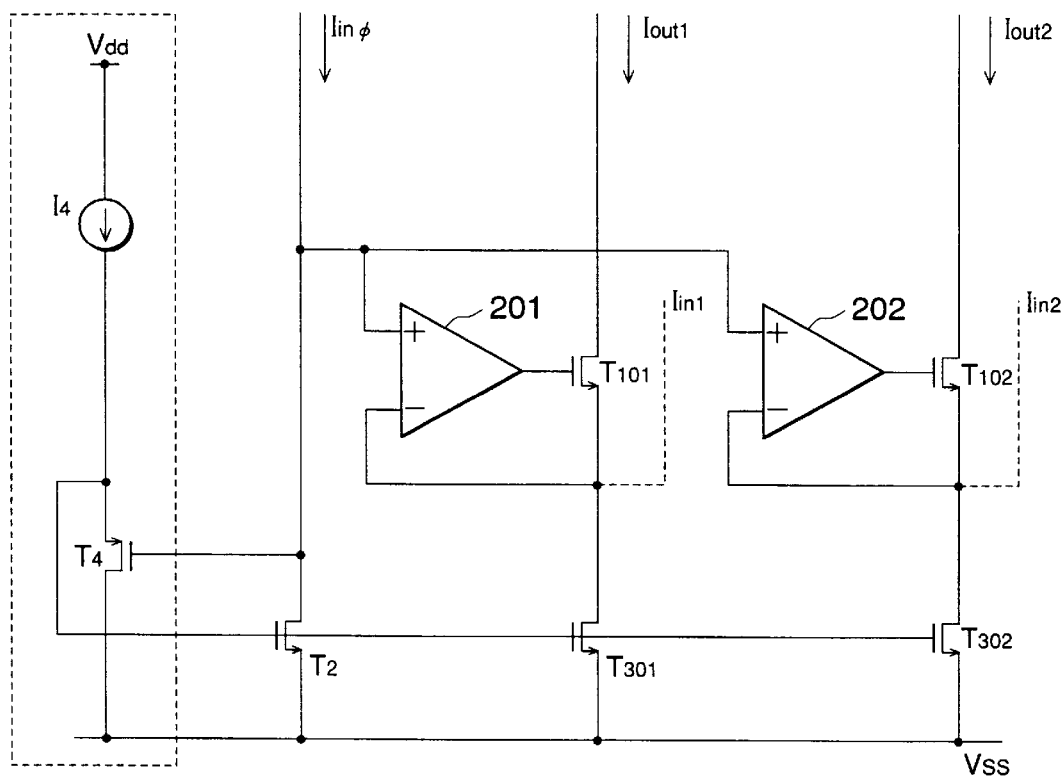
FIG. 53 is a block diagram illustrating an embodiment of the bias means of FIG. 52.

FIG. 53 illustrates another preferred embodiment wherein the bias means 21 in FIG. 52 comprises a source follower based on a transistor T4 having a difference conductivity type from the transistor T2, and as described in FIG. 11, it is possible to decrease the node voltage V$\phi$, to which the input current is inputted.

Figure 54:
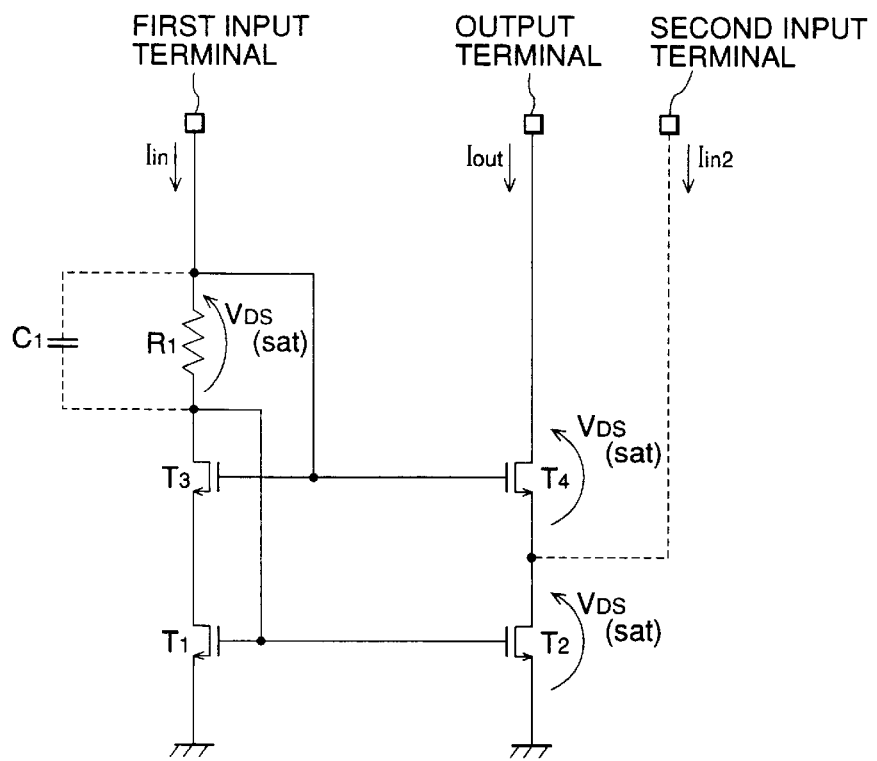
FIG. 54 is a block diagram illustrating the second preferred embodiment of a current mirror circuit according to the present invention.

Referring to the accompanying drawings, the second preferred embodiment of the present invention will be described below. FIG. 54 illustrates the preferred embodiment of a current mirror circuit according to the present invention.

The current mirror circuit shown in FIG. 54 comprises a first input terminal for inputting an input current Iin, a first output terminal for outputting a first output current Iout, transistors T1 and T2, the gates of which are connected to each other as a common gate, a transistor T3, the source of which is connected to the drain of the transistor T1 and the drain of which is connected to the common gate of the transistors T1 and T2, a transistor T4, the source of which is connected to the drain of the transistor T2 and the gate of which is connected to the gate of the transistor T3 as a common gate, and a resistor R1 connected between the common gate of the transistors T3 and T4 and the drain of the transistor T3.

In order to facilitate the explanation, it is assumed that the sizes of the transistors T1 through T4 are the same. The drain voltage of the transistor T3 is determined by the gate voltage of the transistors T1 and T2, and this is approximately a threshold voltage VT. The gate voltage of the transistor T3 and T4 is the sum of the gate voltage of the transistor T1 and T2 and the voltage applied to the resistor R1. Therefore, the source voltage of the transistor R3, i.e. the drain voltage of the transistor T1, is a voltage derived by subtracting the gate-to-source voltage of the transistor T3 from the gate voltage of the transistor T3. Since the gate-to-source voltage of the transistor T3 is also approximately the threshold voltage VT, the drain voltage of the transistor T1 is substantially equal to the voltage applied to the resistor R1. Similarly, the source voltage of the transistor T4, i.e. the drain voltage of the transistor T2, is a voltage derived by subtracting the gate-to-source voltage of the transistor T4 from the gate voltage of the transistor T4. Since the gate-to-source voltage of the transistor T4 is also approximately the threshold voltage VT, the drain voltage of the transistor T2 is substantially equal to the voltage applied to the resistor R1. Therefore, the voltage applied to the resistor R1 is designed to be the drain-to-source saturation voltage VDS (sat) of the transistor T1 and T2, it is possible to operate both the transistors T2 and T4 at the saturated region. That is, it is possible to decrease the drain voltage of the transistor T4, which is the voltage of the output terminal being capable of enhancing the output impedance, to be approximately the sum of 2VDS(sat) and the saturation voltage of each of the transistors. Thus, according to this method, since no amplifier circuit is used unlike the conventional methods, it is possible to realize a current mirror circuit which has a small scale and which is difficult to be under the influence of the dispersion in the manufacturing process.

Figure 55:
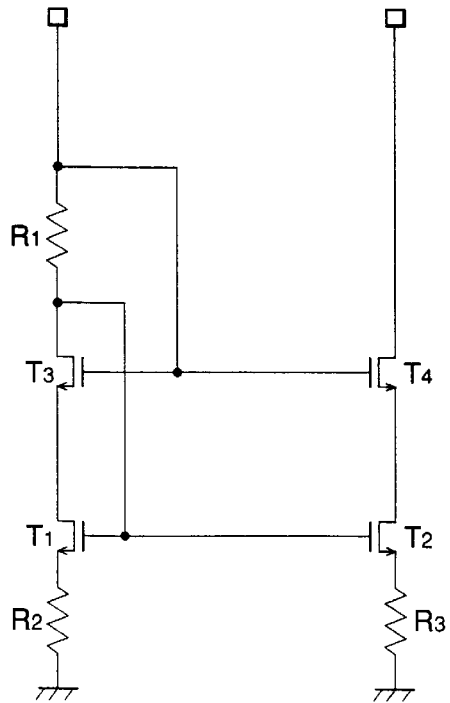
FIG. 55 is a block diagram illustrating a modified circuit of FIG. 54 wherein the output impedance is increased by adding a resistor.
Figure 56:
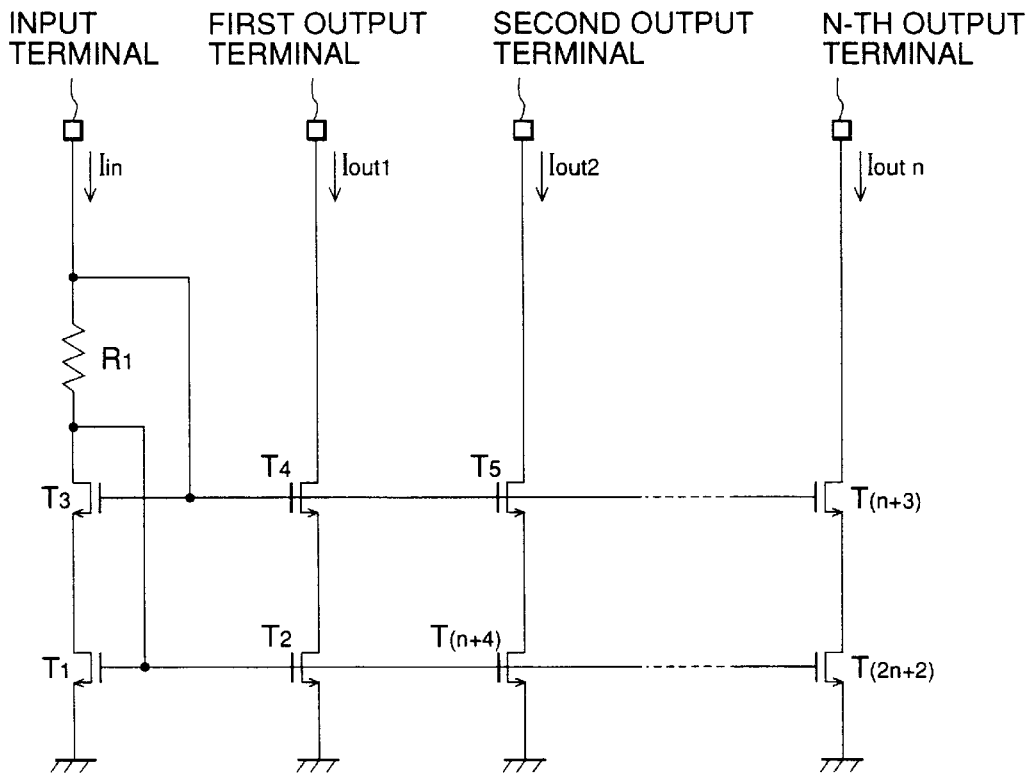
FIG. 56 is a block diagram illustrating a modification of the current mirror circuit of FIG. 54, which has a plurality of outputs.

This circuit has a low-pass characteristic by the resistor R1 and the gate capacity of the transistors T1 and T2, so that it is possible to reduce the resulting deterioration of the frequency characteristic of the current mirror circuit by connecting a capacitor C1 to the resistor R1 in parallel as expressed by a dotted line in FIG. 54. In addition, it is possible to reduce the deterioration of the frequency characteristic due to the resistor R1 while maintaining the drain voltage of the transistors T1 and T2 at an approximately VDS(sat) by decreasing the resistance of the resistor R1 and by using a lower threshold value of the transistors T3 and T4 than the threshold value of the transistors T1 and T2. In addition, the source of the transistor T4 may be used as a second input terminal to input Iin2 so as to output the output current in the form of a difference between Iout=Iin−Iin2 and the input current. Moreover, as shown in FIG. 55, the sources of the transistors T1 and T2 may be connected to the ground via resistors R2 and R3, respectively, to enhance the output impedance. As shown in FIG. 56, it is possible to provide a plurality of outputs by providing a plurality of transistors T2 and T4 connected to the cascode of the output section of the current mirror circuit shown in FIG. 54.

Figure 57:
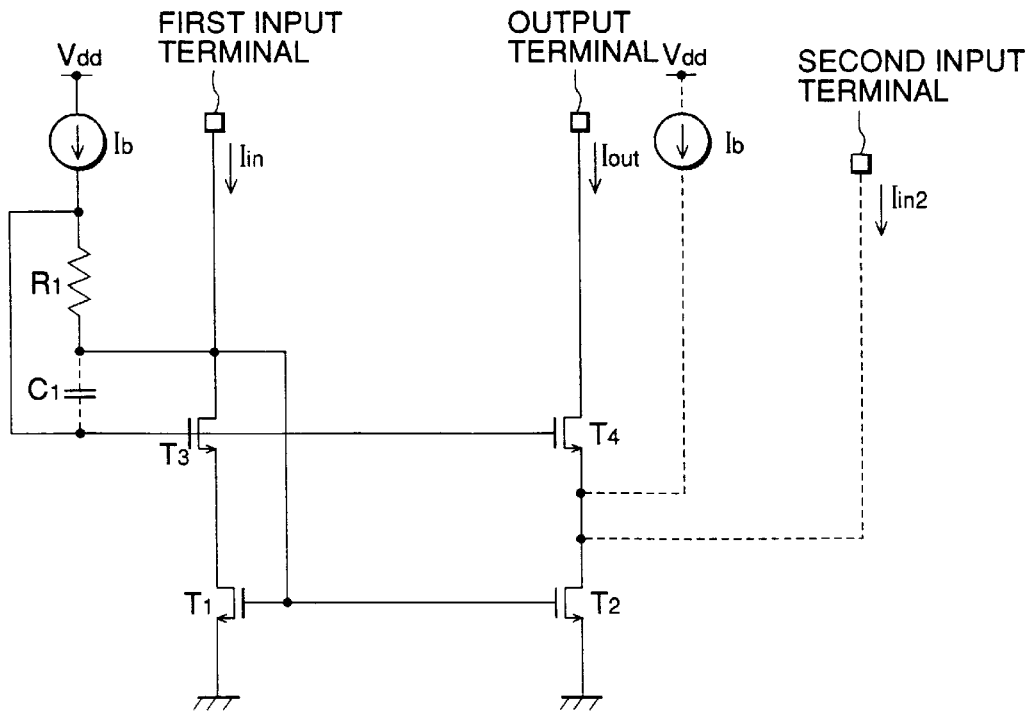
FIG. 57 is a block diagram illustrating a modified circuit of FIG. 54, wherein the connection of a first input terminal is changed.
Figure 58:
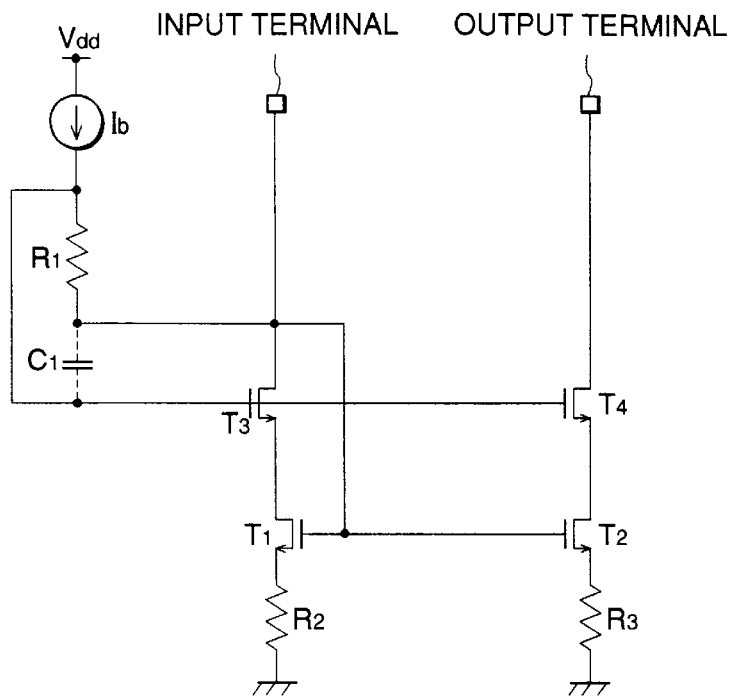
FIG. 58 is a block diagram illustrating a modified circuit of FIG. 57 wherein the output impedance is increased by adding a resistor.
Figure 59:
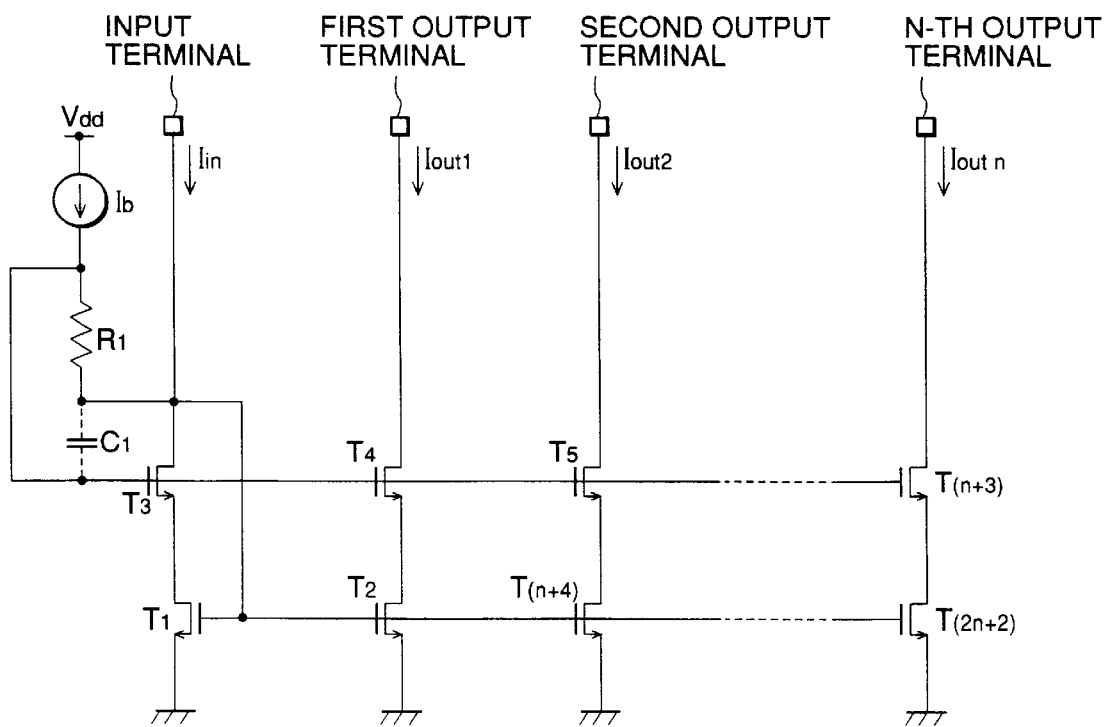
FIG. 59 is a block diagram illustrating a modification of the current mirror circuit of FIG. 57, which has a plurality of outputs.

As shown in FIG. 57, the voltage applied to the resistor R1 by changing the connection of the first input terminal from the circuit of FIG. 54 is able to be determined by the bias current Ib so as not to depend upon the input current Iin. In this case, the current Iin+Ib flows through the transistor T1, and the bias current Ib is injected into the drain of the transistor T2 in order to prevent an offset of Ib from occurring in the output current Iout, so that it is possible to cancel this offset. As described in FIG. 54, it is possible to reduce the deterioration of the frequency characteristic by connecting a capacitor C1 to the resistor R1 in parallel, and it is possible to output the output current in the form of a difference between Iout=Iin−Iin2 and the input current by using the source of the transistor T4 as a second input terminal to input Iin2. In addition, similar to the embodiment of FIG. 54, it is possible to further enhance the output impedance by connecting the transistors T1 and T2 via the resistors R2 and R3 to the ground as shown in FIG. 58, and it is possible to provide a plurality of outputs by providing a plurality of transistors T2 and T4 in the output section of the current mirror circuit as shown in FIG. 59.

Figure 60:
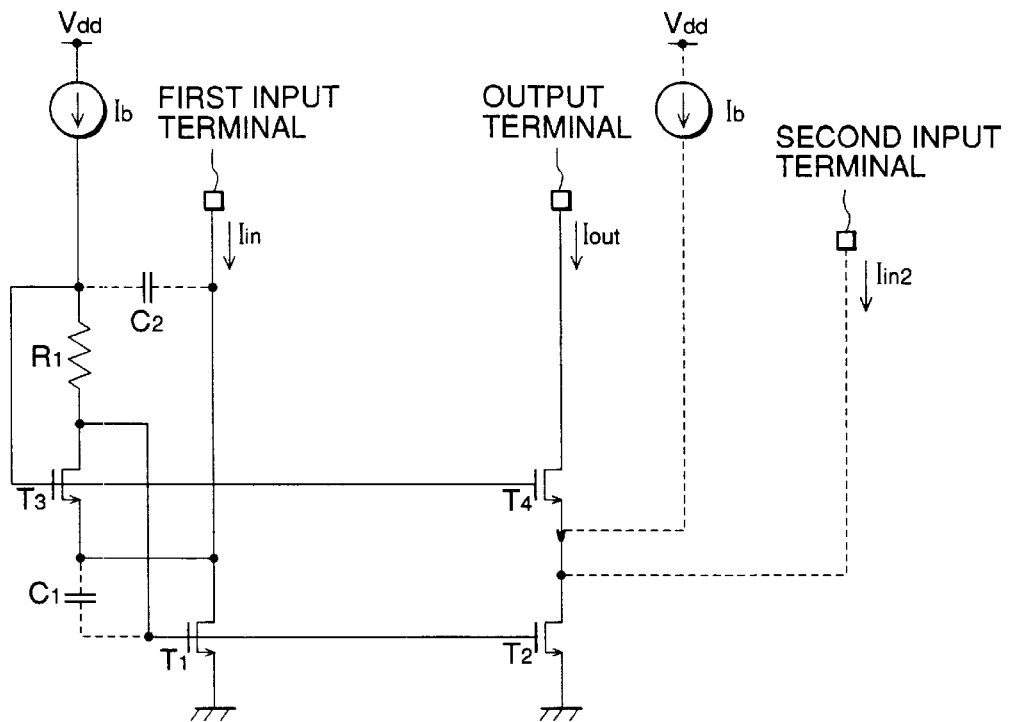
FIG. 60 is a block diagram illustrating a modified circuit of FIG. 54, wherein the connection of a first input terminal is changed.
Figure 61:
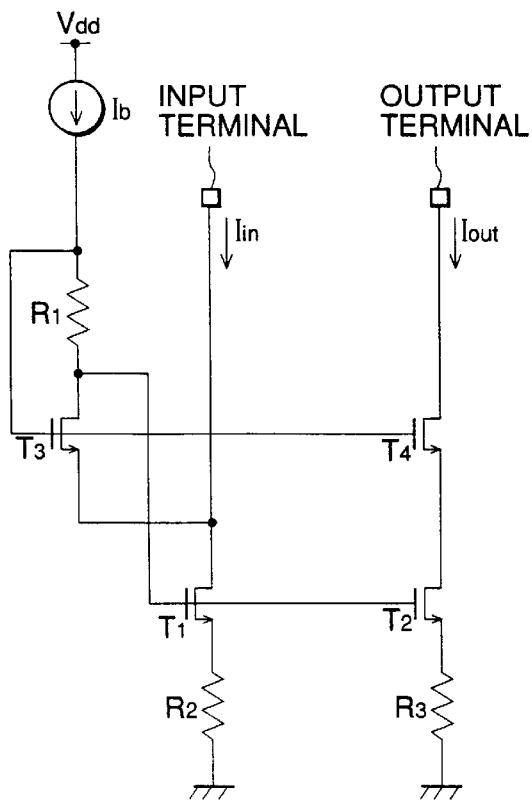
FIG. 61 is a block diagram illustrating a modified circuit of FIG. 57 wherein the output impedance is increased by adding a resistor.
Figure 62:
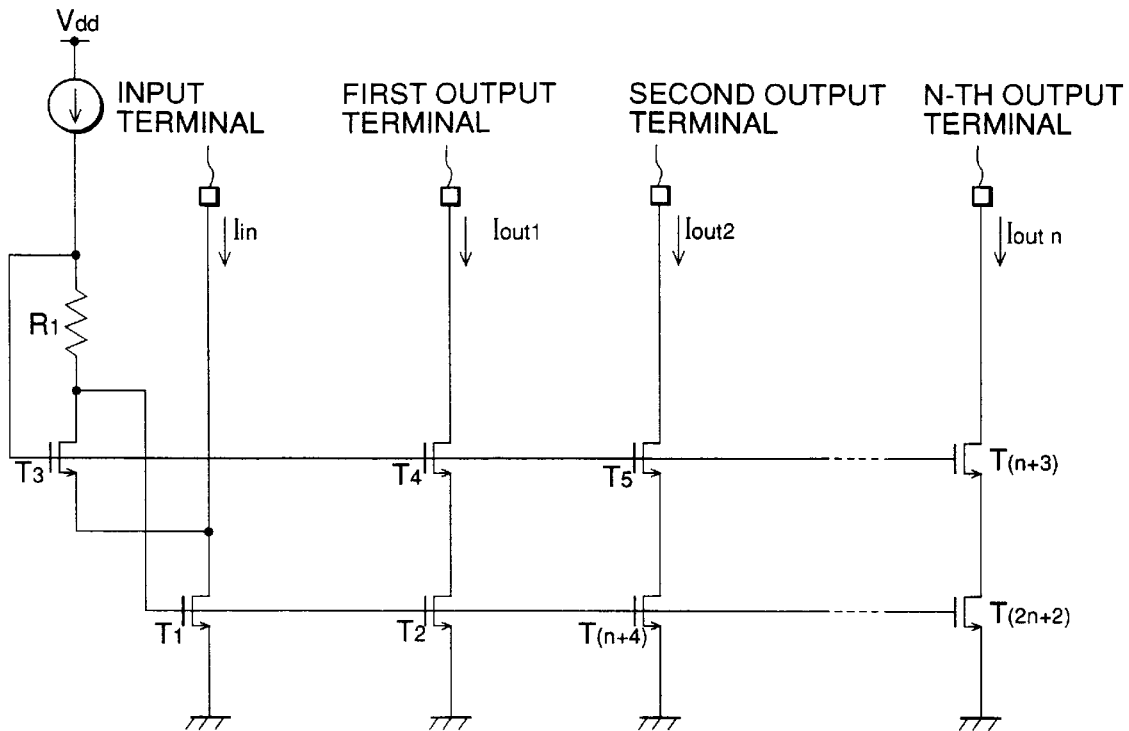
FIG. 62 is a block diagram illustrating a modification of the current mirror circuit of FIG. 60, which has a plurality of outputs.

As shown in FIG. 60, the voltage applied to the resistor R1 may be determined by the bias current Ib by changing the connection of the first input terminal from the circuit of FIG. 54, so as not only to be independent from the input current Iin, but also to decrease the voltage produced at the first input terminal, which is greater than VT in the embodiments of FIGS. 54 and 57, to be approximately the saturation voltage VDS(sat) of the transistor T1. In this case, similar to the embodiment of FIG. 57, the current Iin+Ib flows the transistor T1 to produce an offset of Ib in the output current Iout. Similar to the embodiment of FIG. 57, in order to prevent this, it is possible to cancel this offset by injecting the bias current Ib into the drain of the transistor T2. In addition, since the AC component of the input current drops due to the transistor T3, the resistor R1 and the gate capacity of the transistor, a capacitor C1 is connected between the drain and the gate of the transistor T1 and a capacitor C2 is connected between the gate and the source of the transistor T3, so that it is possible to reduce the deterioration of the frequency characteristic. Similar to the embodiments of FIGS. 54 and 57, it is possible to output the output current in the form of the difference between Iout=Iin−Iin2 and the input current by using the source of the transistor T4 as a second input terminal to input Iin2. In addition, similar to the embodiments of FIGS. 54 and 57, it is possible to further enhance the output impedance by connecting the sources of the transistors T1 and T2 via the resistors R2 and R3 to the ground as shown in FIG. 61, and it is possible to provide a plurality of outputs by providing a plurality of transistors R2 and R4 in the output section of the current mirror circuit as shown in FIG. 62.

Figure 63:
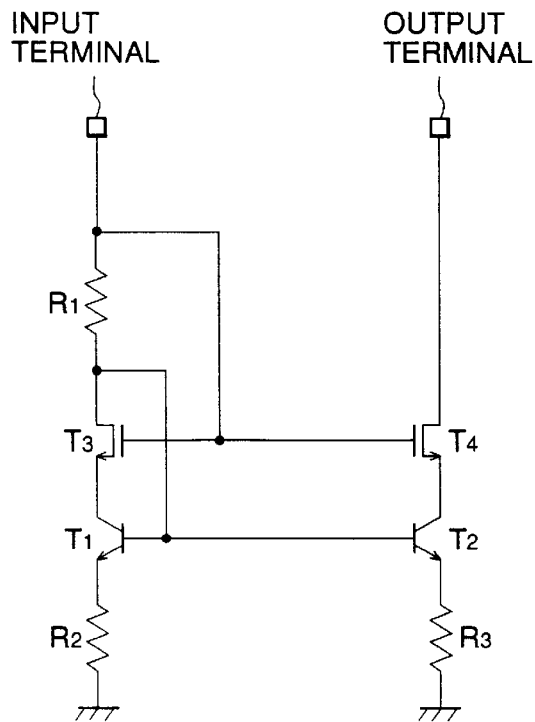
FIG. 63 is a block diagram illustrating a modified circuit wherein transistors T1 and T2 comprise bipolar transistors in the current mirror circuit of FIG. 55.

While the preferred embodiments of the present invention have been described using field-effect transistors above, it is possible to obtain the same advantageous effects if bipolar transistors are substituted for the field-effect transistors. In addition, if both of field-effect transistors and bipolar transistors are used, for example, in the case of the embodiment of FIG. 55, if bipolar transistors are used for the transistors T1 and T2 as shown in FIG. 63, it is possible to obtain the same advantageous effects.

Figure 64:
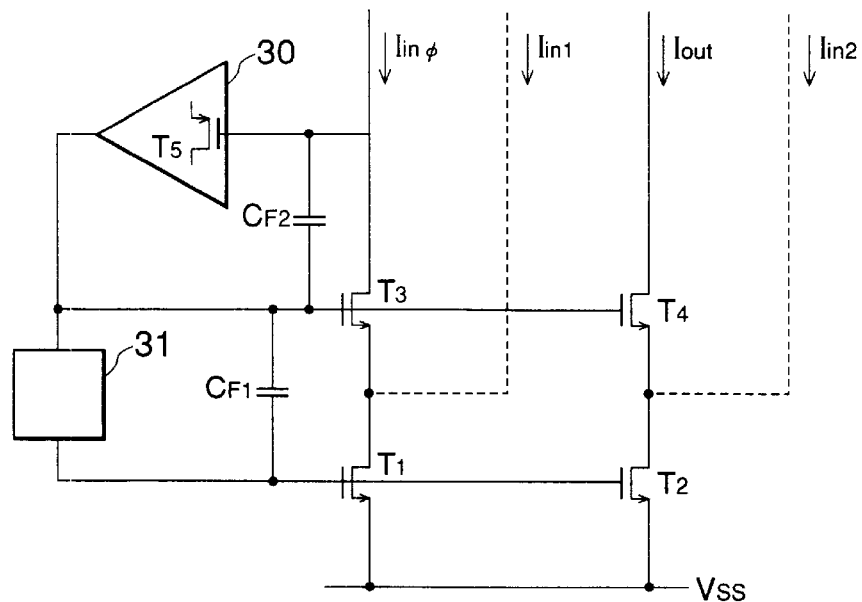
FIG. 64 is a block diagram illustrating the third preferred embodiment of a current mirror circuit according to the present invention.

Referring to the accompanying drawings, the third preferred embodiment of the present invention will be described below. FIG. 64 illustrates the preferred embodiment of a current mirror circuit according to the present invention.

The current mirror circuit shown in FIG. 64 comprises transistors T3 and T1 for allowing a flow of input current Iinφ, a transistor T2, the gate of which is connected to the gate of the transistor T1 as a common gate, a transistor T3, the source of which is connected to the drain of the transistor T1, a transistor T4, the source of which is connected to the drain of the transistor T2 and the gate of which is connected to the gate of the transistor T3 as a common gate, for outputting an output current from the drain, a buffer amplifier 30 for amplifying the drain voltage of the transistor T3, and a level-shift circuit 31 for level-shifting the output of the buffer amplifier 30. The common gate of the transistors T3 and T4 is connected to the output of the buffer amplifier, and the output of the level-shift circuit 31 is connected to the common gate of the transistors T1 and T2. The input section of the buffer amplifier 30 comprises a transistor T5 having a different conductivity type from the transistor T1, and the input of the buffer amplifier 30 is connected to the gate of the transistor T5.

The gate voltage of the transistor T3 is a high voltage which is level-shifted from the gate voltage of the transistor T1 by a predetermined voltage by means of the level-shift circuit 31. In addition, the drain voltage of the transistor T3 is applied to the gate of the transistor T3 via the buffer amplifier 30, so that the gate voltage of the transistor T1 is determined so that the current flowing through the transistor T1 is determined by the input current Iinφ. That is, when smaller currents than the input current Iinφ flow through the transistors T1 and T3, the drain voltage of the transistor T3 is increased to increase the gate voltages of the transistors T3 and T1 via the buffer amplifier 30, so that the currents equal to the input current Iinφ flow through the transistors T1 and T3. In addition, when greater currents than the input current Iinφ flow through the transistors T1 and T3, the drain voltage of the transistor T3 is decreased to decrease the gate voltages of the transistors T3 and T1 via the buffer amplifier 30, so that the currents equal to the input current Iinφ flow through the transistors T1 and T3.

For example, when the sizes of the transistors T3 and T4 are the same and the sizes of the transistors T1 and T2, since the gate voltages of the transistors T3 and T4 are the same and the gate voltages of the transistors T1 and T2 are the same, the gate and drain voltages of the transistor T2 are equal to the gate and drain voltages of the transistor T1, respectively, so that the transistor T2 operates as a current mirror which allows a flow of current which is substantially equal to the current flowing through the transistor t1.

In this case, when the sizes of the transistors T3 and T4 (channel width/channel length) is greater than the sizes of the transistors T1 and T2 (channel width/channel length), the drain voltages of the transistors T1 and T2 are greater than the level-shift voltage VLS of the level-shift circuit. In this case, if the level-shift voltage VLS of the level-shift circuit is set to approximately the drain-to-source saturation voltages VDS(sat) of the transistors T1 and T2, the drain voltages of the transistors T1 and T2 are approximately VDS(sat), so that it is possible to operate in the saturated region. Therefore, even if the drain voltage of the transistor T4 allowing the flow of output current is substantially twice as large as the VDS(sat), since the drain-to-source voltage of the transistor T4 is substantially equal to the VDS(sat) so as to operate in the saturated region, it is possible to maintain the enhanced output impedance even if the output voltage is low.

The drain voltage of the transistor T3 is a voltage which is shifted from the gate voltage of the transistor T3 by the DC offset voltage Voffset of the buffer amplifier. That is, the drain voltage of the transistor T3 is a voltage which is derived by subtracting the DC offset voltage Voffset of the buffer amplifier from the sum of the gate voltage VGS1 of the transistor T1 and the level-shift voltage VLS of the level-shift circuit. Therefore, if the DC offset Voffset of the buffer amplifier is selected to be approximately VGS1−VDS(sat), the drain voltage of the transistor T3, which is the input voltage of the current mirror circuit, can be decreased to be approximately twice as large as of the VDS(sat) at which both the transistors T1 and T3 can operate in the saturation range.

Furthermore, as expressed by dotted lines in FIG. 64, the input current Iin1 may be inputted to the drain of the transistor T1, or the input current Iin2 may be inputted to the drain of the transistor T2.

Figure 65:
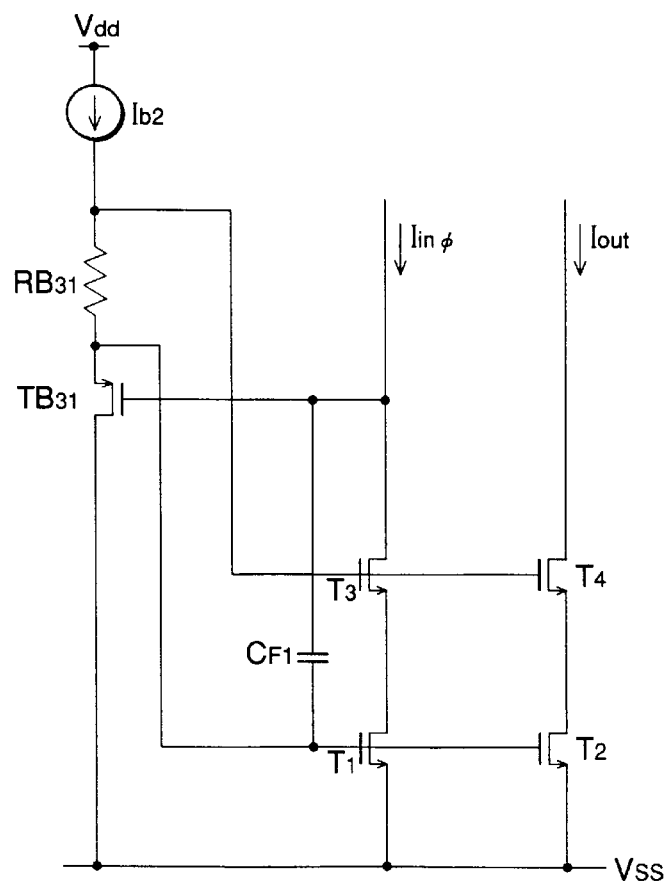
FIG. 65 is a block diagram illustrating an embodiment wherein the buffer amplifier of FIG. 64 comprises a source follower.
Figure 66:
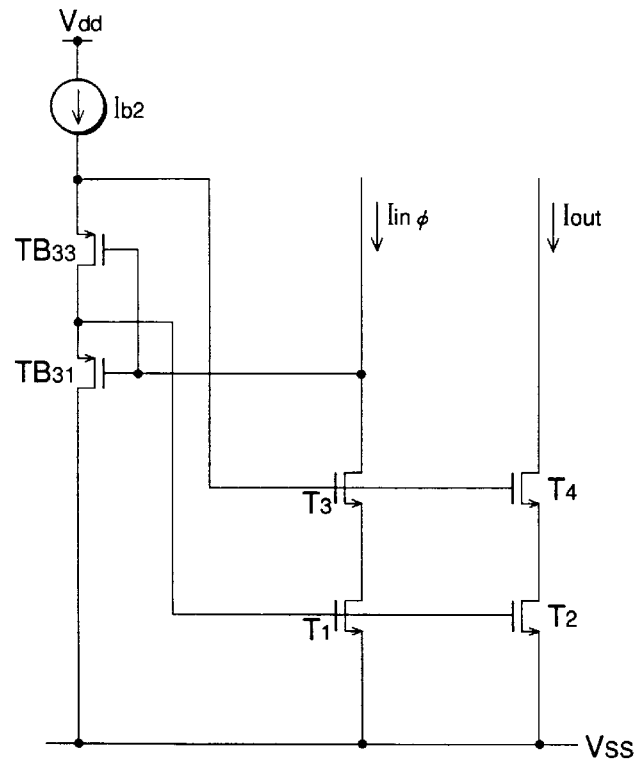
FIG. 66 is a block diagram illustrating a modification wherein the resistor forming the level-shift circuit in FIG. 65 comprises a transistor.

FIG. 65 illustrates an embodiment wherein the buffer amplifier 30 in FIG. 64 comprises a source follower based on a PMOS transistor TB31, and the level-shift circuit 31 in FIG. 64 comprises a resistor RB31. If the level-shift voltage determined by the resistor RB31 and the bias current Ib2 is selected to be approximately VDS(sat), and if the absolute value of the gate-to-source voltage of the transistor TB31 is selected to be a low VDS(sat) which is approximately twice as large as the gate-to-source voltage of the transistor T1, it is possible to maintain the enhanced output impedance of the current mirror circuit even if the drain voltage of the transistor T4 is approximately a double VDS(sat) and it is possible to decrease the drain voltage of the transistor T3, which is the input voltage of the current mirror circuit, as described in FIG. 64. Furthermore, the gate of the resistor RB31 may be realized using a transistor TB33 connected to the transistor TB31.

Figure 67:
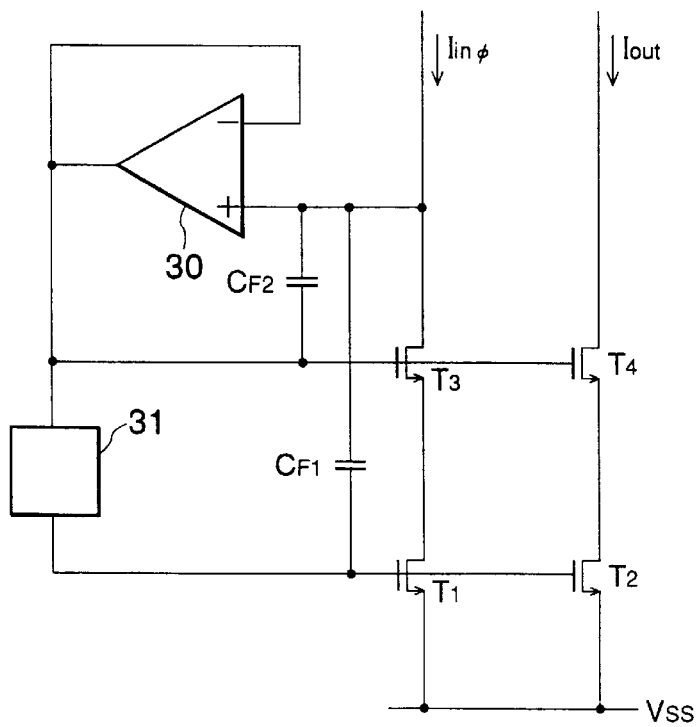
FIG. 67 is a block diagram illustrating an embodiment wherein he buffer amplifier of FIG. 64 comprises a differential amplifier circuit.
Figure 68:
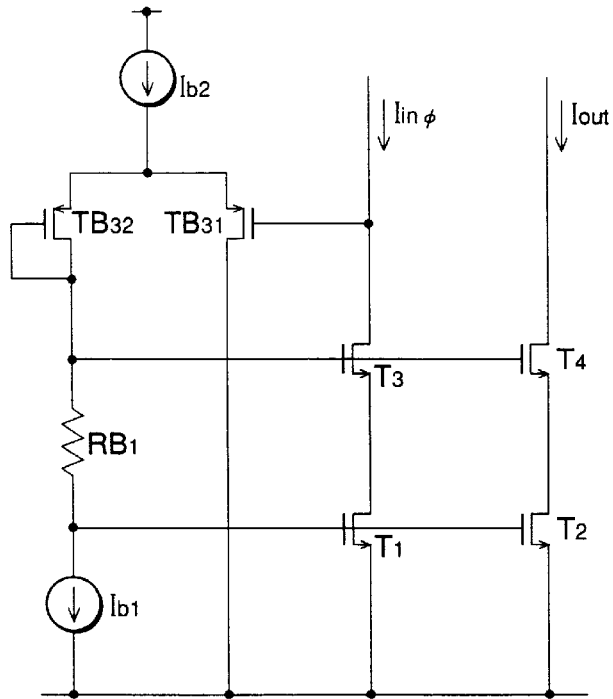
FIG. 68 is a block diagram illustrating an embodied circuit of FIG. 67.
Figure 69:
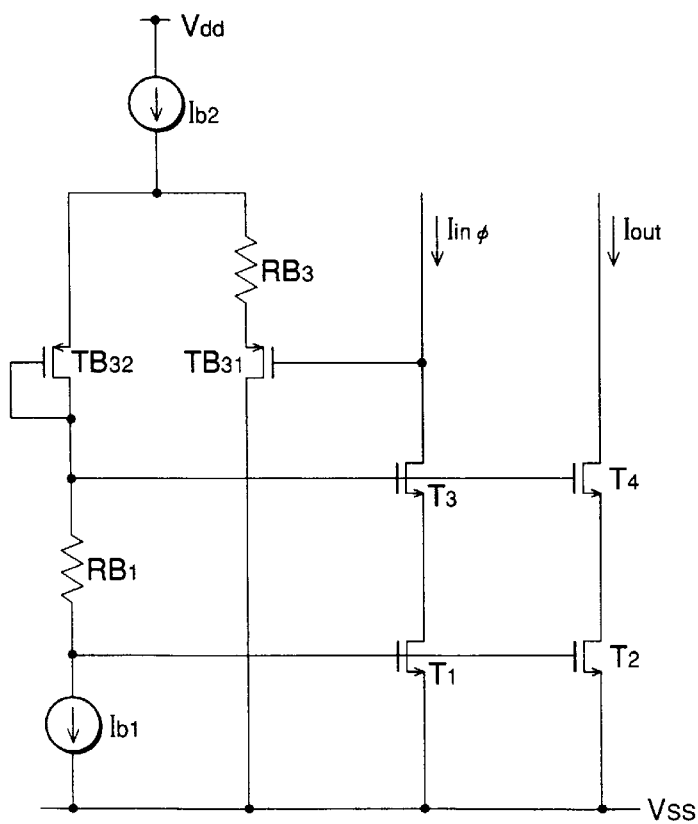
FIG. 69 is a block diagram illustrating an embodiment wherein the differential amplifier circuit of FIG. 68 has an offset.

The buffer amplifier 30 in FIG. 64 is able to be realized by a differential amplifier circuit in the form of a voltage follower as shown in FIG. 67. In order to reduce the influence of the frequency characteristics of the differential amplifier circuit and the level-shift circuit, capacitors CF1 and CF2 may be suitably added as shown in FIG. 65. As shown in FIG. 68, the differential amplifier circuit in FIG. 67 can be realized by transistors TB31, TB32 and current sources Ib1, Ib2, and the level-shift circuit in FIG. 67 can be realized by a resistor RB1. In this case, if the sizes of the transistors TB32 and TB31 are selected so that the absolute value of the gate-to-source voltage of the transistor TB31 is greater than the absolute value of the gate-to-source voltage of the transistor TB32, or if the current of the current source Ib1 is set to be less than the half of the current of the current source Ib2, the DC offset voltage Voffset of the buffer amplifier can be realized. Moreover, as shown in FIG. 69, the DC offset voltage Voffset of the buffer amplifier may be realized by connecting a resistor RB3 to the source of the transistor TB31 in series.

Figure 70:
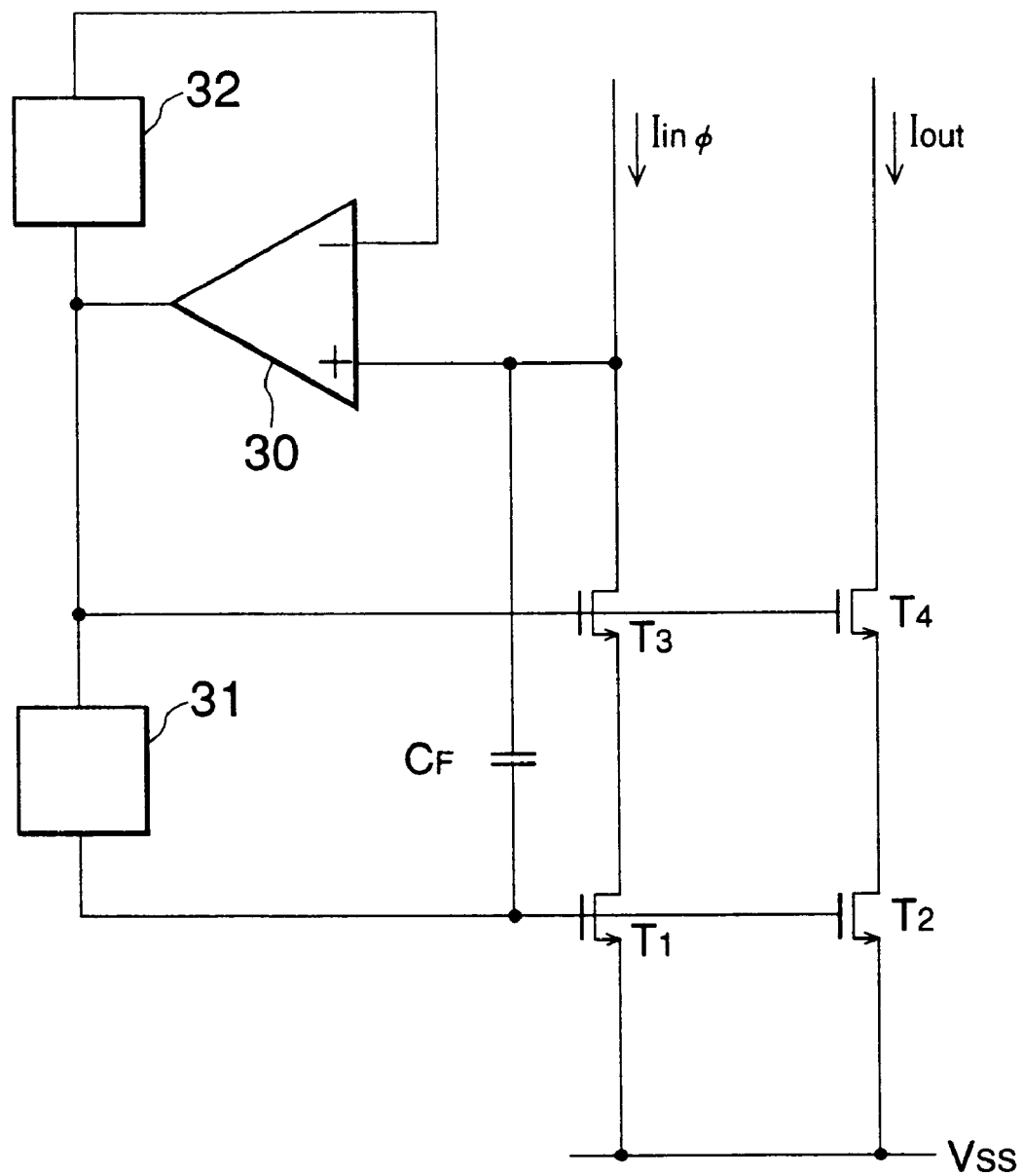
FIG. 70 is a block diagram illustrating an embodiment wherein a feedback line has a second level-shift circuit in FIG. 67.
Figure 71:
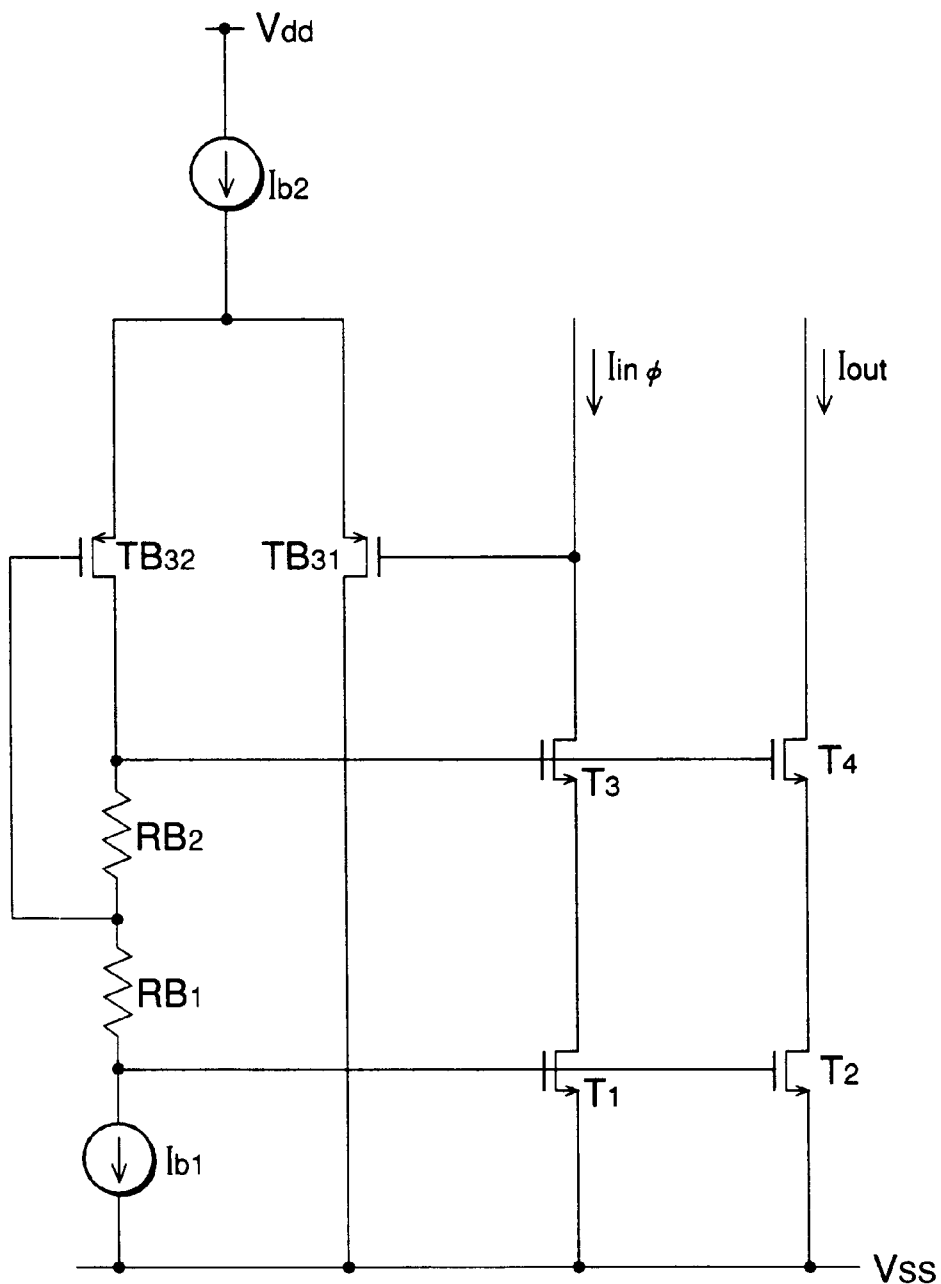
FIG. 71 is a block diagram illustrating an embodied circuit of FIG. 70.
Figure 72:
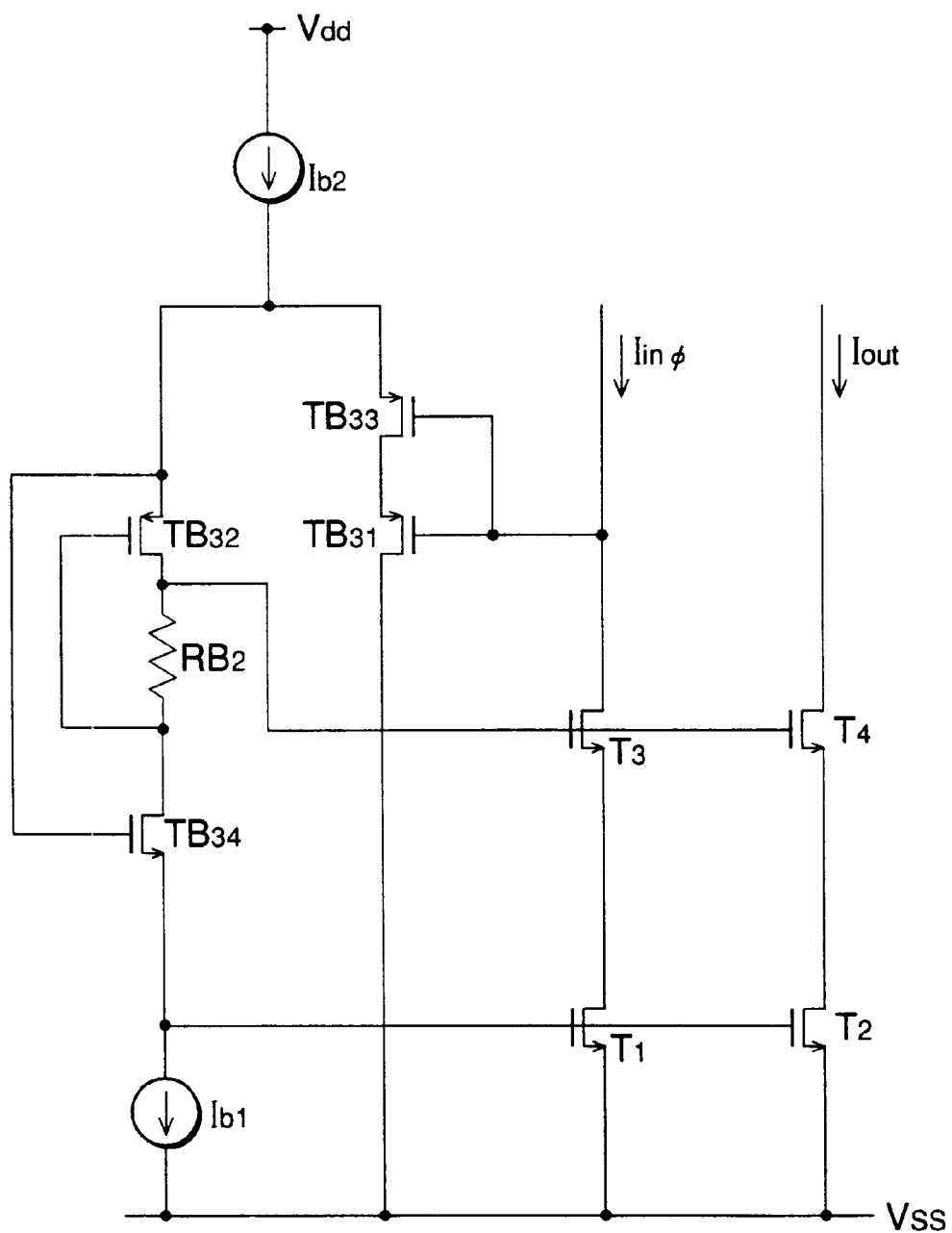
FIG. 72 is a block diagram illustrating a modification of FIG. 71.

In addition, as shown in FIG. 70, it is possible to realize the DC offset voltage Voffset of the buffer amplifier by inserting a second level-shift circuit 32 into a feedback line which forms a voltage follower. As shown in FIG. 71, this can be realized by inserting a resistor RB2 between the drain and gate of the transistor TB32 which forms the feedback line in FIG. 68. In FIG. 72, the resistor RB1 of FIG. 71 is realized by a transistor TB34, and a transistor TB33, the gate of which is connected to the gate of the transistor TB31 as a common gate, is connected to the source of the transistor TB31 in series, so that it is possible to apply a greater offset to the differential amplifier circuit.

Figure 73:
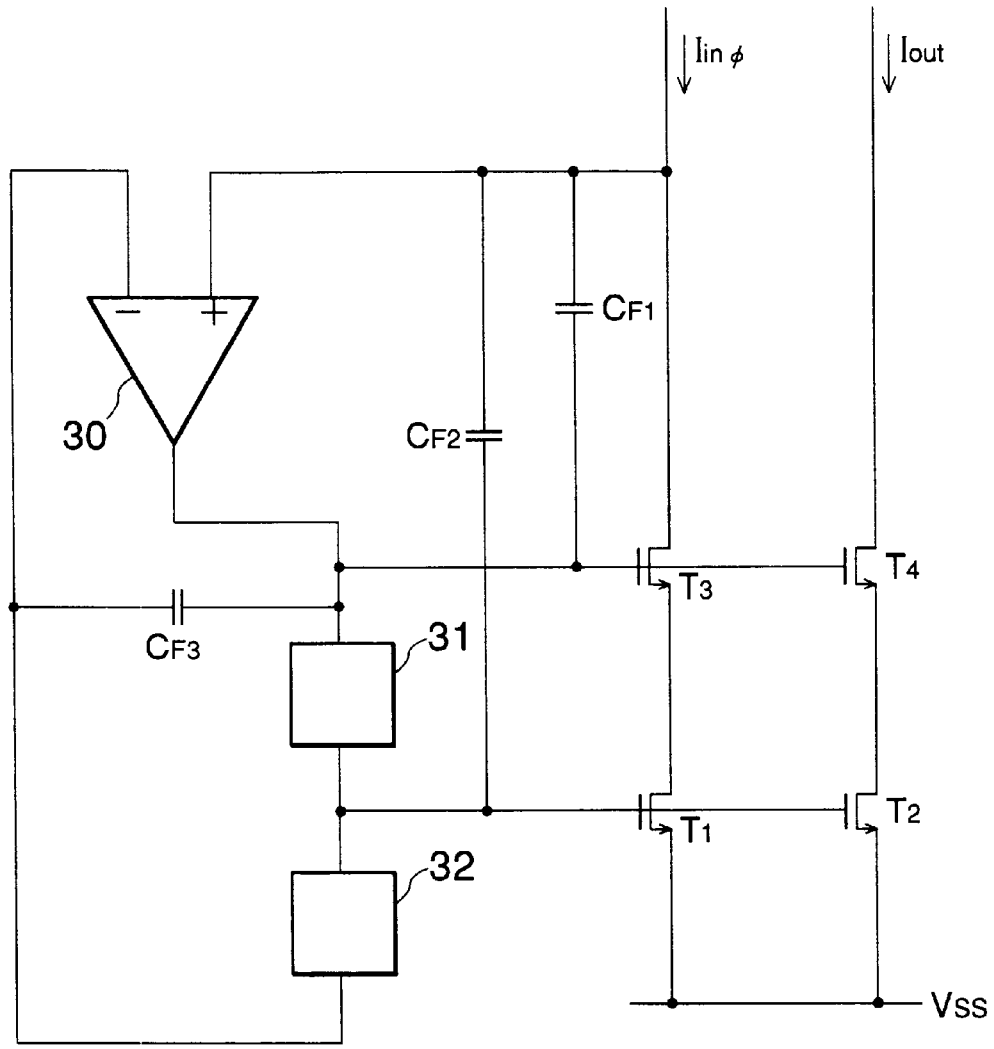
FIG. 73 is a block diagram illustrating an embodiment wherein the output of a level-shift circuit is further level-shifted by another level-shift circuit.
Figure 74:
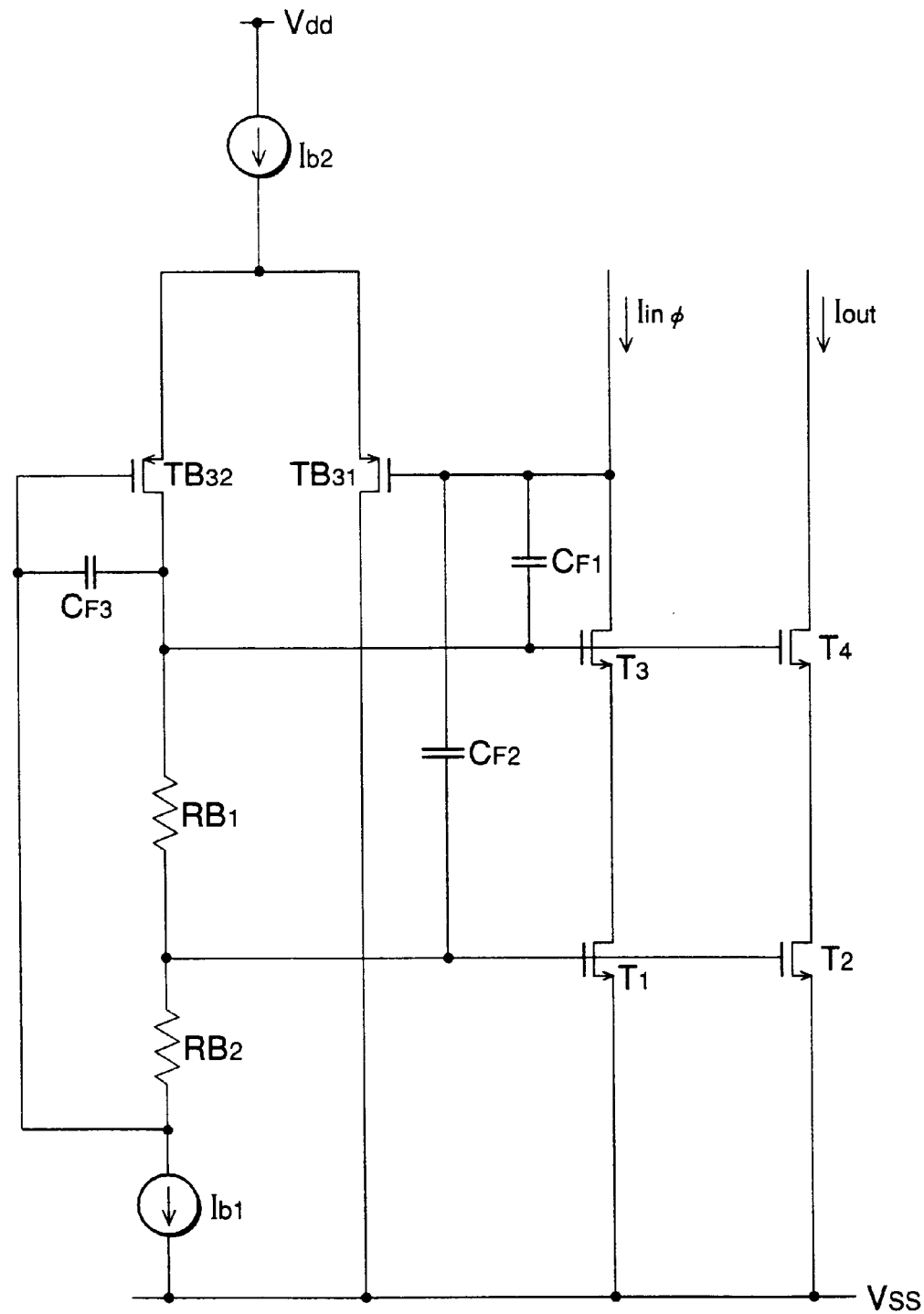
FIG. 74 is a block diagram illustrating an embodied circuit of FIG. 74.

In addition, as shown in FIG. 73, the output of the level-shift circuit 31 is further level-shifted by a level-shift circuit 32 to be returned as a feedback by the negative input of a differential amplifier circuit 30, so that it is possible to ensure a lower input voltage of the current mirror than the gate voltage of the transistor T1 by a level-shifted voltage of the level-shift circuit 32. This can be realized by inserting resistors RB1 and RB2 between the drain and gate of the transistor TB32 as shown in FIG. 74. In addition, as shown in FIGS. 73 and 74, capacitors CF1, CF2 and CF3 are provided, so that it is possible to improve the deterioration of the frequency characteristic due to the differential amplifier circuit 30 and the resistors RB31 and RB32.

Figure 75:
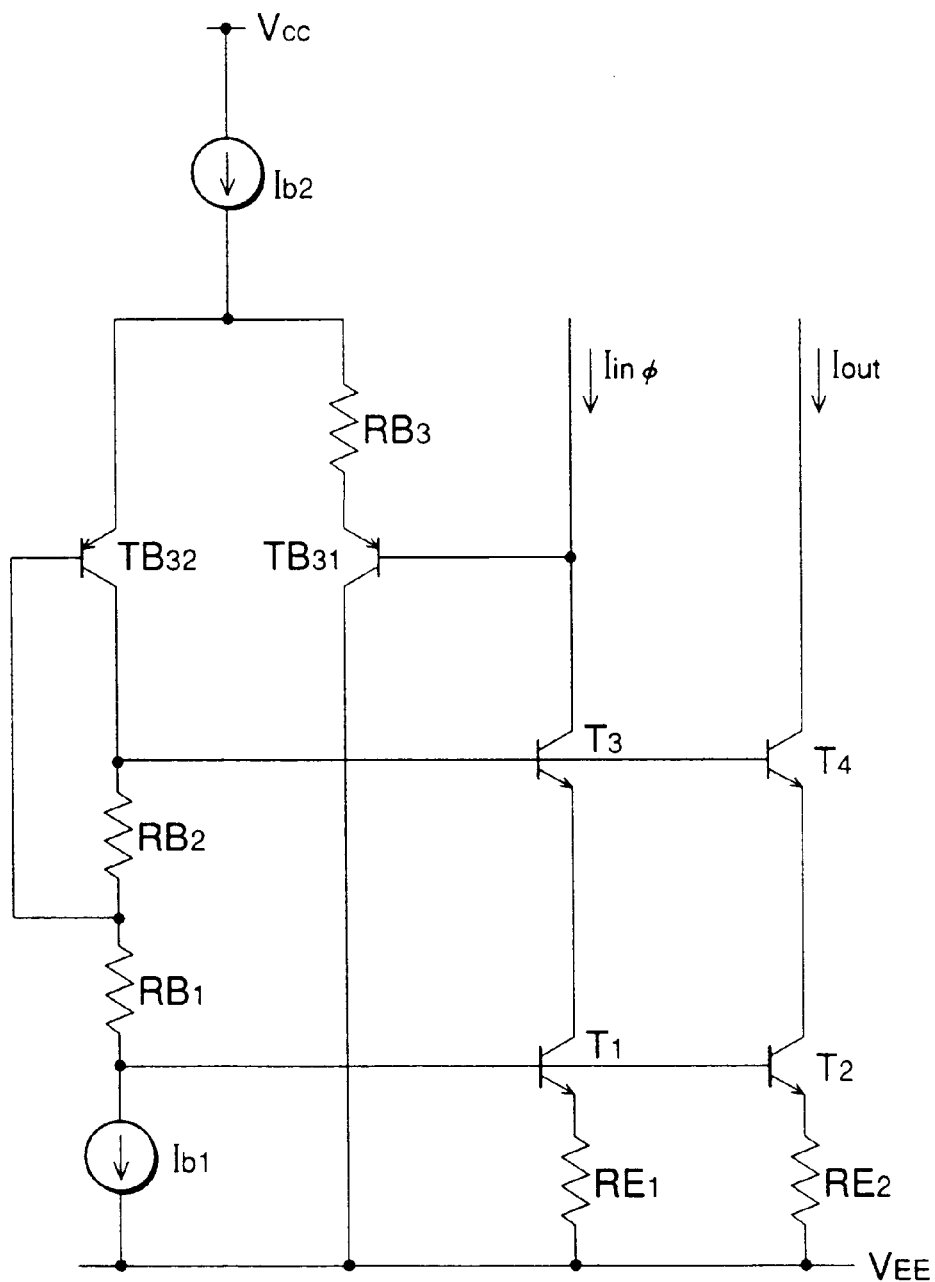
FIG. 75 is a block diagram illustrating an embodied circuit of FIG. 69, which uses a bipolar transistor.

While the preferred embodiments of the present invention have been described above using field-effect transistors, the said advantageous effects can be obtained if a current mirror circuit is formed using bipolar transistors as shown in FIG. 75.

Figure 76:
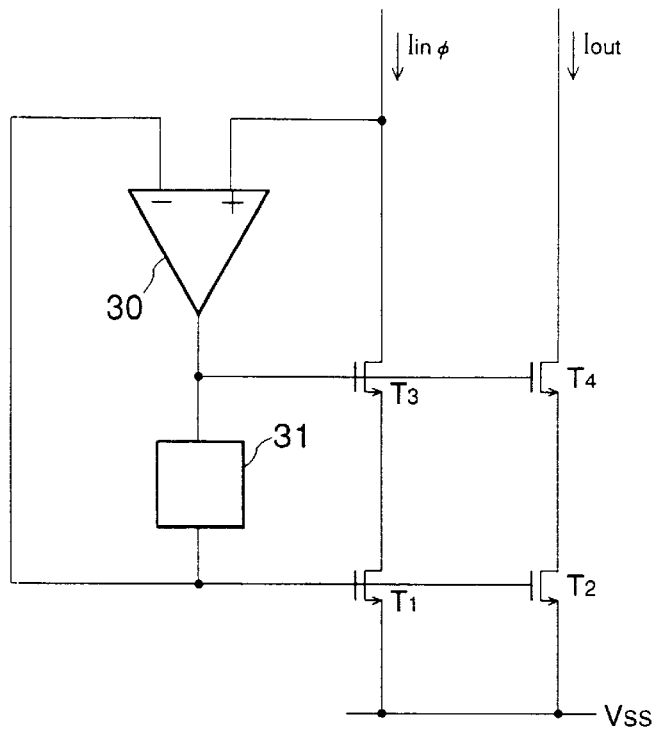
FIG. 76 is a block diagram illustrating a modification of FIG. 70.
Figure 77:
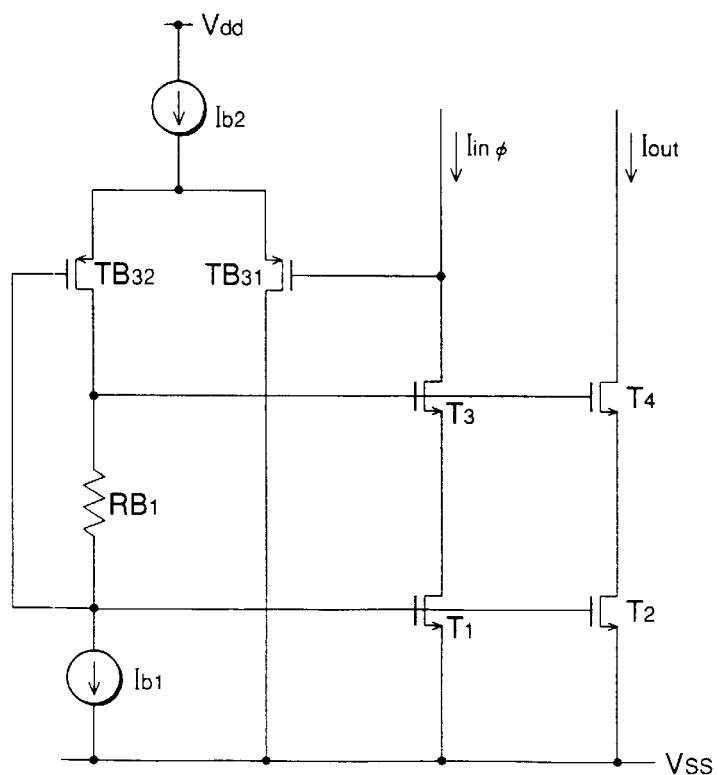
FIG. 77 is a block diagram illustrating an embodied circuit of FIG. 76.

The level-shift circuit 32 in FIG. 70 may be realized by using the level-shift circuit 31 serving both as the level-shift circuits 31 and 32 as shown in FIG. 76. FIG. 77 illustrates an embodiment of FIG. 76, wherein the level-shift circuit is realized by the resistor RB1.

Figure 78:
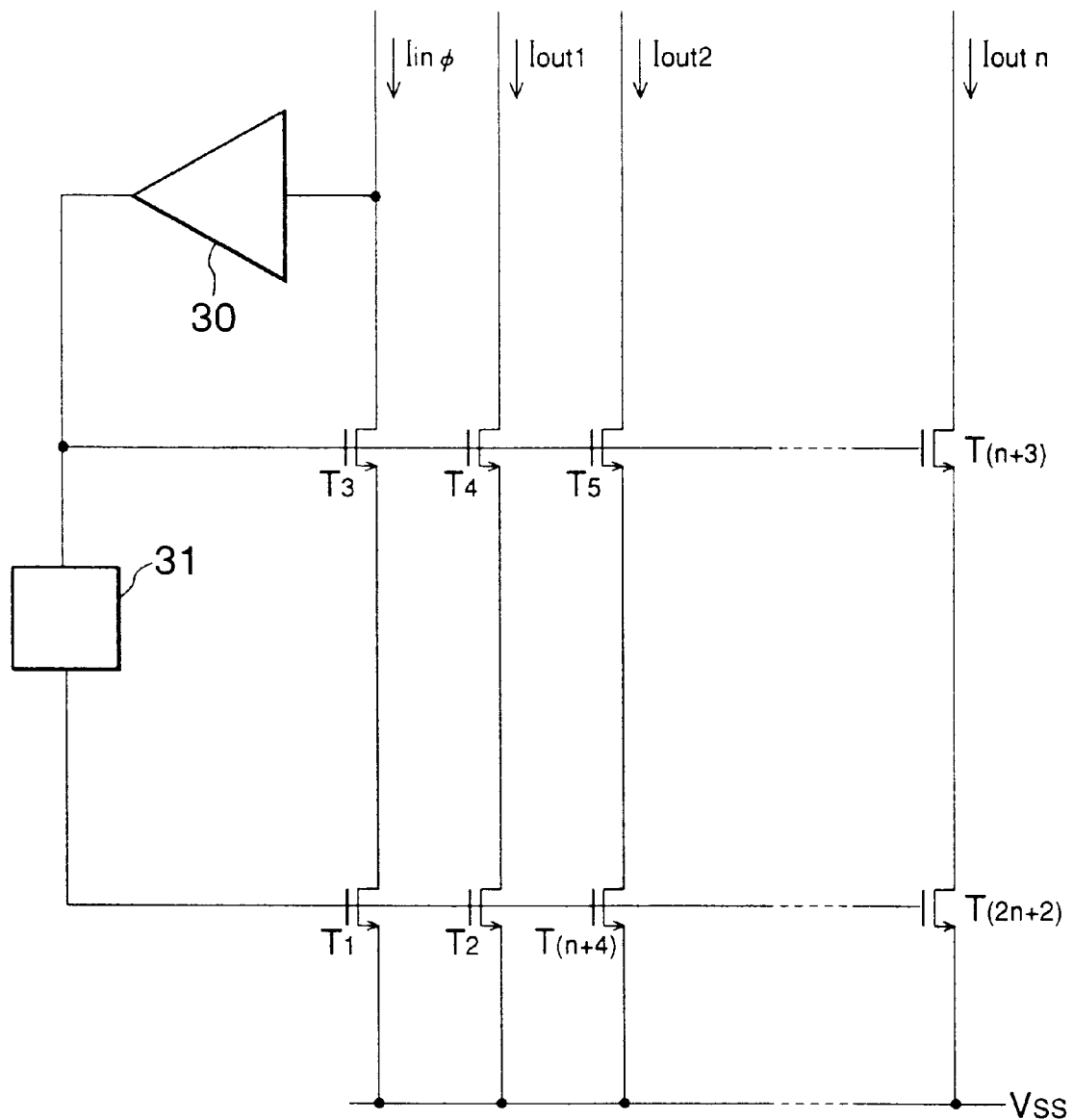
FIG. 78 is a block diagram illustrating a circuit having a plurality of outputs.
Figure 79:
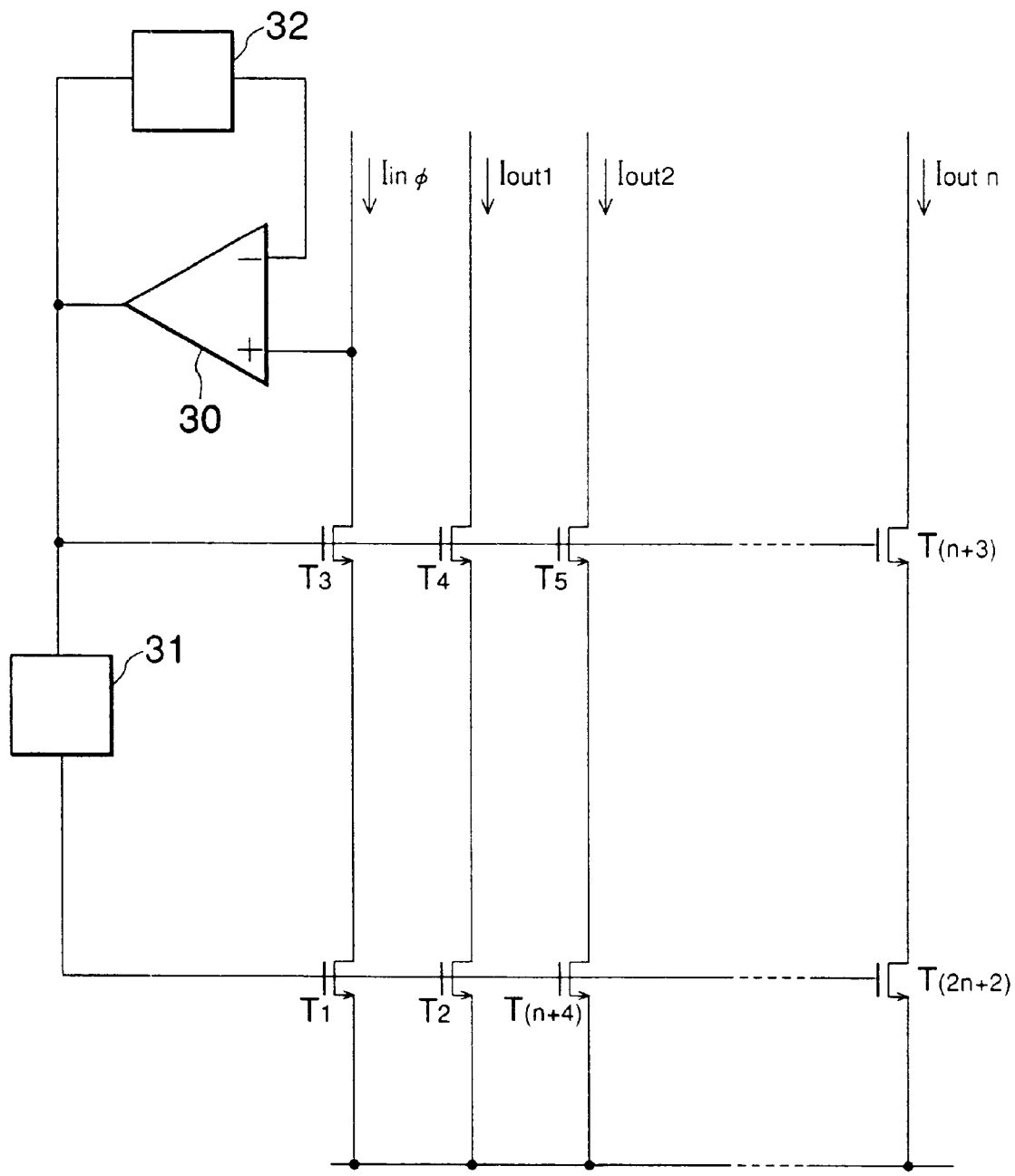
FIG. 79 is a block diagram illustrating an embodied circuit of FIG. 78, wherein the buffer amplifier comprises a differential amplifier circuit.
Figure 80:
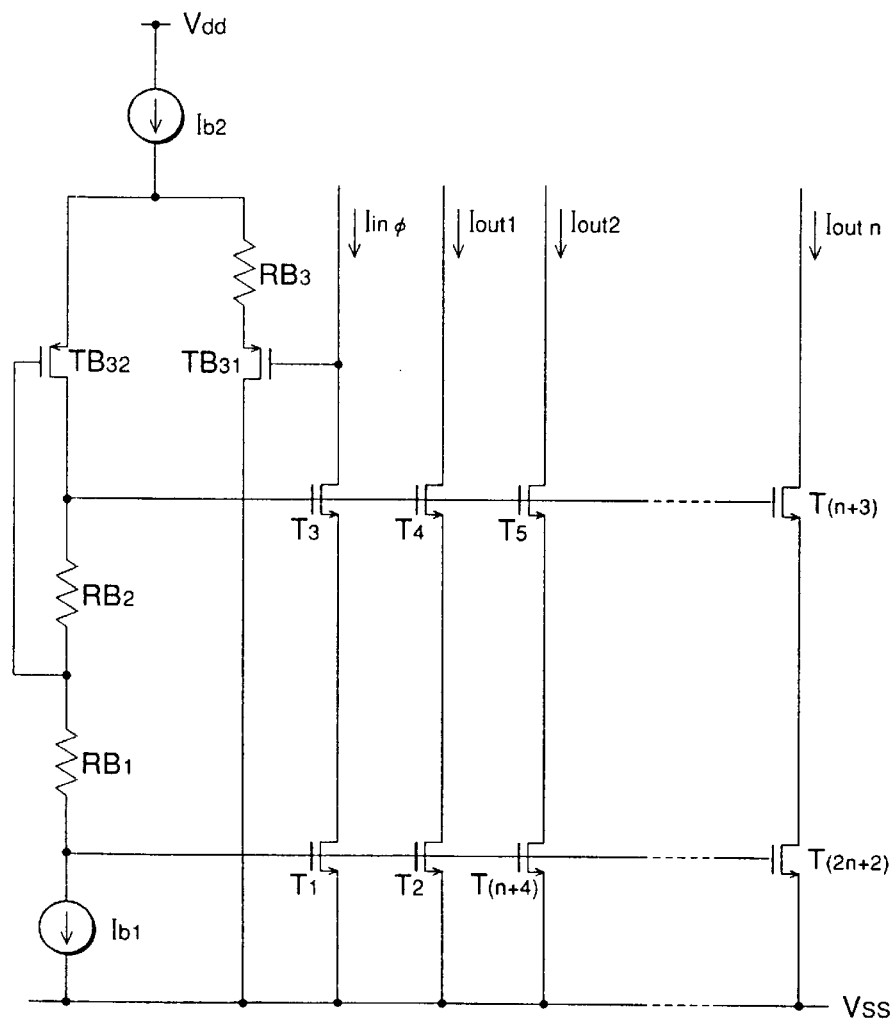
FIG. 80 is a block diagram illustrating an embodied circuit FIG. 79.
Figure 81:
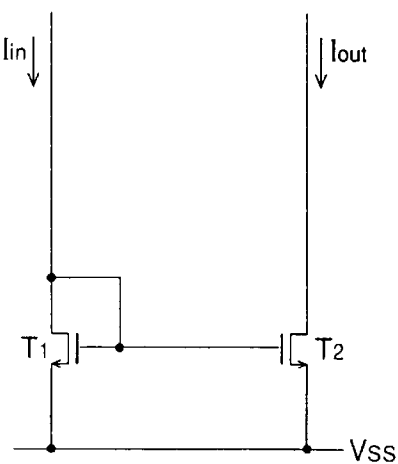
FIG. 81 is a block diagram illustrating a conventional basic current mirror circuit.
Figure 82:
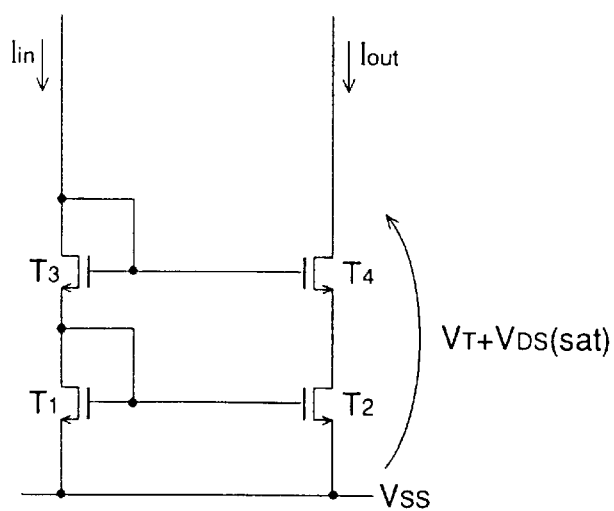
FIG. 82 is a block diagram illustrating a conventional current mirror circuit having an enhanced output impedance.
Figure 83:
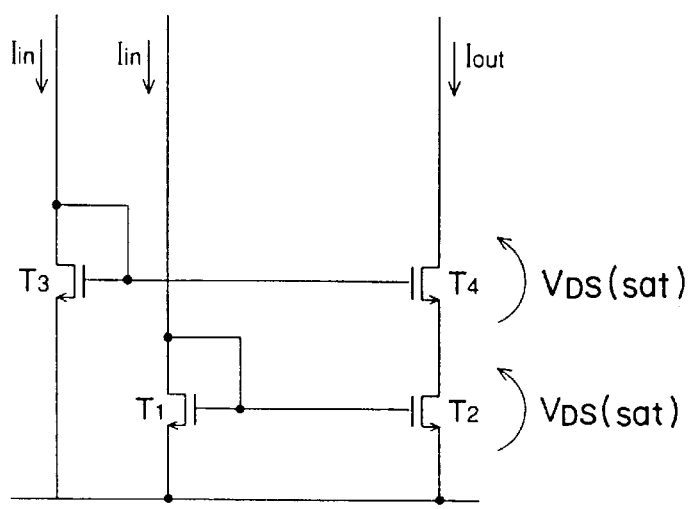
FIG. 83 is a block diagram illustrating a conventional current mirror circuit having an enhanced output impedance and a wide range of output voltage.
Figure 84:
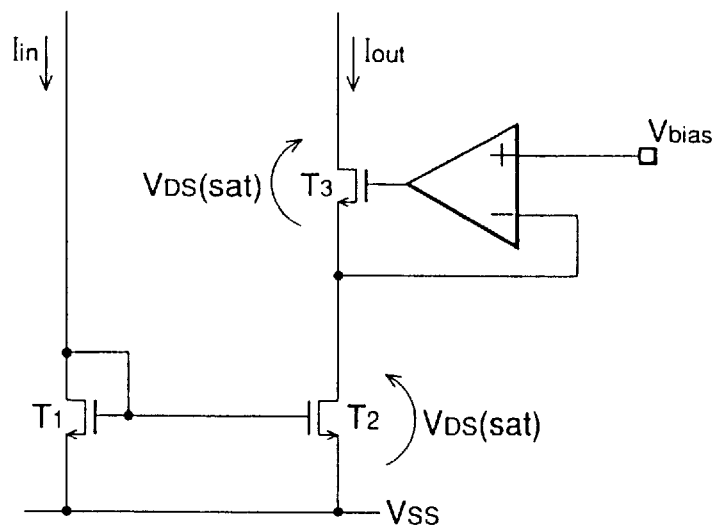
FIG. 84 is a block diagram illustrating a conventional current mirror circuit having an enhanced output impedance and a wide range of output voltage.
Figure 85:
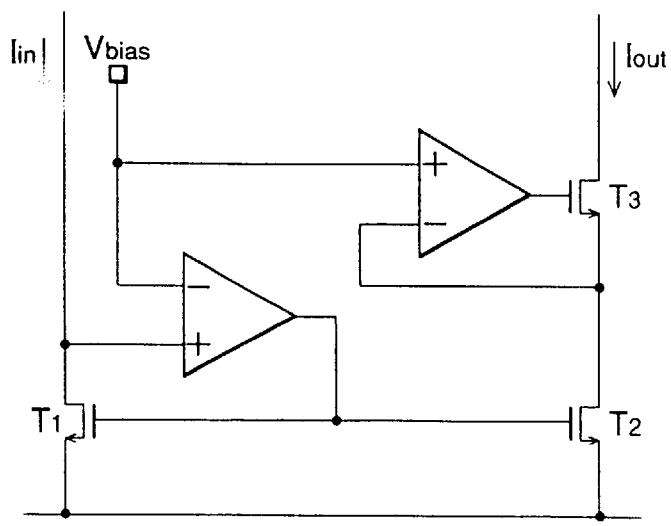
FIG. 85 is a block diagram illustrating a conventional high-precision current mirror circuit having an enhanced output impedance and a wide range of output voltage.

In addition, as shown in FIGS. 78 and 79, it is possible to provide a plurality of outputs by providing a plurality of transistors T2 and T4 which are connected to a cascode in the output section of the current mirror as shown in FIGS. 64 and 70. FIG. 80 illustrates an example wherein in FIG. 79, the differential amplifier circuit 30 and the level-shift circuits 31 and 32 are realized by the transistors TB31 and TB32 and the resistors RB1 and RB2, and the resistor RB3 is connected to the source of the transistor TB31 in series in order to increase the offset in the differential amplifier circuit 30. In this example, it is possible to decrease the drain voltage of the transistor T3, which is the input voltage of the current mirror circuit, so as to be less than the gate voltage of the transistor T3.

What is claimed is:

1. A current mirror circuit comprising:
   a first current-to-voltage converter for inputting an input current to output a first output voltage by current-to-voltage conversion;
   a second current-to-voltage converter for outputting a second output voltage by current-to-voltage conversion, said second current-to-voltage converter being matched with respect to said first current-to-voltage converter;
   a first transistor, a collector or drain of which outputs an output current, and an emitter or source of which is connected to said second current-to-voltage converter; and
   a control unit, connected to said first transistor, said first current-to-voltage converter, and said second current-to-voltage converter, said control unit configured to control said first transistor so that currents flow through said first and second current-to-voltage converters at a predetermined ratio.

2. A current mirror circuit as set forth in claim 1, wherein said second current-to-voltage converter inputs a second input current.

3. A current mirror circuit as set forth in claim 1, wherein said first and second current-to-voltage converter comprise first and second resistors, respectively.

4. A current mirror circuit comprising:
   a first current-to-voltage converter for inputting an input current to output a first output voltage by current-to-voltage conversion;
   a second current-to-voltage converter for outputting a second output voltage by current-to-voltage conversion;
   a first transistor, a collector or a drain of which outputs an output current, and an emitter or source of which is connected to said second current-to-voltage converter; and
   a control unit, connected to said first transistor, said first current-to-voltage converter, and said second current-to-voltage converter, said control unit configured to refer to said first and second output voltages to control said first transistor so that currents flow through said first and second current-to-voltage converters at a pre-determined ratio;

wherein said first and second current-to-voltage converters comprise at least second and third transistors, respectively, and a first bias circuit for commonly applying a bias voltage to control electrodes of said second and third transistors.

5. A current mirror circuit as set forth in claim 4, wherein said first bias circuit produces said bias voltage using, as a reference, a voltage which is current-to-voltage converted by said first current-to-voltage converter.

6. A current mirror circuit as set forth in claim 5, wherein a capacitor is connected to said first bias circuit in parallel.

7. A current mirror circuit as set forth in claim 5, wherein said first bias circuit comprises a level-shift unit.

8. A current mirror circuit as set forth in claim 7, wherein said level-shift unit comprises a source follower or emitter follower which is formed by a fourth transistor having a different conductivity type from those of said second and third transistors.

9. A current mirror circuit as set forth in claim 8, wherein each of said second, third and fourth transistors comprises a field-effect transistor, and the absolute value of a threshold value of said fourth transistor is smaller than those of said second and third transistors.

10. A current mirror circuit as set forth in claim 5 wherein said first bias circuit comprises a fourth diode-connected transistor.

11. A current mirror circuit as set forth in claim 10, wherein each of said second, third and fourth transistors comprises a field-effect transistor, and the absolute value of a threshold value of said fourth transistor is smaller than those of said second and third transistors.

12. A current mirror circuit as set forth in claim 10, wherein a ratio of a channel width to a channel length of said fourth transistor is four times or more as large as that of said second transistor.

13. A current mirror circuit as set forth in claim 5, wherein said first bias circuit comprises a transistor wherein a level-shift unit is connected between the collector and the base or between the drain and the gate.

14. A current mirror circuit as set forth in claim 5, wherein said first bias circuit comprises a level-shift unit and a fourth current source.

15. A current mirror circuit as set forth in claim 5, wherein said first bias circuit comprises a fourth diode-connected transistor and a fourth current source.

16. A current mirror circuit as set forth in claim 5, wherein said first bias circuit comprises a transistor wherein a level-shift unit is connected between the collector and the base or between the drain and the gate, and a fourth current source.

17. A current mirror circuit comprising:
  a first current-to-voltage converter for inputting an input current to output a first output voltage by current-to-voltage conversion;
  a second current-to-voltage converter for outputting a second output voltage by current-to-voltage conversion;
  a first transistor, a collector or a drain of which outputs an output current, and an emitter or source of which is connected to said second current-to-voltage converter; and
  a control unit, connected to said first transistor, said first current-to-voltage converter, and said second current-to-voltage converter, said control unit configured to refer to said first and second output voltages to control said first transistor so that currents flow through said first and second current-to-voltage converters at a predetermined ratio;

wherein said first and second current-to-voltage converters comprise at least second and third transistors, respectively, and control electrodes of said second and third transistors are controlled by the output of said control unit.

18. A current mirror circuit comprising:
  a first current-to-voltage converter for inputting an input current to output a first output voltage by current-to-voltage conversion;
  a second current-to-voltage converter for outputting a second output voltage by current-to-voltage conversion;
  a first transistor, a collector or a drain of which outputs an output current, and an emitter or source of which is connected to said second current-to-voltage converter; and
  a control unit, connected to said first transistor, said first current-to-voltage converter, and said second current-to-voltage converter, said control unit configured to refer to said first and second output voltages to control said first transistor so that currents flow through said first and second current-to-voltage converters at a predetermined ratio;

wherein said first and second current-to-voltage converters comprise at least second and third transistors, respectively, and control electrodes of said second and third transistors are controlled by an output of said control unit that has been level-shifted by a level-shift unit.

19. A current mirror circuit as set forth in claim 18, wherein a capacitor is connected to said level-shift unit in parallel.

20. A current mirror circuit comprising:
  a first current-to-voltage converter for inputting an input current to output a first output voltage by current-to-voltage conversion;
  a second current-to-voltage converter for outputting a second output voltage by current-to-voltage conversion;
  a first transistor, a collector or a drain of which outputs an output current, and an emitter or source of which is connected to said second current-to-voltage converter; and
  a control unit, connected to said first transistor, said first current-to-voltage converter, and said second current-to-voltage converter, said control unit configured to refer to said first and second output voltages to control said first transistor so that currents flow through said first and second current-to-voltage converters at a predetermined ratio;

wherein said control means comprises:
  first and second current sources;
  a third current-to-voltage converter for converting an output current of said first current source into a voltage on the basis of said second output voltage of said second current-to-voltage converter; and
  a first voltage-to-current converter for converting into a current, a difference between said first output voltage of said first current-to-voltage converter and a voltage converted by said third current-to-voltage converter.

21. A current mirror circuit as set forth in claim 20, wherein said first and second current sources comprise a third current source, and a current splitter for splitting an output current of said third current source.

22. A current mirror circuit as set forth in claim 20, wherein said first and second current-to-voltage converters comprise at least second and third transistors, respectively, and both of control electrodes of said second and third transistors are controlled by an output of said third current-to-voltage converter.

23. A current mirror circuit as set forth in claim 22, wherein said third current-to-voltage converting means comprises a fourth diode-connected transistor.

24. A current mirror circuit as set forth in claim 23, wherein each of said second, third and fourth transistors comprises a field-effect transistor, and the absolute value of a threshold value of said fourth transistor is smaller than those of said second and third transistors.

25. A current mirror circuit as set forth in claim 23, wherein a ratio of a channel width to a channel length of said fourth transistor is four times or more as large as that of said second transistor.

26. A current mirror circuit as set forth in claim 20, wherein said first and second current-to-voltage converters comprise at least second and third transistors, respectively, and both of control electrodes of said second and third transistors are controlled by an output of said third current-to-voltage converter that has been level-shifted by a level-shift unit.

27. A current mirror circuit as set forth in claim 26, wherein a capacitor is connected to said level-shift unit in parallel.

28. A current mirror circuit comprising:
  a first current-to-voltage converter for inputting an input current to output a first output voltage by current-to-voltage conversion;
  a second current-to-voltage converter for outputting a second output voltage by current-to-voltage conversion;
  a first transistor, a collector or a drain of which outputs an output current, and an emitter or source of which is connected to said second current-to-voltage converter; and
  a control unit, connected to said first transistor, said first current-to-voltage converter, and said second current-to-voltage converter, said control unit configured to refer to said first and second output voltages to control said first transistor so that currents flow through said first and second current-to-voltage converters at a predetermined ratio;
  wherein said control means comprises:
    a second bias unit for producing a predetermined voltage on the basis of said first output voltage of said first current-to-voltage; and
    second and third voltage-to-current converters, connected to an output voltage of said second bias unit, for converting into a current said first and second output voltage of said first and second current-to-voltage converters.

29. A current mirror circuit as set forth in claim 28, wherein a capacitor is connected to said second bias unit in parallel.

30. A current mirror circuit as set forth in claim 28, wherein said first and second current-to-voltage converters comprise at least second and third transistors, respectively, and both of control electrodes of said second and third transistors are controlled by an output of said second bias unit.

31. A current mirror circuit as set forth in claim 30, wherein said bias unit comprises a source follower or emitter follower which is formed by a fourth transistor having a different conductivity type from those of said second and third transistors.

32. A current mirror circuit as set forth in claim 31, wherein each of said second, third and fourth transistors comprises a field-effect transistor, and the absolute value of a threshold value of said fourth transistor is smaller than those of said second and third transistors.

33. A current mirror circuit as set forth in claim 30, wherein said second bias unit comprise a fourth diode-connected transistor.

34. A current mirror circuit as set forth in claim 33, wherein each of said second, third and fourth transistors comprises a field-effect transistor, and the absolute value of a threshold value of said fourth transistor is smaller than those of said second and third transistors.

35. A current mirror circuit as set forth in claim 33, wherein a ratio of a channel width to a channel length of said fourth transistor is four times or more as large as that of said second transistor.

36. A current mirror circuit as set forth in claim 28, wherein said first and second current-to-voltage converters comprise at least second and third transistors, respectively, and both of control electrodes of said second and third transistors are controlled by the level-shifted output of said second bias unit.

37. A current mirror circuit as set forth in claim 28, wherein said second bias unit comprises a third current-to-voltage converter, and said predetermined voltage produced by said second bias unit on the basis of the voltage current-to-voltage converted by said first current-to-voltage converter is determined by an output current of a fourth current source.

38. A current mirror circuit comprising:
  first through number (N+1) current-to-voltage converters, N being an integer greater than or equal to 1, said first through number (N+1) current-to-voltage converters being matched with respect to each other;
  first through number N transistors, emitters or sources of which are connected to said second through number (N+1) current-to-voltage converters, respectively; and
  first through number N control units for controlling control electrodes of said first through number N transistors;
  wherein at least said first current-to-voltage converter inputs an input current, and a number i [(i is an integer from 1 to N)] control unit receives output voltages of said first and number (i+1) current-to-voltage converters to control a number i transistor so that currents flow from said number i control unit to said first and number (i+1) current-to-voltage converters at a predetermined ratio, where i is an integer from 1 to N.

39. A current mirror as set forth in claim 1, wherein said first current-to-voltage converter comprises a second transistor for inputting the input current,
  wherein said second current-to-voltage converter comprises a third transistor, and
  wherein said control unit comprises a voltage comparator for comparing voltages converted by said first and second current-to-voltage converters, and both of control electrodes of second and third transistors are controlled by a voltage produced based on an output of said voltage comparator.

40. A current mirror circuit as set forth in claim 39, further comprising a level shifter,
  wherein said control electrodes of said second and third transistors forming said first and second current-tovoltage converters are controlled by a voltage derived by level-shifting said output of said voltage comparator by said level shifter.

41. A current mirror circuit as set forth in claim 40, further comprising a capacitor connected to said level shifter in parallel.

42. A current mirror circuit as set forth in claim 1, wherein said control unit comprises a voltage comparator for comparing voltages converted by said first and second current-to-voltage converters, wherein said first current-to-voltage converter comprises a second transistor for inputting the input current and said second current-to-voltage converter comprises a third transistor, and wherein a control electrode of said first transistor is controlled by an output of said voltage comparator, and an input section of said voltage comparator comprises a differential pair which comprises fourth and fifth transistors, each having a different conductivity type from that of said second transistor, and both of control electrodes of said second and third transistors forming said first and second current-to-voltage converters are controlled by a voltage produced on the basis of a voltage of a common emitter or source of said differential pair.

43. A current mirror circuit as set forth in claim 1, further comprising:

a bias circuit for producing a predetermined voltage on the basis of an output voltage of said first current-to-voltage converter, wherein said first current-to-voltage converter comprises a second transistor for inputting the input current, wherein said second current-to-voltage converter comprises a third transistor, wherein said control unit comprises a voltage comparator for comparing voltages converted by said first and second current-to-voltage converters, wherein a control electrode of said first transistor is controlled by an output of said voltage comparator, wherein both of control electrodes of said second and third transistors forming said first and second current-to-voltage converters are biased by said bias circuit.

44. A current mirror circuit as set forth in claim 43, further comprising a capacitor connected to said bias circuit in parallel.

45. A current mirror circuit as set forth in claim 43, wherein said bias circuit comprises a level-shifter.

46. A current mirror circuit as set forth in claim 45, wherein said level-shifter comprises a source follower or emitter follower which is formed by a fourth transistor having a different conductivity from those of said second and third transistors.

47. A current mirror circuit as set forth in claim 46, wherein each of said second, third and fourth transistors comprises a field-effect transistor, and an absolute value of a threshold value of said fourth transistor is smaller than those of said second and third transistors.

48. A current mirror circuit as set forth in claim 43, wherein said bias circuit comprises a fourth diode-connected transistor.

49. A current mirror circuit as set forth in claim 48, wherein each of said second, third and fourth transistors comprises a field-effect transistor, and the absolute value of a threshold value of said fourth transistor is smaller than those of said second and third transistors.

50. A current mirror circuit as set forth in claim 48, wherein a ratio of a channel width to a channel length of said fourth transistor is at least four times as large as that of said second transistor.

51. A current mirror circuit as set forth in claim 43, wherein said bias circuit comprises a fourth transistor in which a level-shifter is connected between the collector and the base or between the drain and the gate of said fourth transistor.

52. A current mirror circuit as set forth in claim 43, wherein said bias circuit comprises a third current-to-voltage converter and a first current source, wherein said predetermined voltage produced by said bias circuit on the basis of the voltage current-to-voltage converted by said first current-to-voltage converter is determined by an output current of said first current source.

53. A current mirror circuit as set forth in claim 1, further comprising:

third through (N+1) current-to-voltage converters, wherein said first through (N+1) current-to-voltage converter comprises (N+1) through (2N+1) transistors, respectively;

a bias circuit for producing a predetermined voltage on the basis of a voltage that has been current-to-voltage converted by said first current-to-voltage converter;

second through N transistors, each of collectors of which outputs an output current, and emitters or sources of which are connected to said third through (N+1) current-to-voltage converters, respectively; and first through N voltage comparators for comparing voltages that have been current-to-voltage converted by said ith current-to-voltage converter, wherein i is an integer between 1 and N, wherein control electrodes of said first through Nth transistors are controlled by outputs of said first through Nth voltage comparators, and control electrodes of said (N+1)th through (2N+1)th transistors forming said first through (N+1)th current-to-voltage converters are biased by said bias circuit.

* * * * *